United States Patent
Endou et al.

(10) Patent No.: US 7,578,058 B2
(45) Date of Patent: Aug. 25, 2009

(54) PRODUCTION METHOD OF A MULTILAYER CERAMIC SUBSTRATE

(75) Inventors: Kenji Endou, Tokyo (JP); Kiyoshi Hatanaka, Tokyo (JP); Masaharu Hirakawa, Tokyo (JP); Haruo Nishino, Tokyo (JP); Hideaki Fujioka, Tokyo (JP)

(73) Assignee: TDK Corporation, Tokyo (JP)

( * ) Notice: Subject to any disclaimer, the term of this patent is extended or adjusted under 35 U.S.C. 154(b) by 204 days.

(21) Appl. No.: 11/405,462

(22) Filed: Apr. 18, 2006

(65) Prior Publication Data

US 2006/0234023 A1    Oct. 19, 2006

(30) Foreign Application Priority Data

| Apr. 19, 2005 | (JP) | 2005-121666 |
| Jun. 30, 2005 | (JP) | 2005-192496 |
| Jul. 26, 2005 | (JP) | 2005-216570 |
| Jul. 26, 2005 | (JP) | 2005-216572 |
| Dec. 13, 2005 | (JP) | 2005-359591 |
| Dec. 15, 2005 | (JP) | 2005-362116 |
| Dec. 22, 2005 | (JP) | 2005-369472 |

(51) Int. Cl.
*H01K 3/22* (2006.01)

(52) U.S. Cl. .............. 29/851; 29/830; 29/846; 257/703; 156/252

(58) Field of Classification Search ........... 29/25.41, 29/830, 831, 846, 851; 156/89.11, 89.16, 156/248, 252; 428/210; 257/684, 703
See application file for complete search history.

(56) References Cited

U.S. PATENT DOCUMENTS

| 5,645,673 A * | 7/1997 | Fasano et al. ............ 156/252 |
| 6,177,184 B1 | 1/2001 | Casey et al. |
| 6,350,334 B1 | 2/2002 | Shigemi et al. |
| 7,155,816 B2 * | 1/2007 | Ninomiya et al. ............ 29/830 |
| 2001/0054481 A1 | 12/2001 | Harada et al. |
| 2002/0063322 A1 | 5/2002 | Robbins et al. |
| 2004/0099364 A1 | 5/2004 | Suzuki et al. |

FOREIGN PATENT DOCUMENTS

| EP | 1 024 529 A2 | 8/2000 |
| EP | 1 209 734 A2 | 5/2002 |
| JP | S62-260777 | 11/1987 |
| JP | 06-144937 | 5/1994 |

(Continued)

*Primary Examiner*—Donghai D. Nguyen
(74) *Attorney, Agent, or Firm*—Manabu Kanesaka

(57) ABSTRACT

A multilayer ceramic substrate having a cavity is formed by the steps of laminating a plurality of ceramic green sheets including ceramic green sheets having through holes corresponding to the cavity to form a multilayer body, pressing the multilayer body and firing the pressed body. At this time, a shrinkage suppression green sheet is laminated on the surface of the a ceramic green sheet constituting the outermost layer of the multilayer body, and a shrinkage suppression green sheet piece is disposed on the ceramic green sheet exposed to the bottom of the cavity in accordance with the shape of the cavity. A burnable sheet is further disposed on the shrinkage suppression green sheet piece. Before the pressing step, an embedded green sheet separate from the ceramic green sheets (portion separated by inserting a cut) is disposed on the shrinkage suppression green sheet piece or the burnable sheet so that it is filled in the cavity. After the firing step, the embedded green sheet fired is removed.

48 Claims, 35 Drawing Sheets

FOREIGN PATENT DOCUMENTS

| | | |
|---|---|---|
| JP | H06-144937 | 5/1994 |
| JP | 08-245268 | 9/1996 |
| JP | H08-245268 | 9/1996 |
| JP | 10-075060 | 3/1998 |
| JP | H10-075060 | 3/1998 |
| JP | 2001-144437 | 5/2001 |
| JP | 2002-289747 | 10/2002 |
| JP | 2002-290042 | 10/2002 |
| JP | 2003-273513 | 9/2003 |
| JP | 2003-318309 | 11/2003 |
| JP | 2004-165247 | 6/2004 |
| JP | 2005-116938 | 4/2005 |

* cited by examiner

[Fig1]
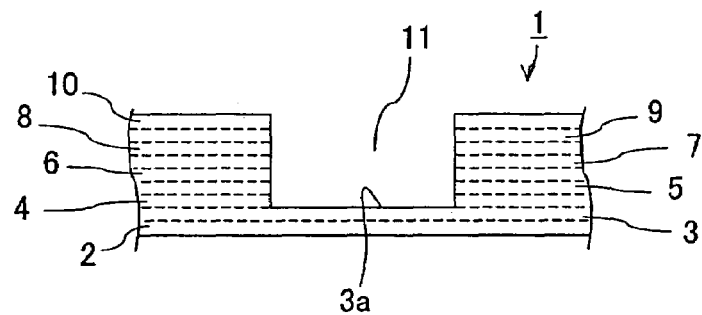
[Fig2]
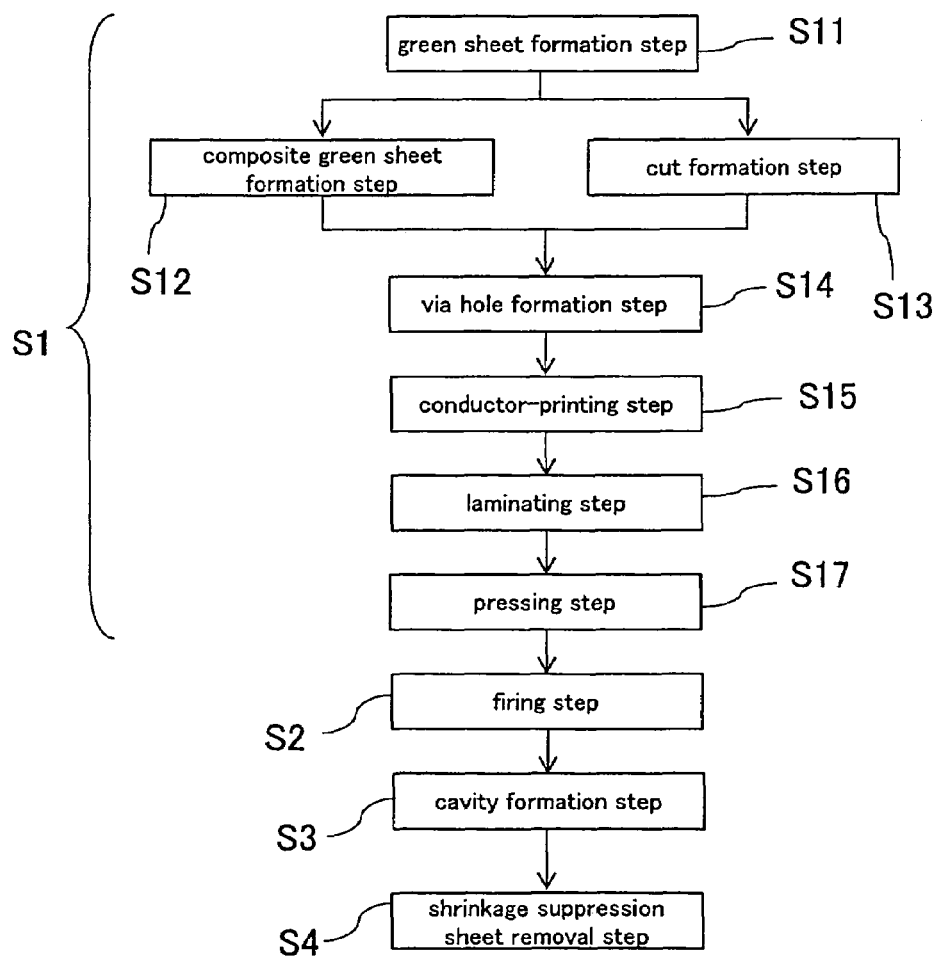

[Fig3]
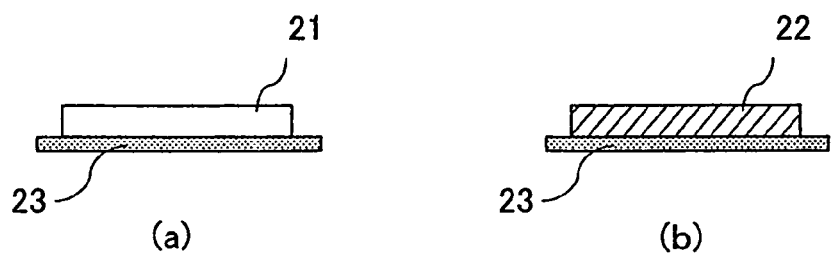
(a)    (b)
[Fig4]
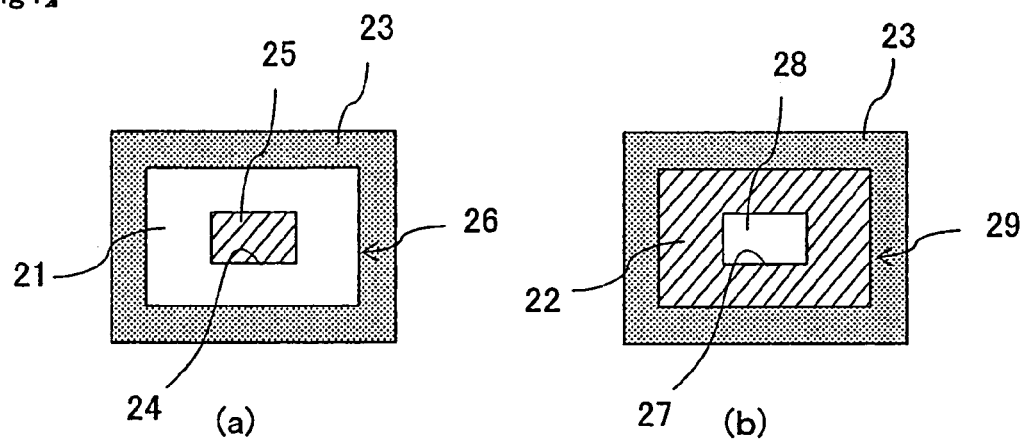
(a)    (b)
[Fig5]
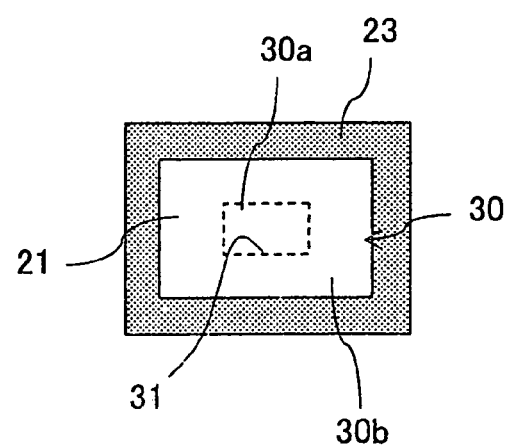

[Fig6]
(a) 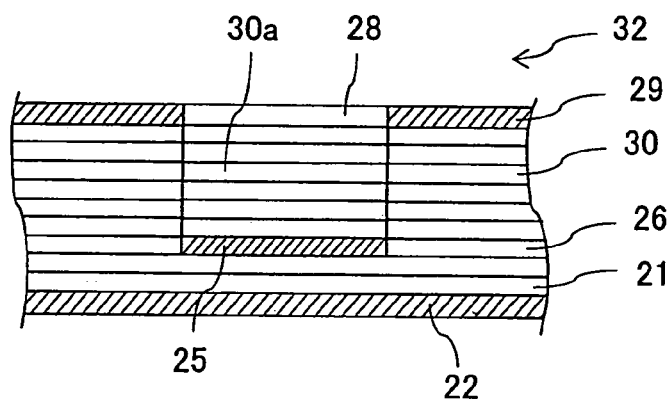
(b) 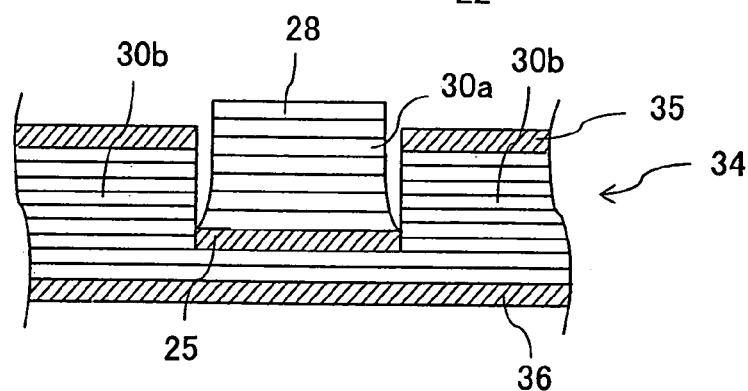
(c) 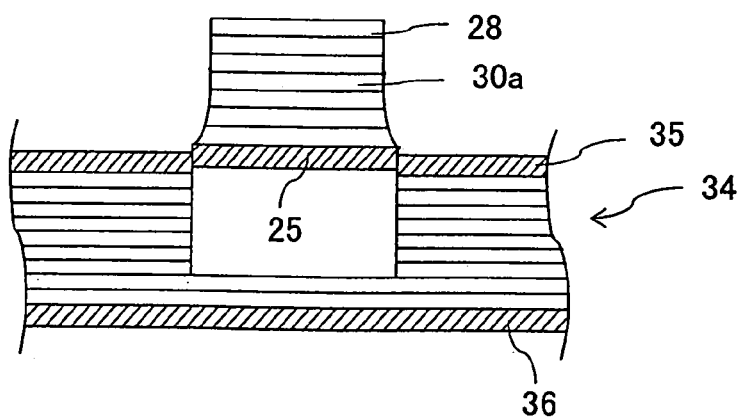
(d) 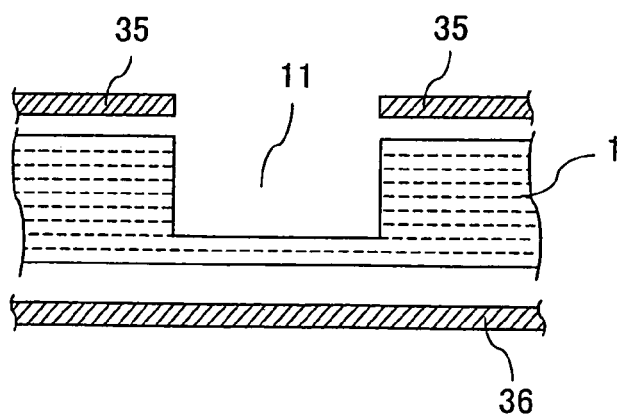

[Fig7]
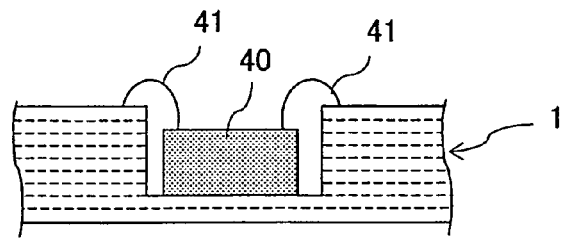
[Fig8]
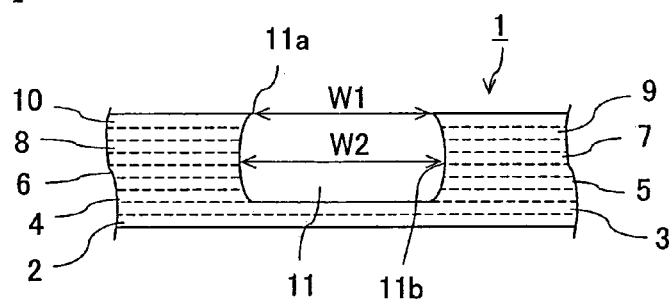
[Fig9]
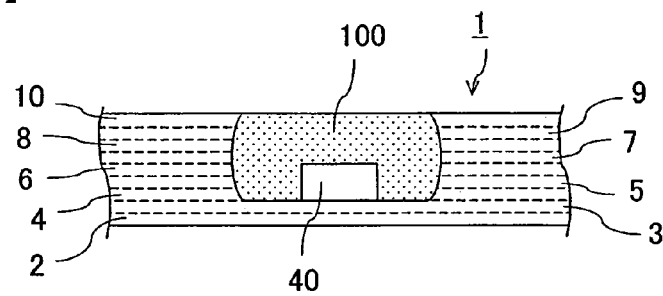
[Fig10]
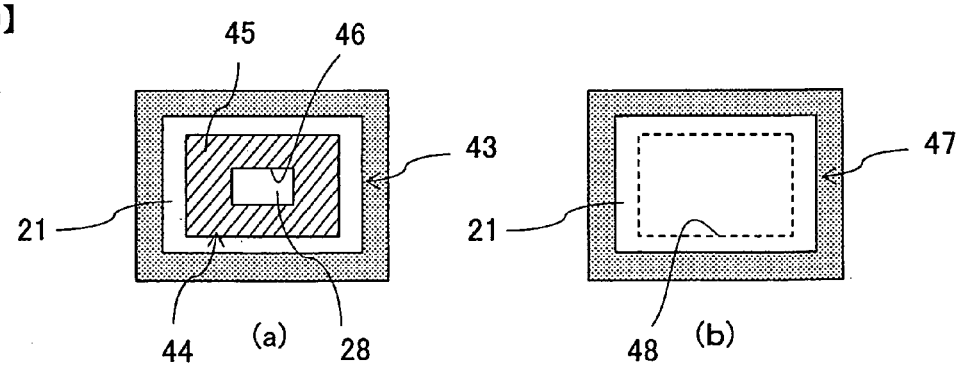

[Fig11]
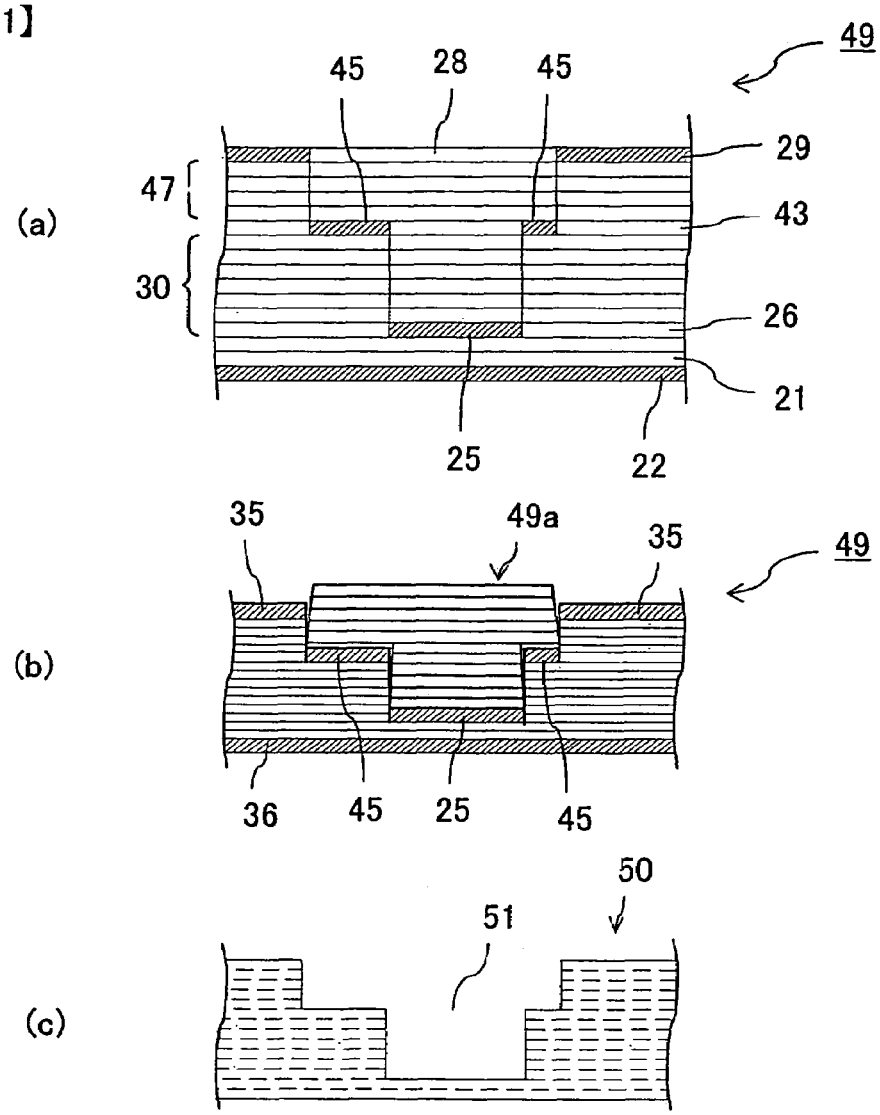
[Fig12]
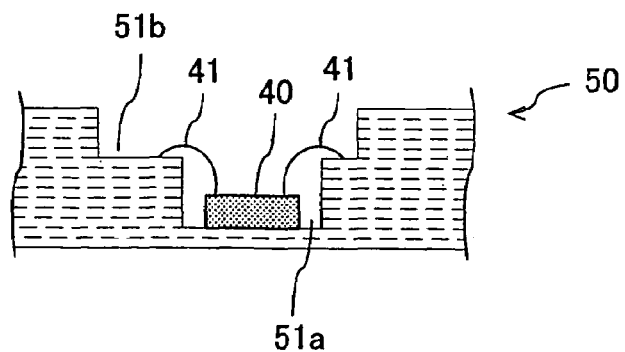

[Fig13]
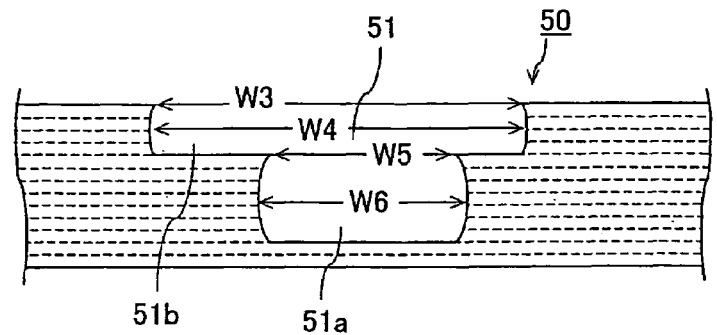
[Fig14]
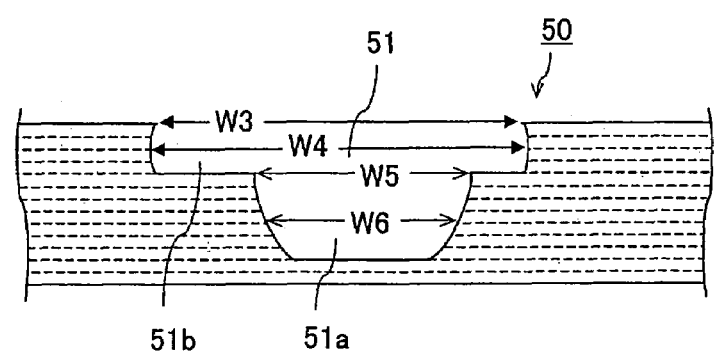
[Fig15]
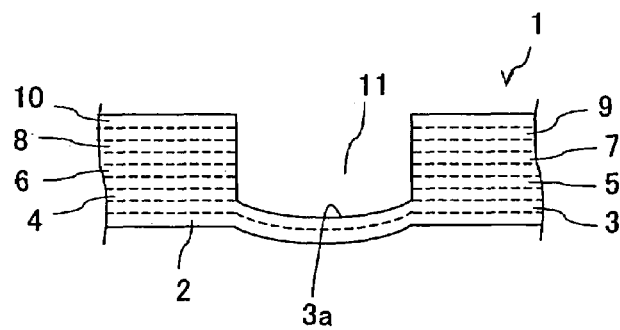
[Fig16]
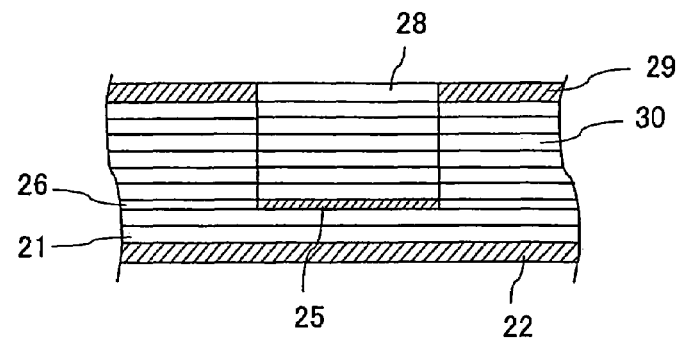

[Fig17]
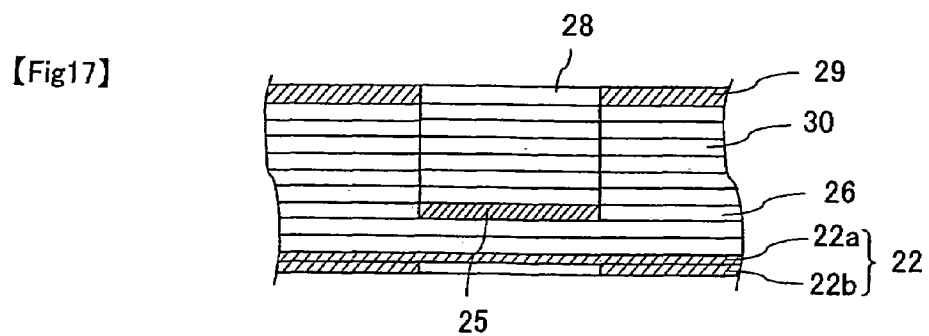
[Fig18]
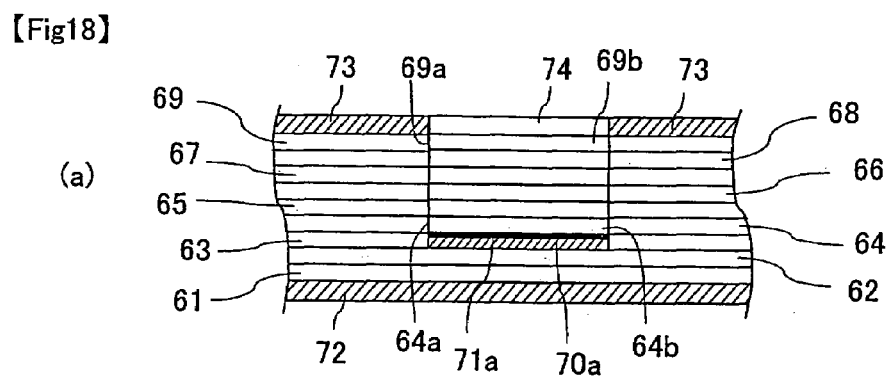
(a)
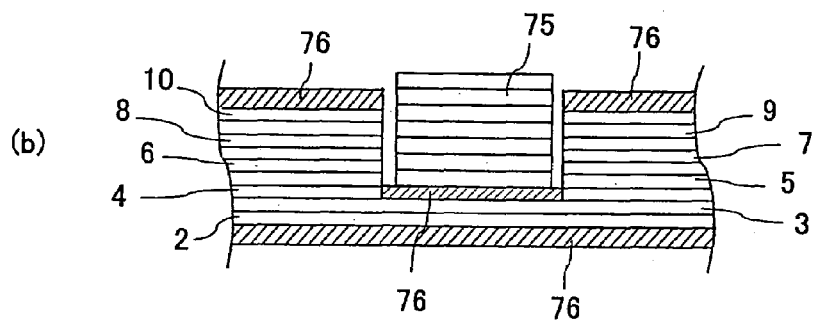
(b)
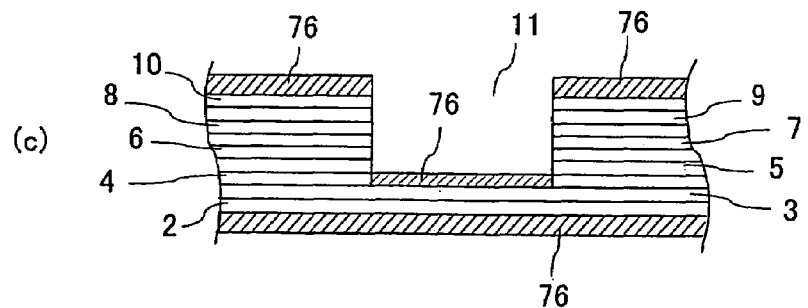
(c)
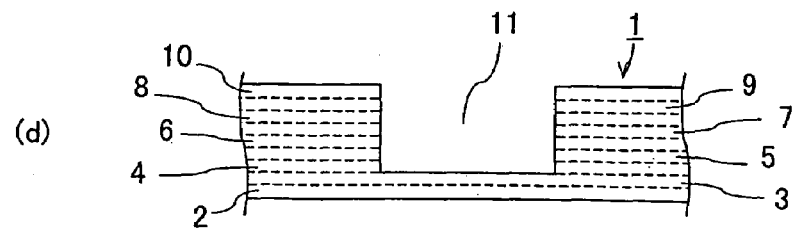
(d)

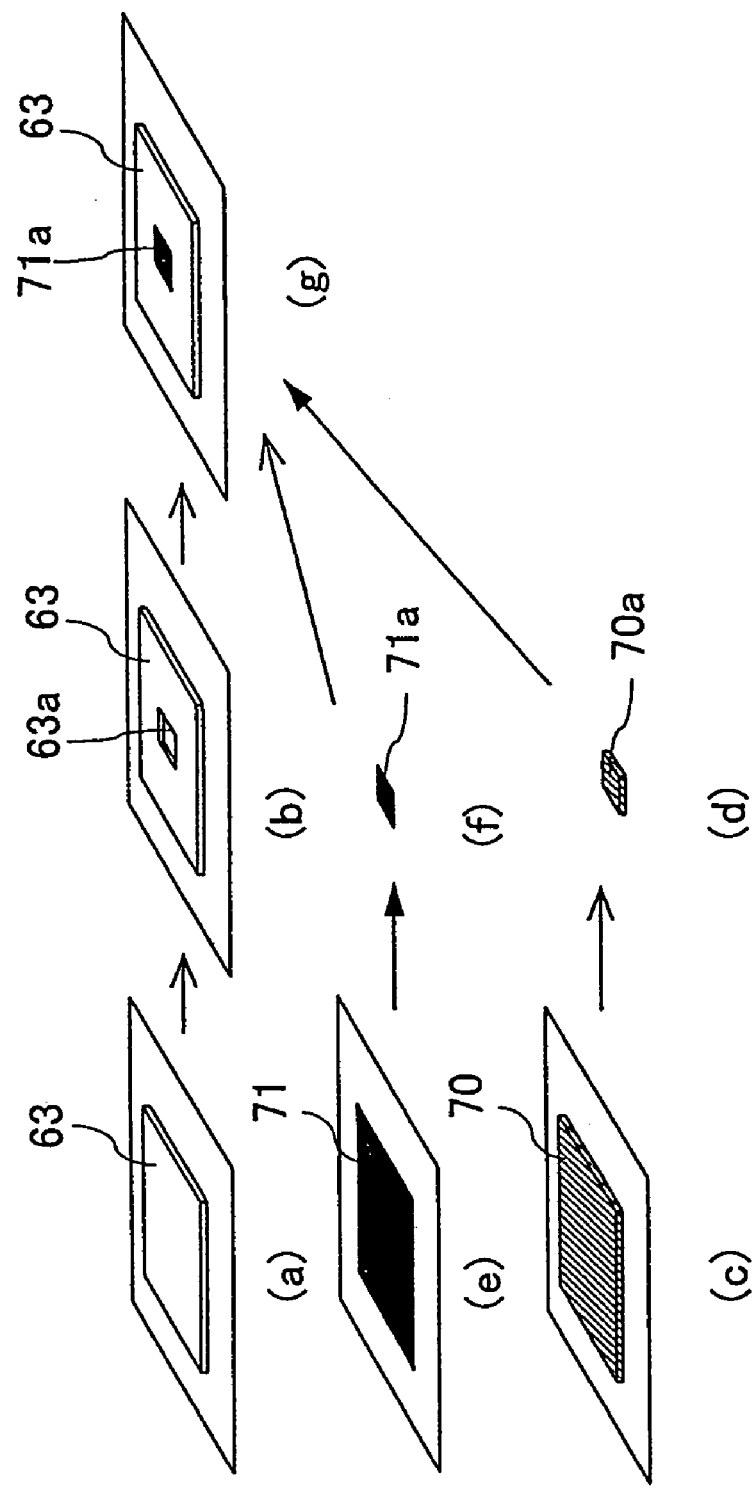

[Fig20]
(a) 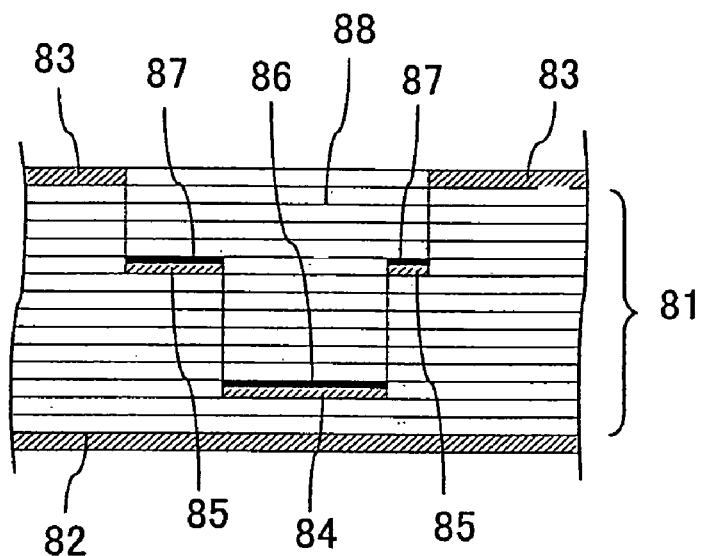
(b) 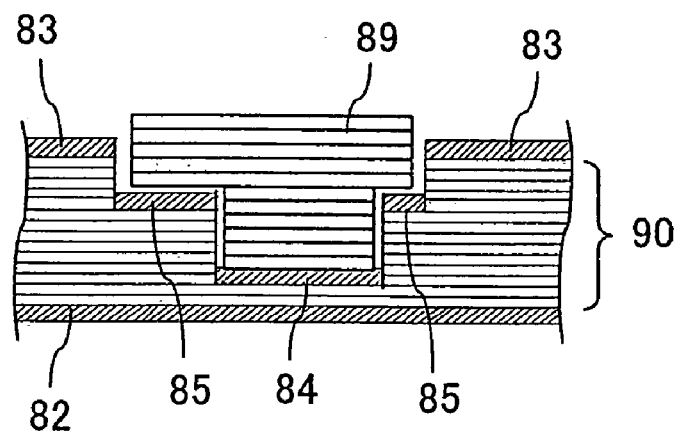
(c) 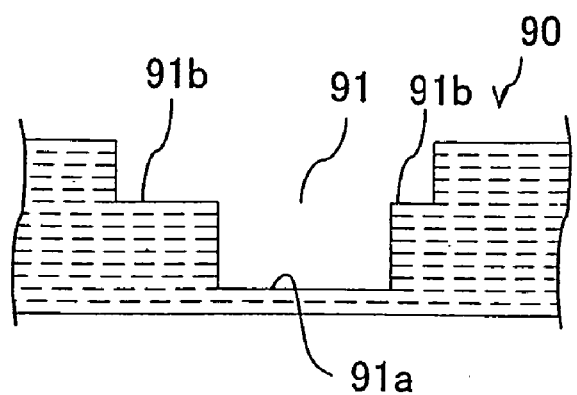

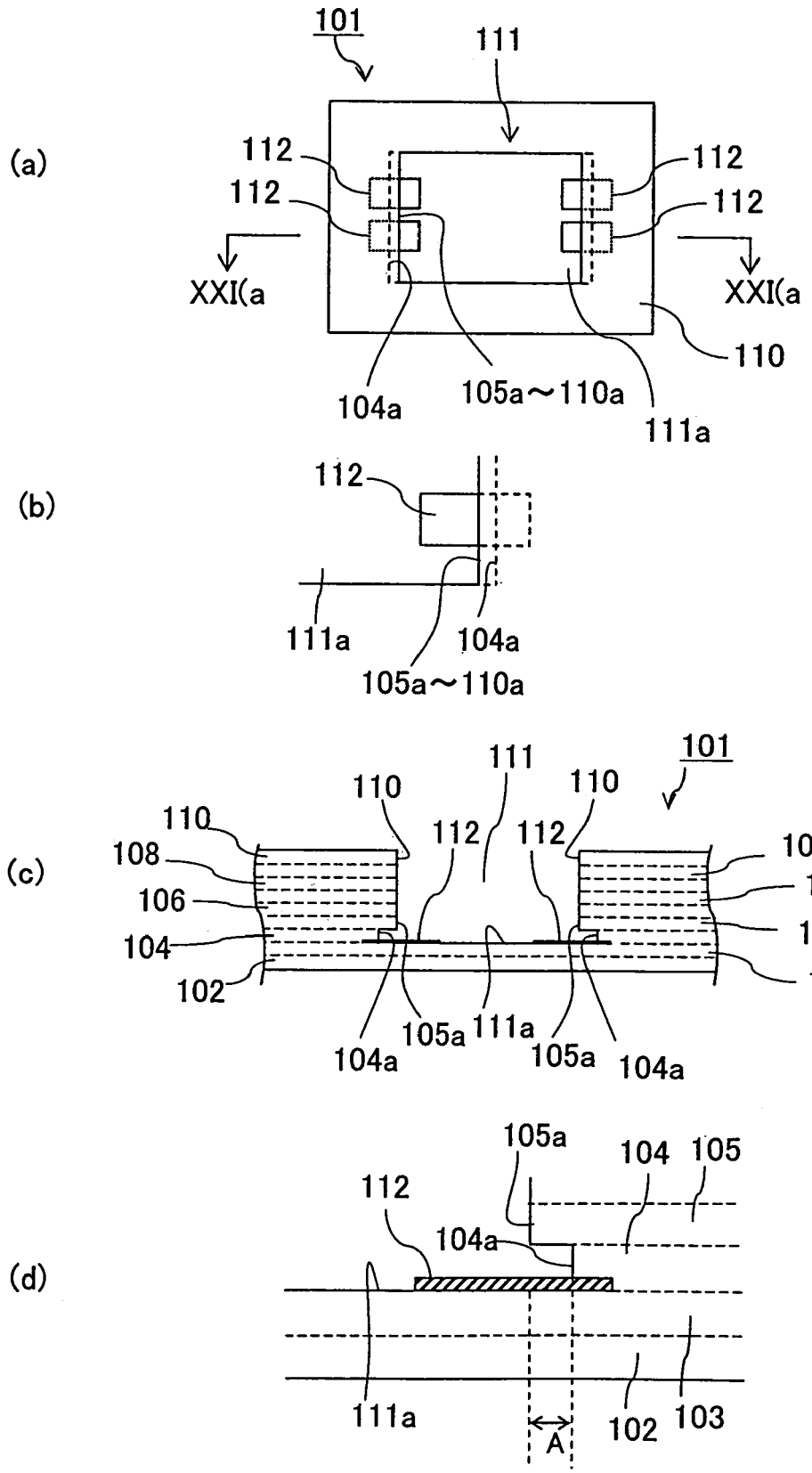
[Fig21]

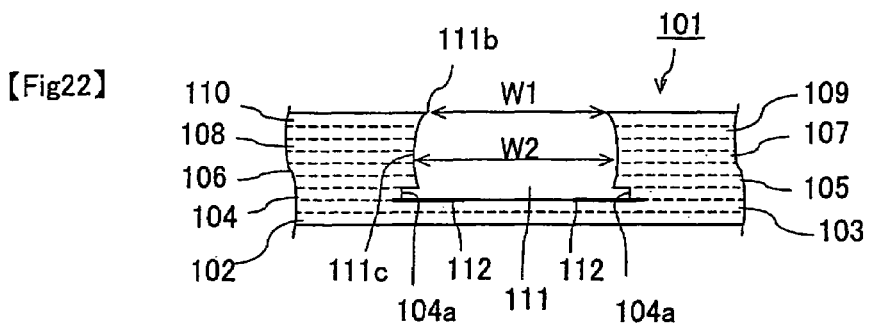
[Fig22]
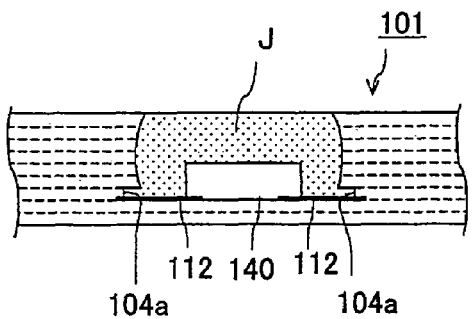
[Fig23]
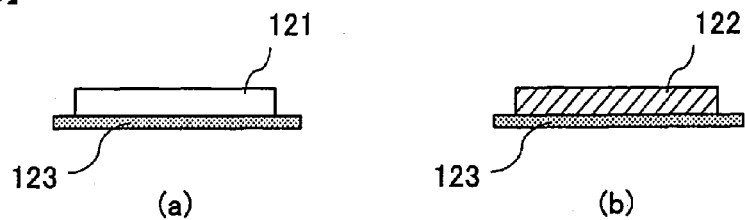
[Fig24]
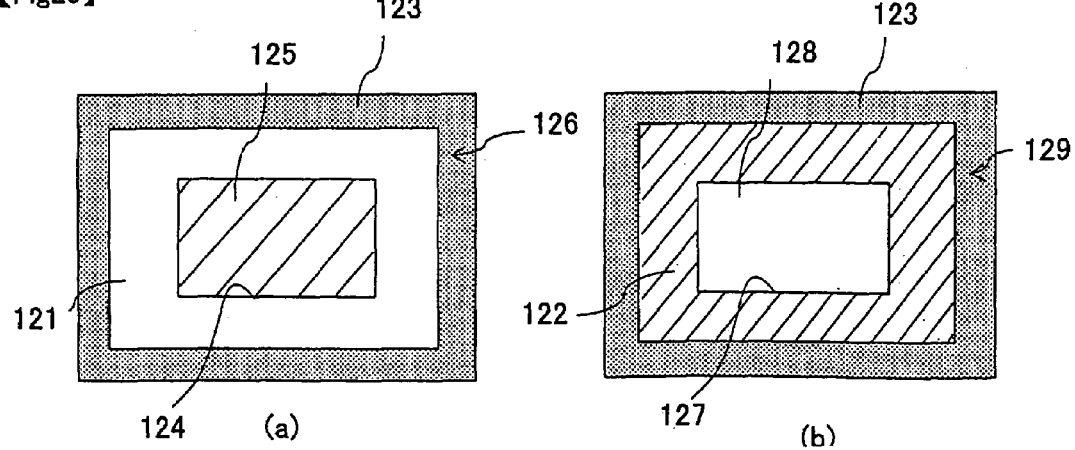
[Fig25]

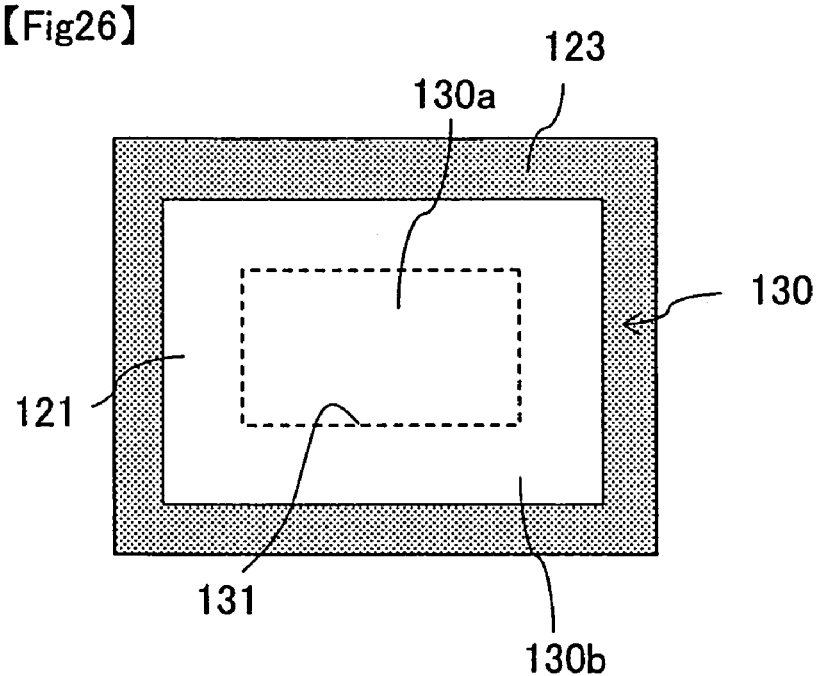
[Fig26]
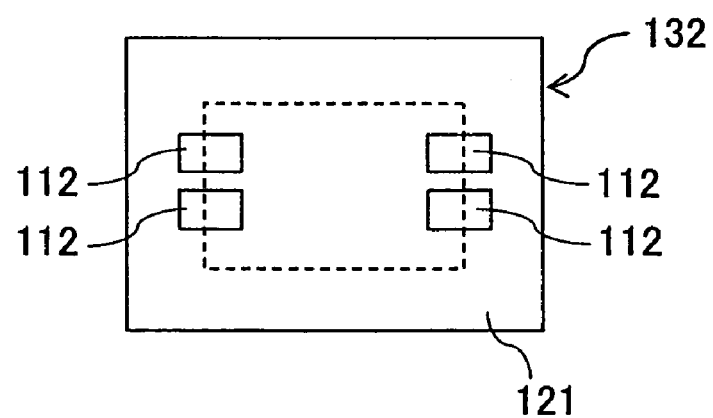
[Fig27]

[Fig28]
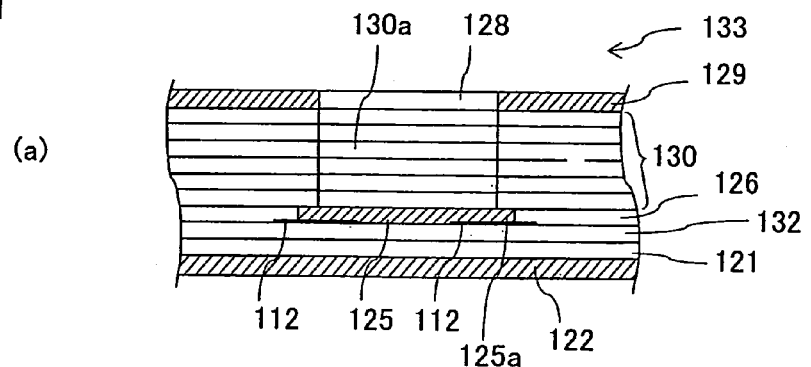
(a)
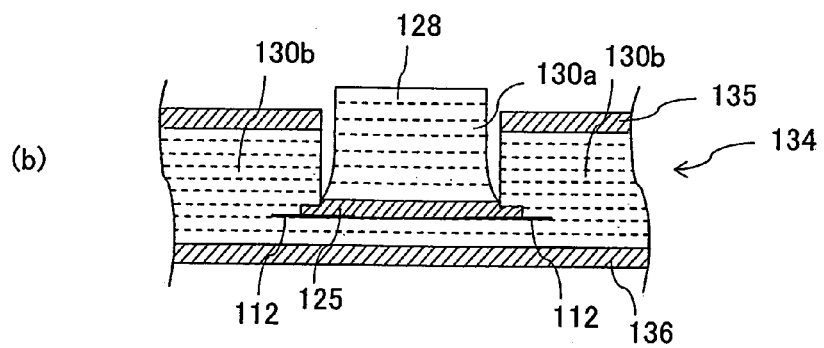
(b)
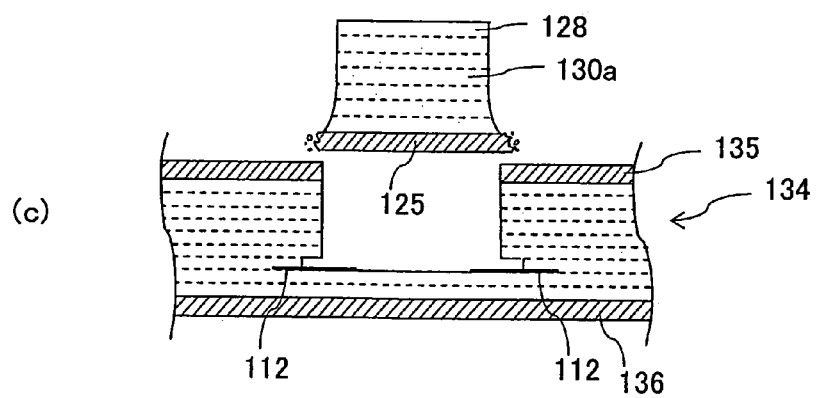
(c)
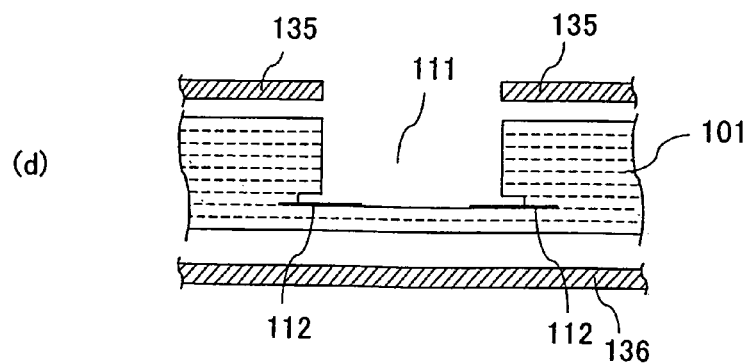
(d)

[Fig29]
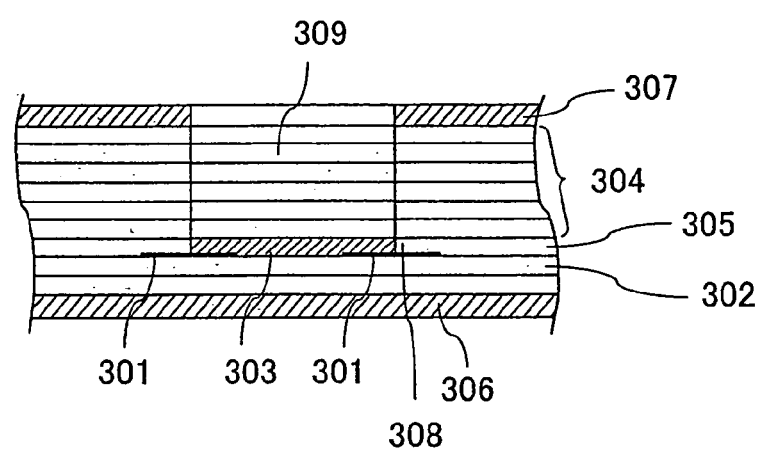
[Fig30]
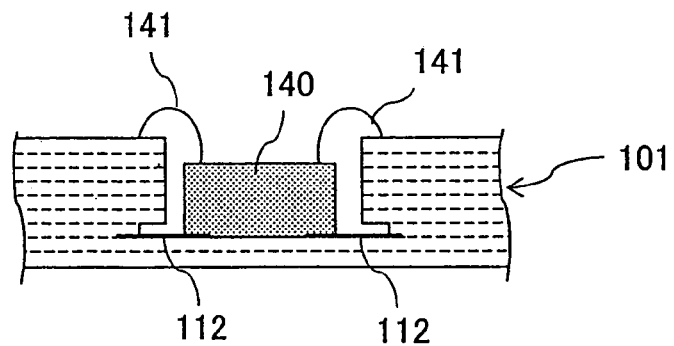

[Fig31]
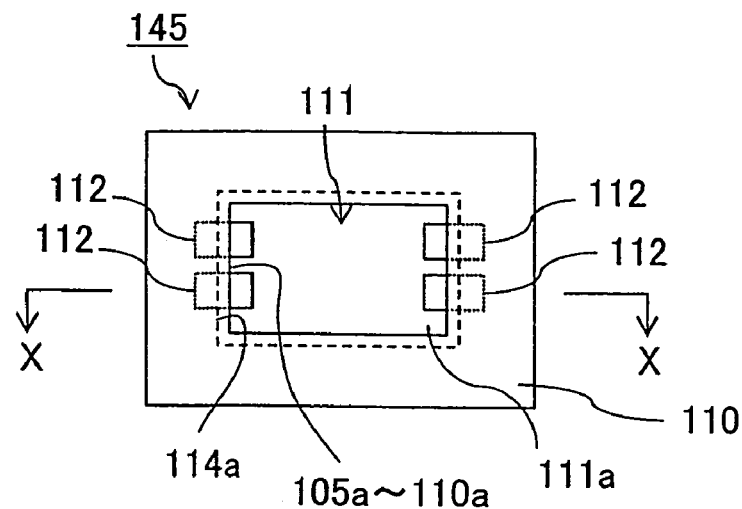
[Fig32]
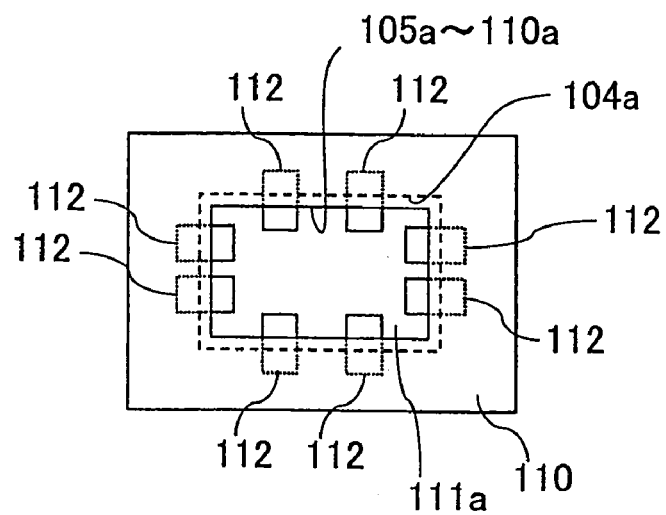

[Fig33]
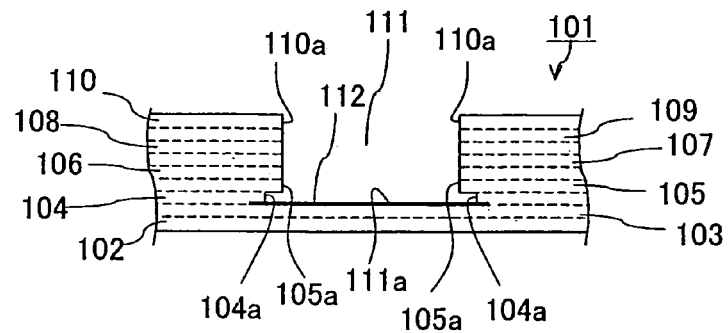
[Fig34]
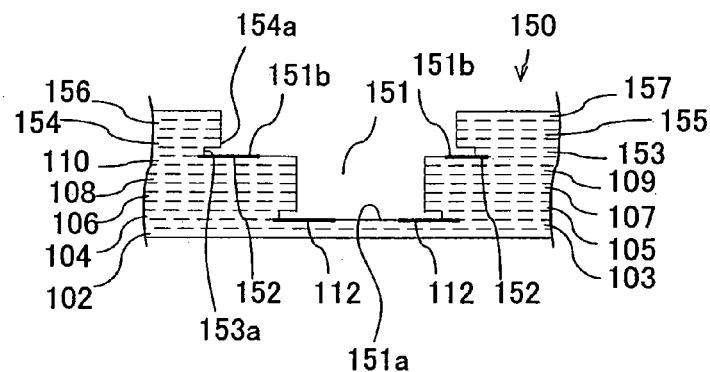
[Fig35]
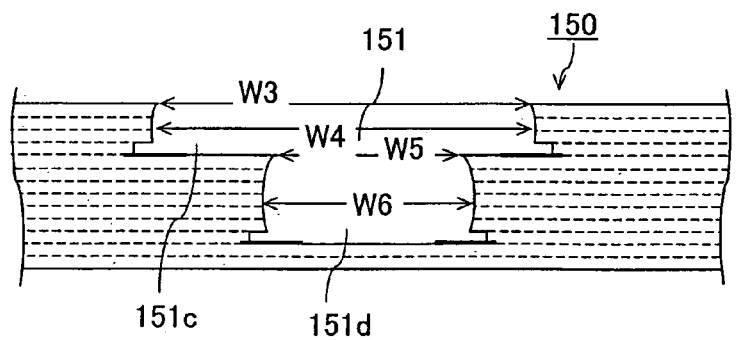
[Fig36]
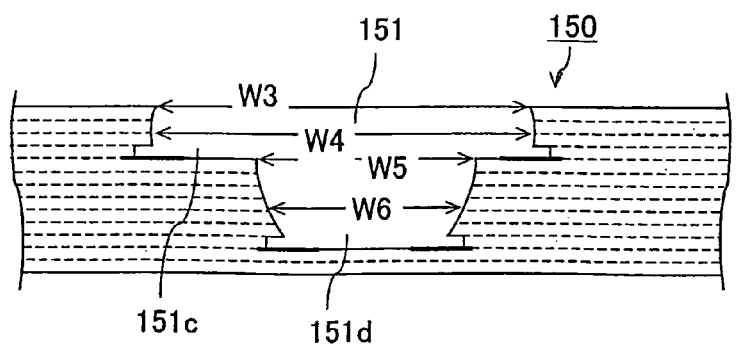

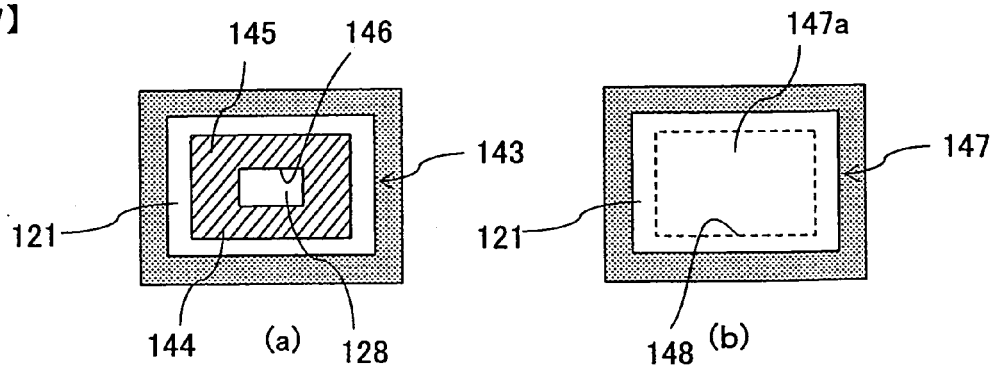
[Fig37]
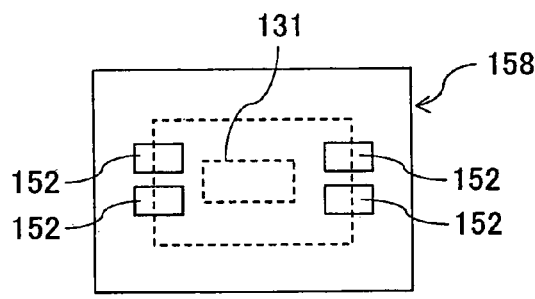
[Fig38]
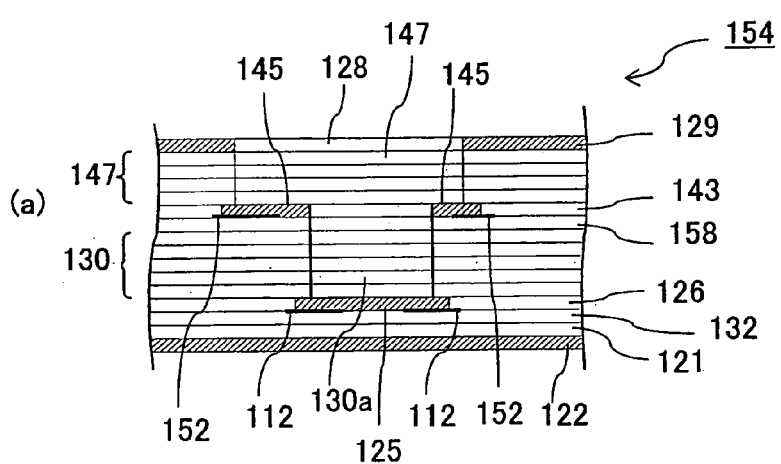
[Fig39]
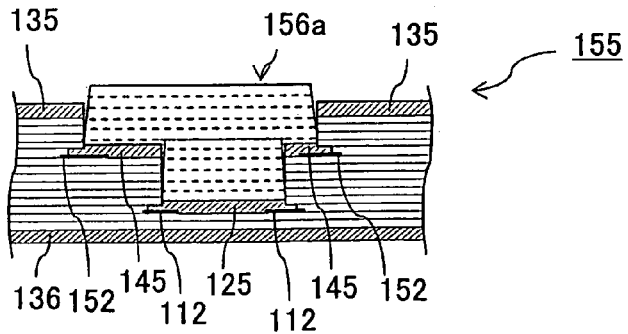

[Fig40]
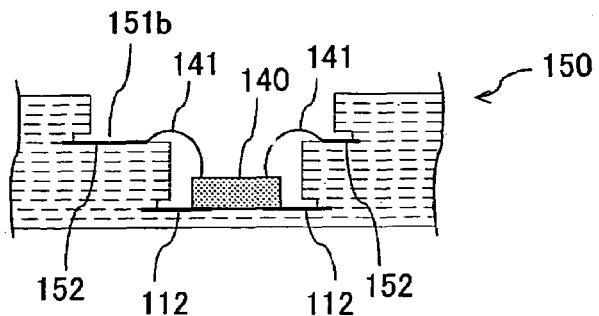
[Fig41]
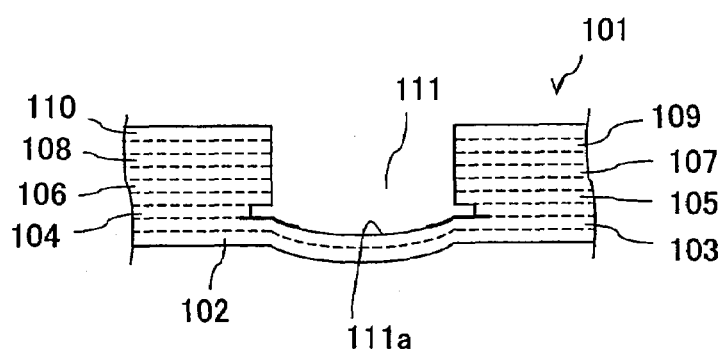
[Fig42]
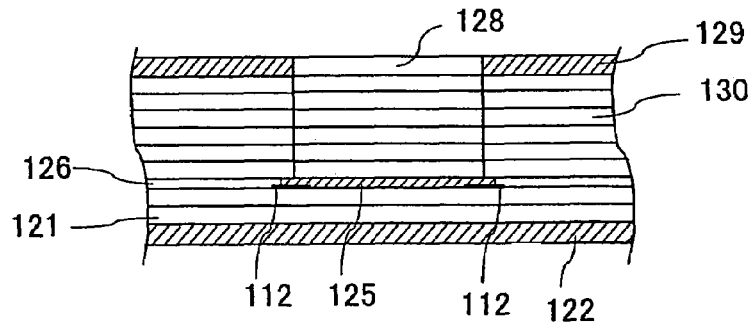
[Fig43]
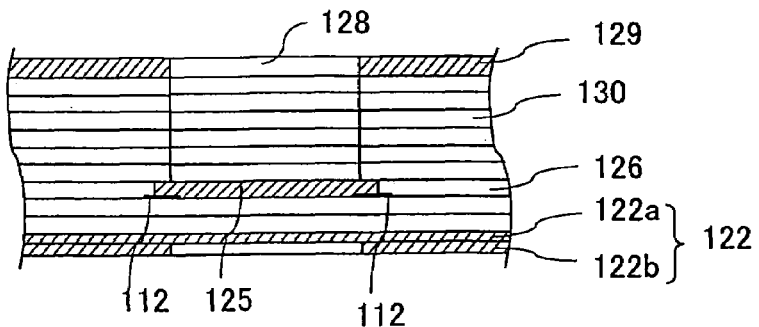

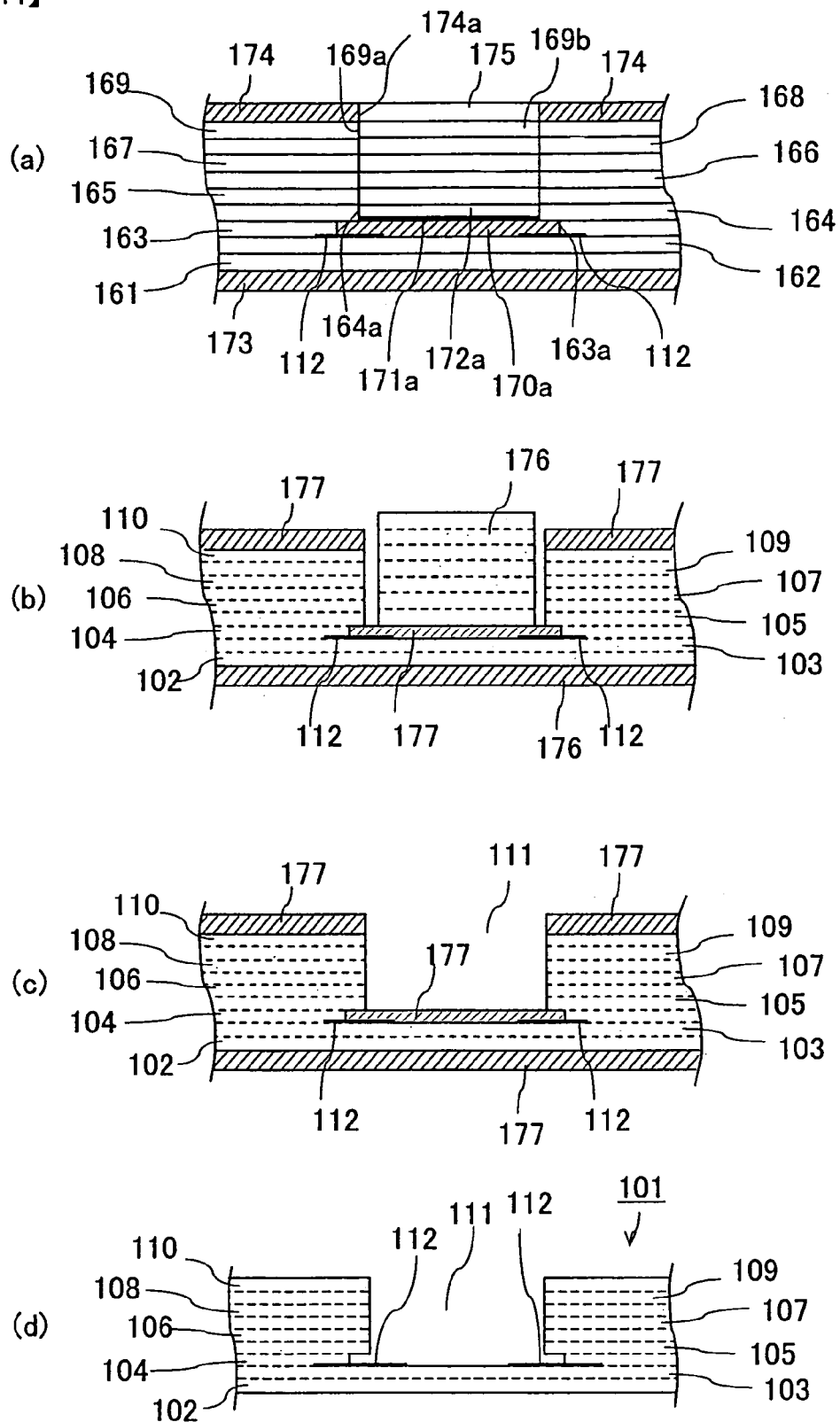
[Fig44]

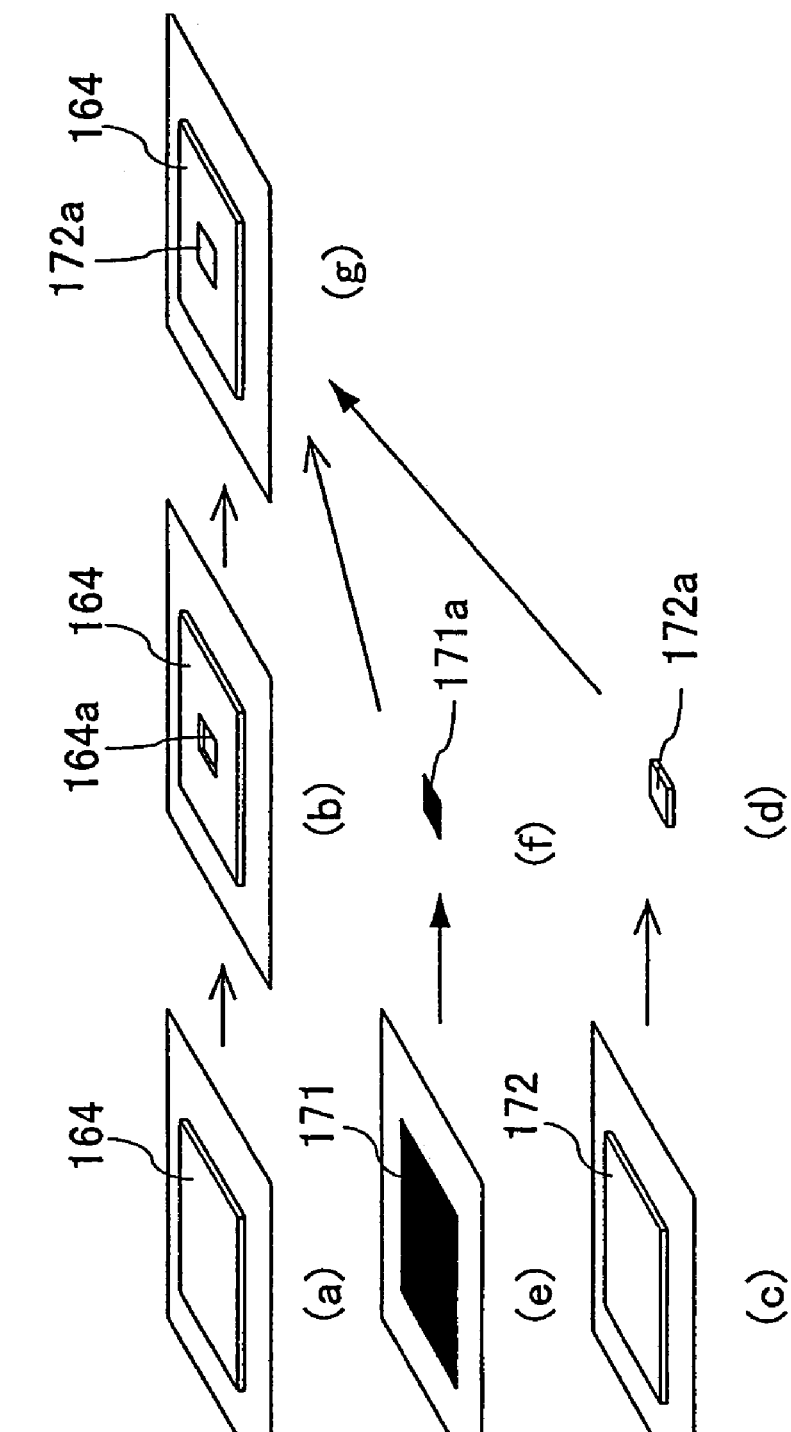

[Fig46]
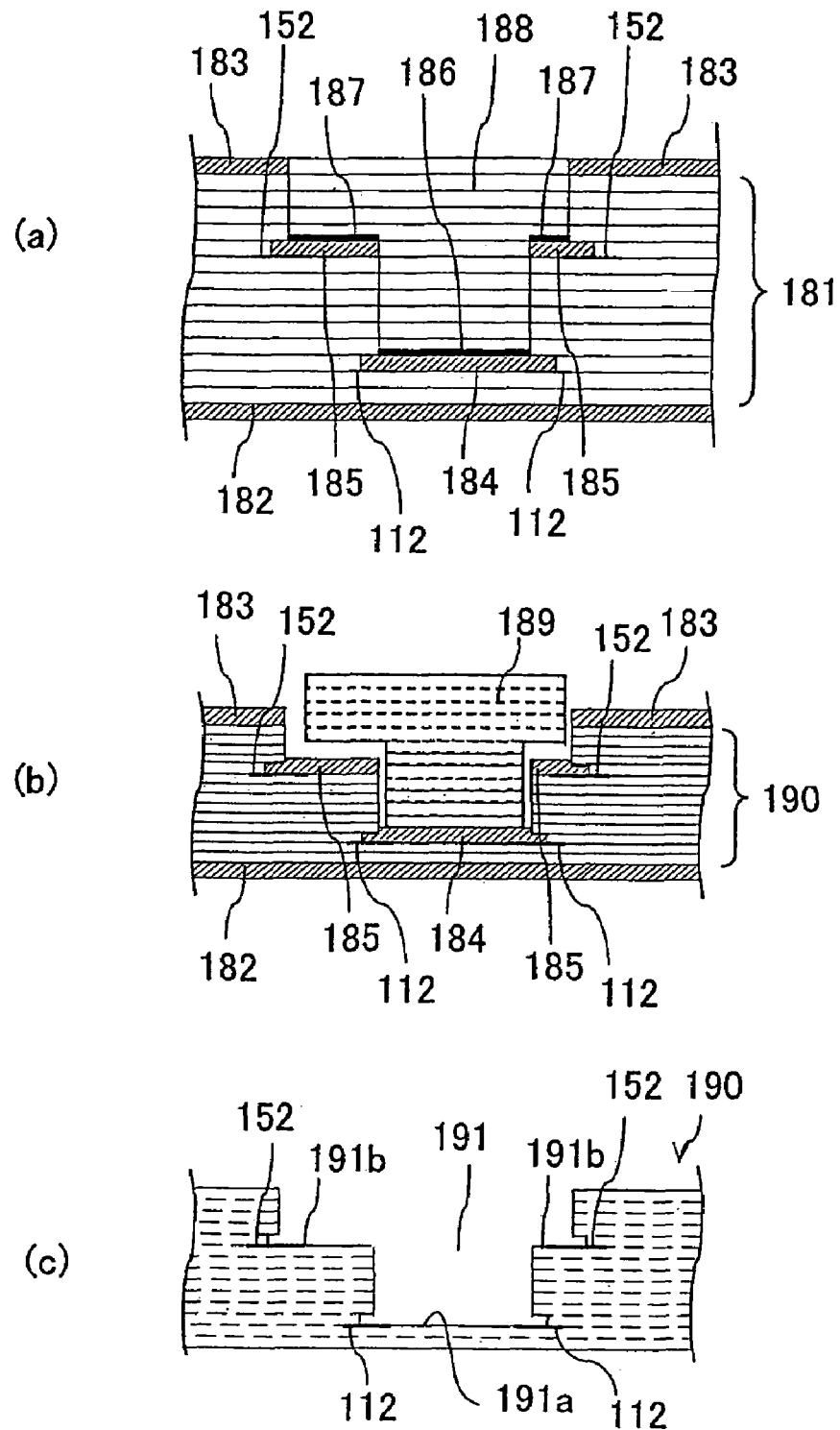

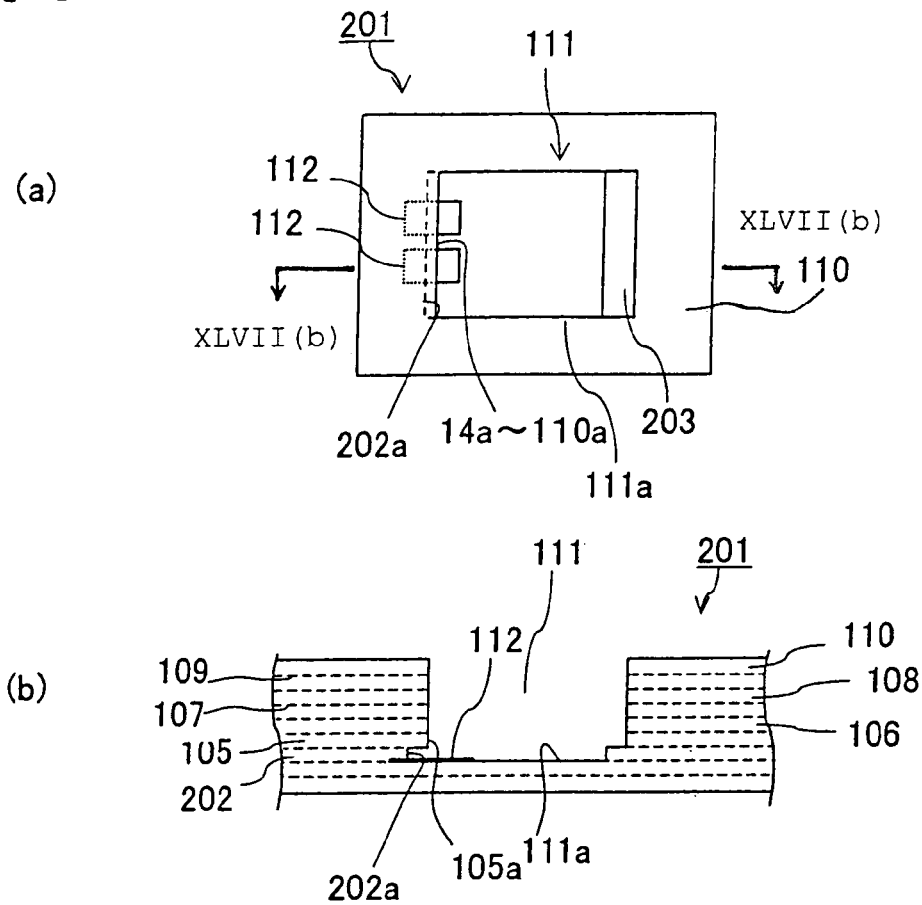
[Fig47]
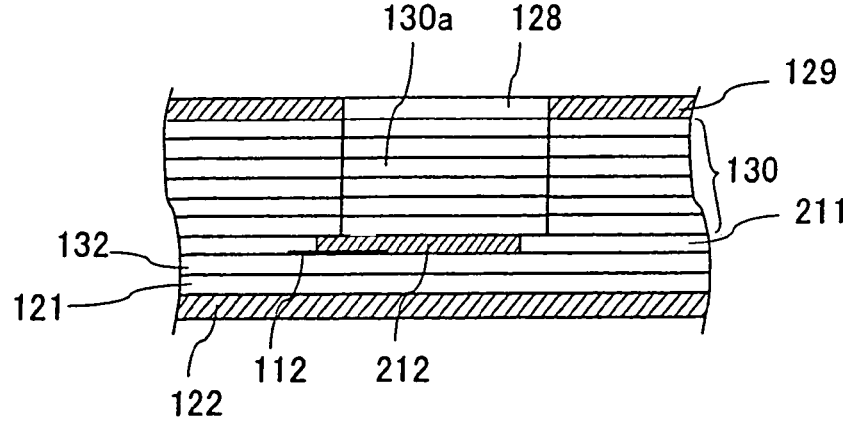
[Fig48]

[Fig49]
(a) 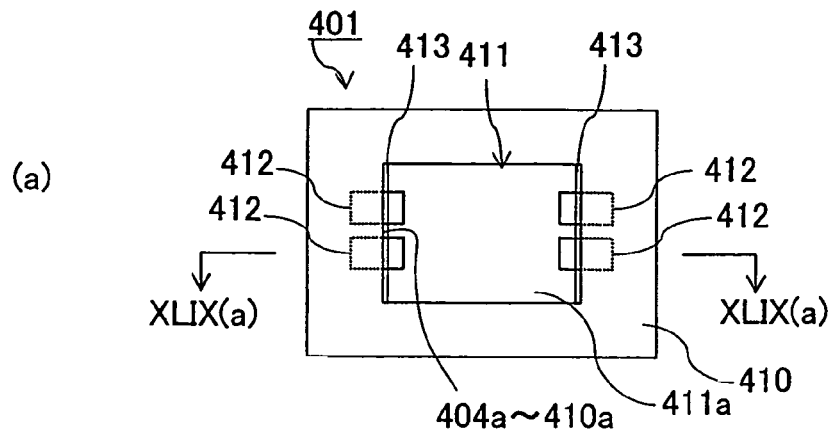
(b) 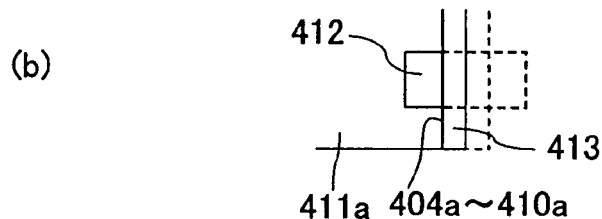
(c) 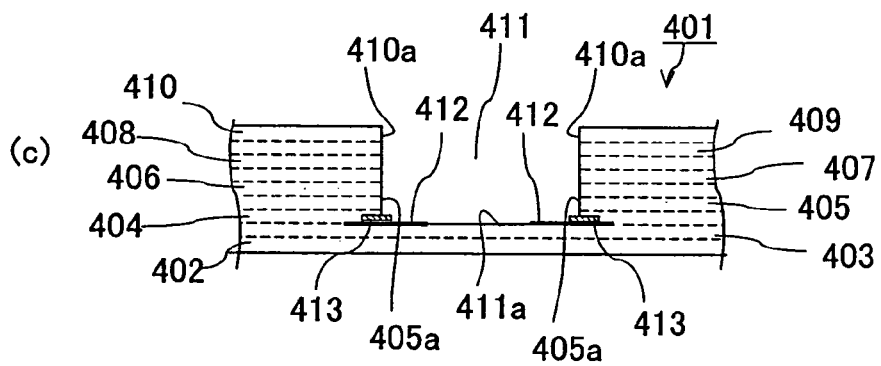
(d) 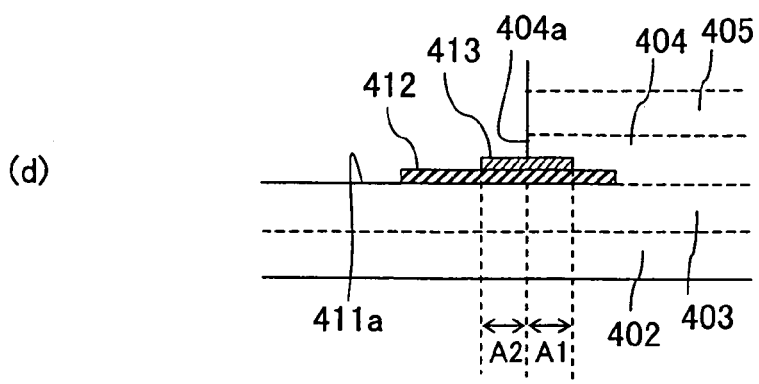

[Fig50]
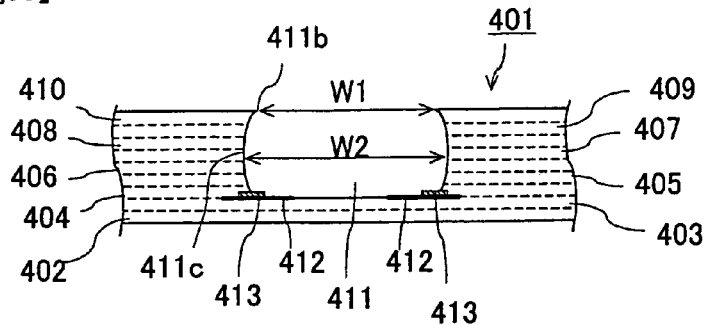
[Fig51]
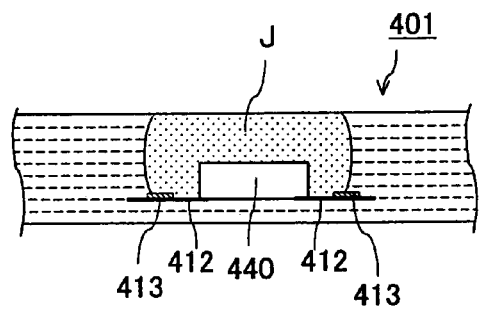
[Fig52]
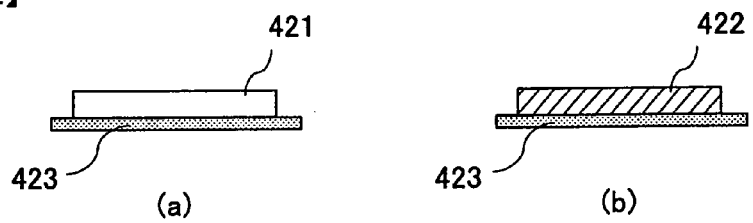
[Fig53]
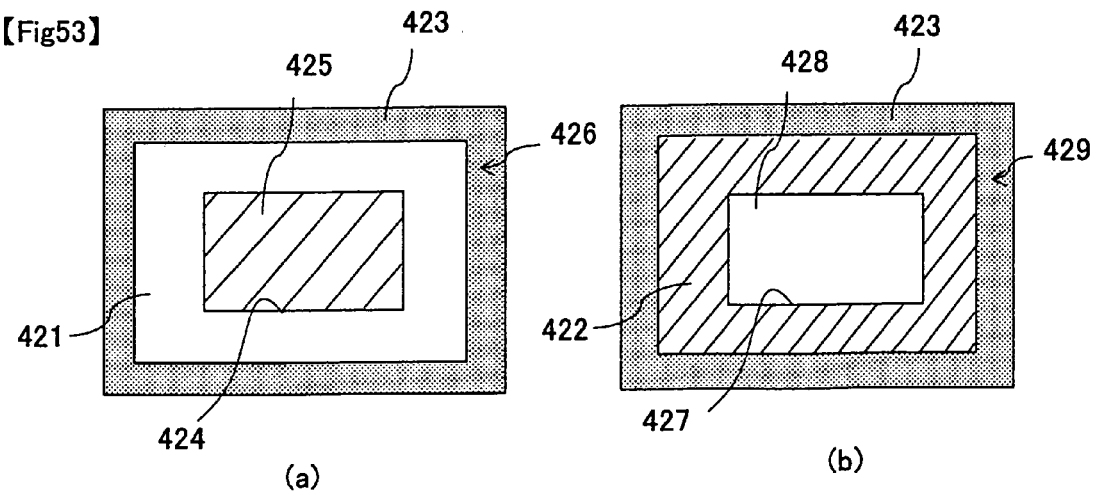

[Fig54]
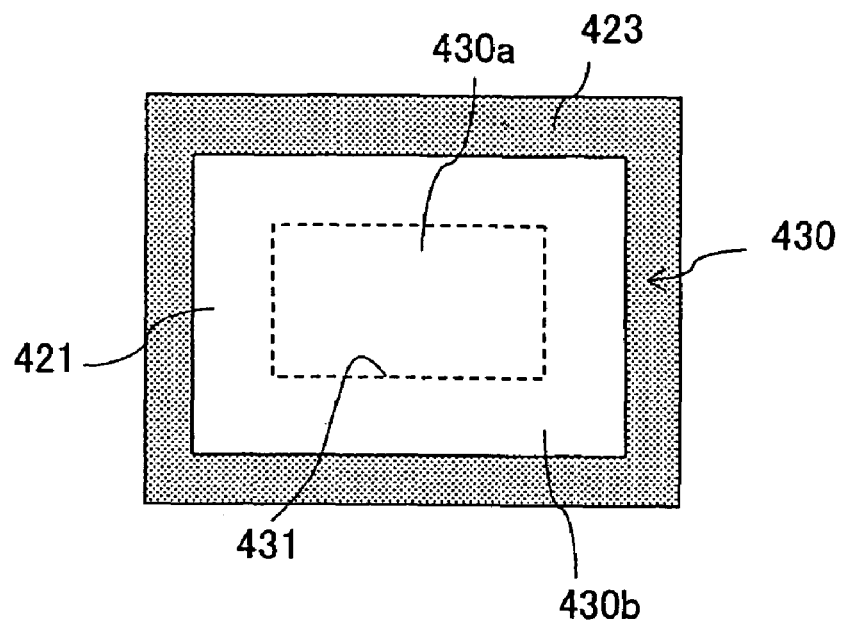
[Fig55]
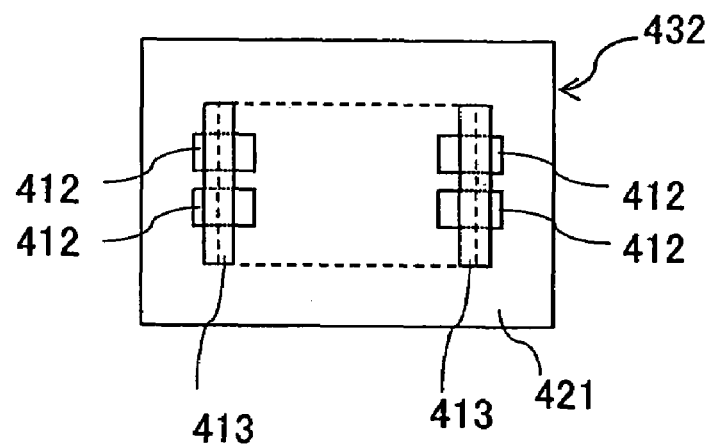

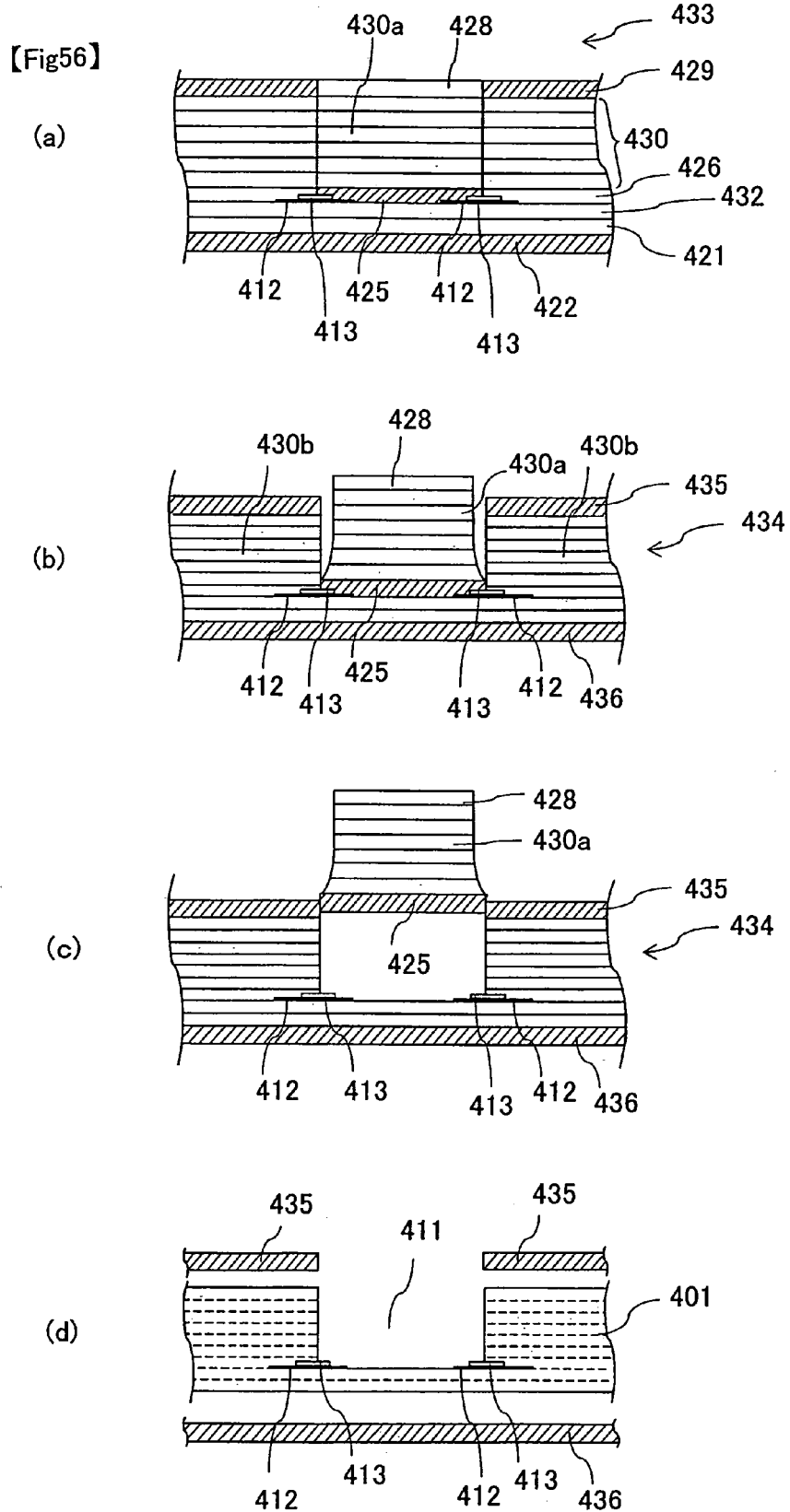

[Fig57]
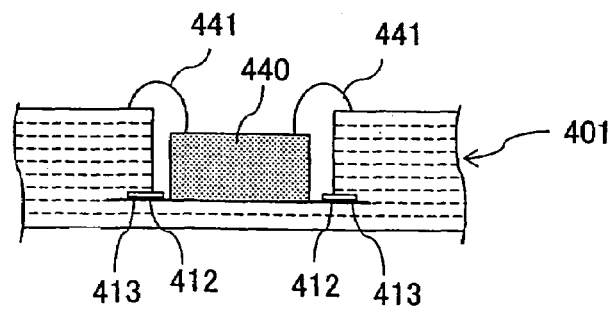
[Fig58]
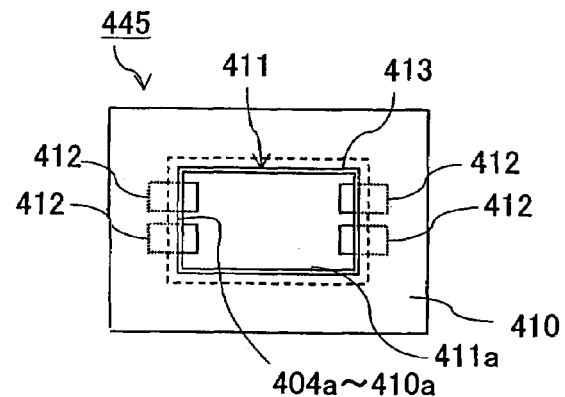
[Fig59]
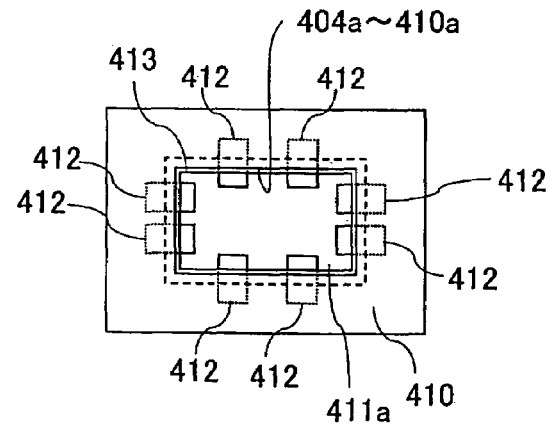
[Fig60]
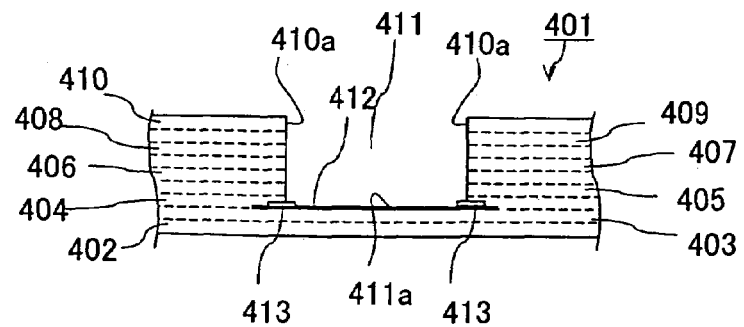

[Fig61]
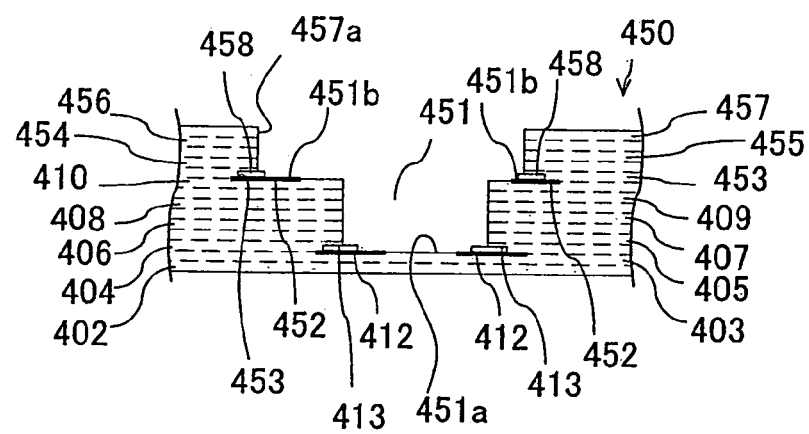
[Fig62]
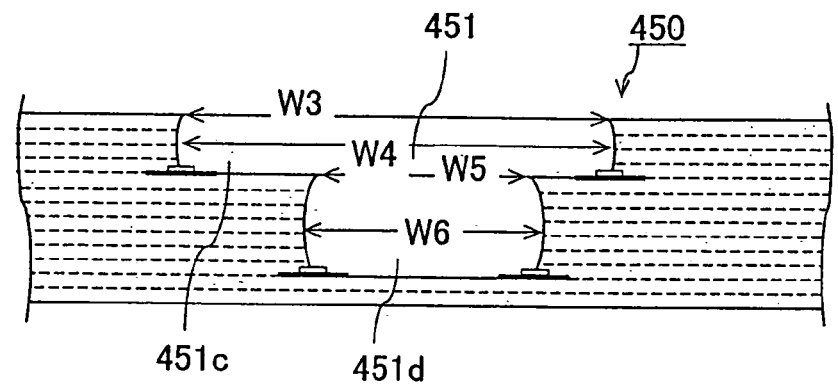

[Fig63]
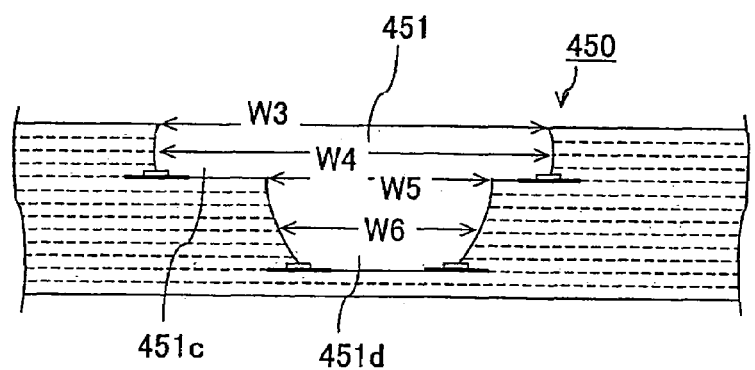
[Fig64]
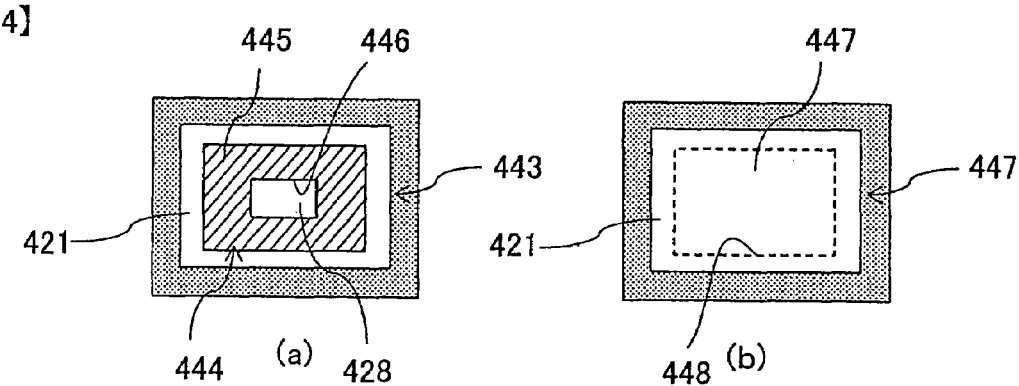

[Fig65]
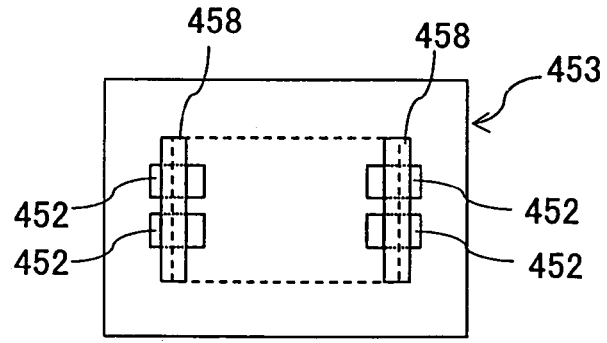
[Fig66]
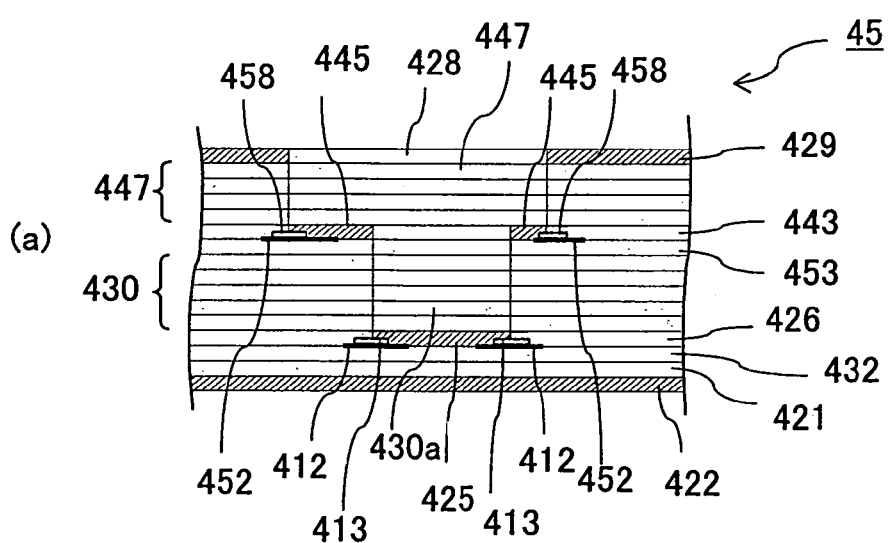
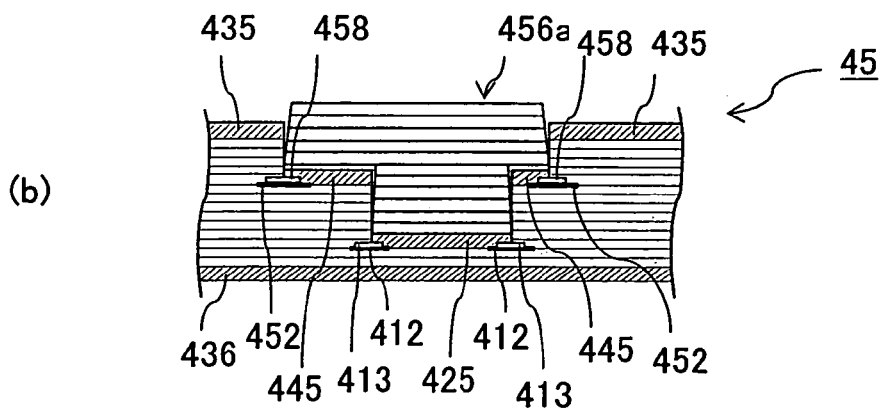

[Fig67]
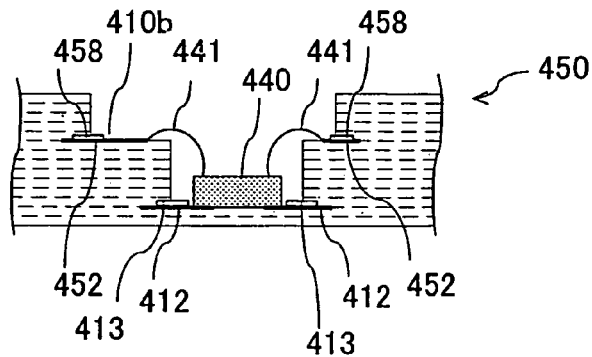
[Fig68]
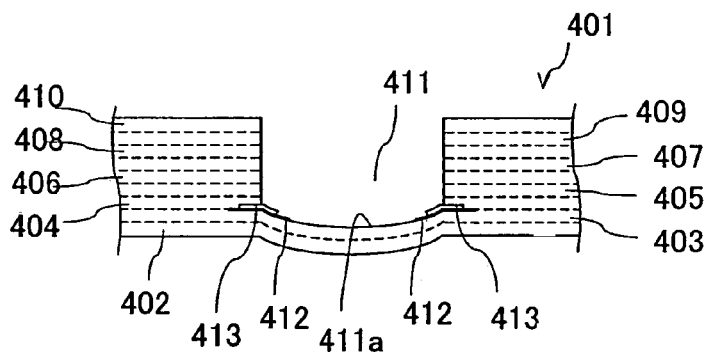
[Fig69]
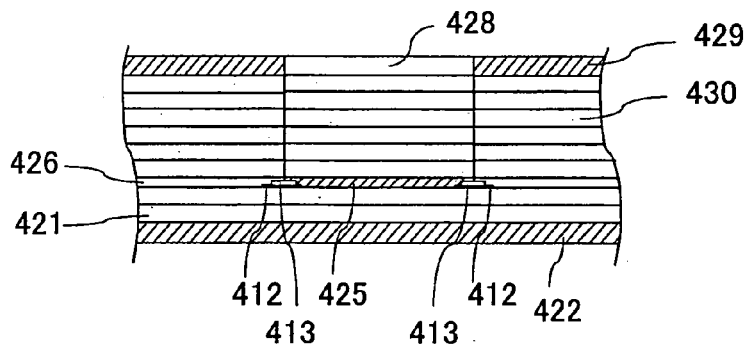
[Fig70]
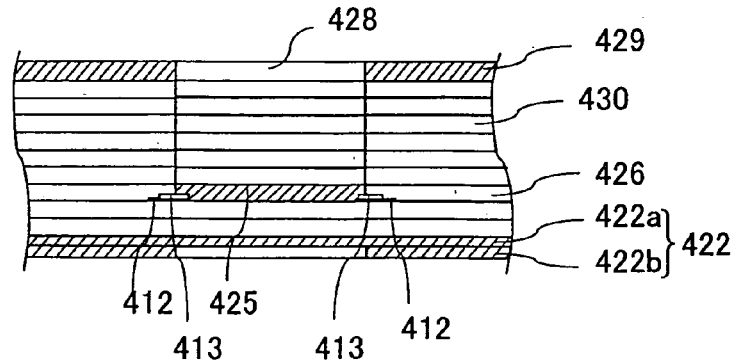

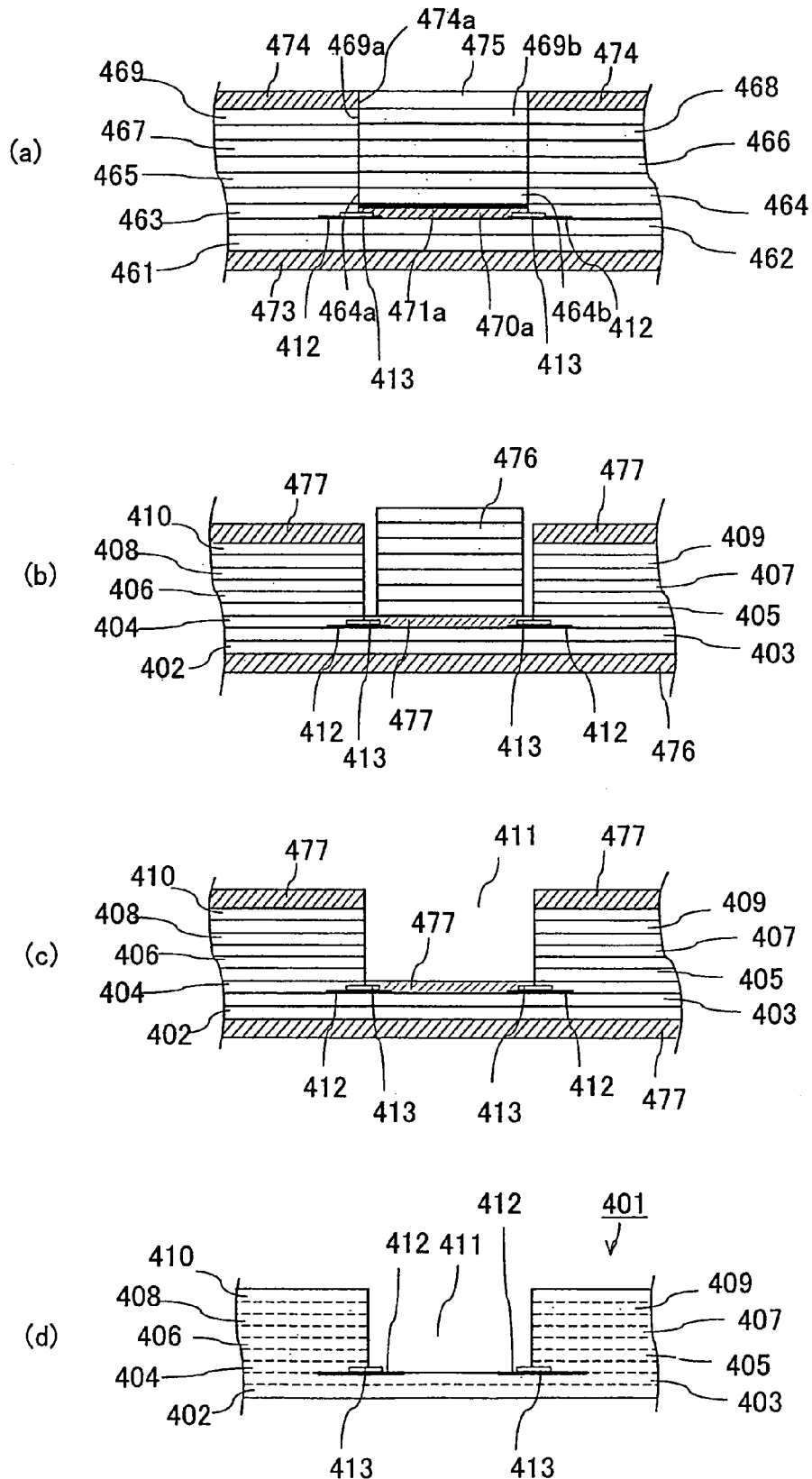
[Fig71]

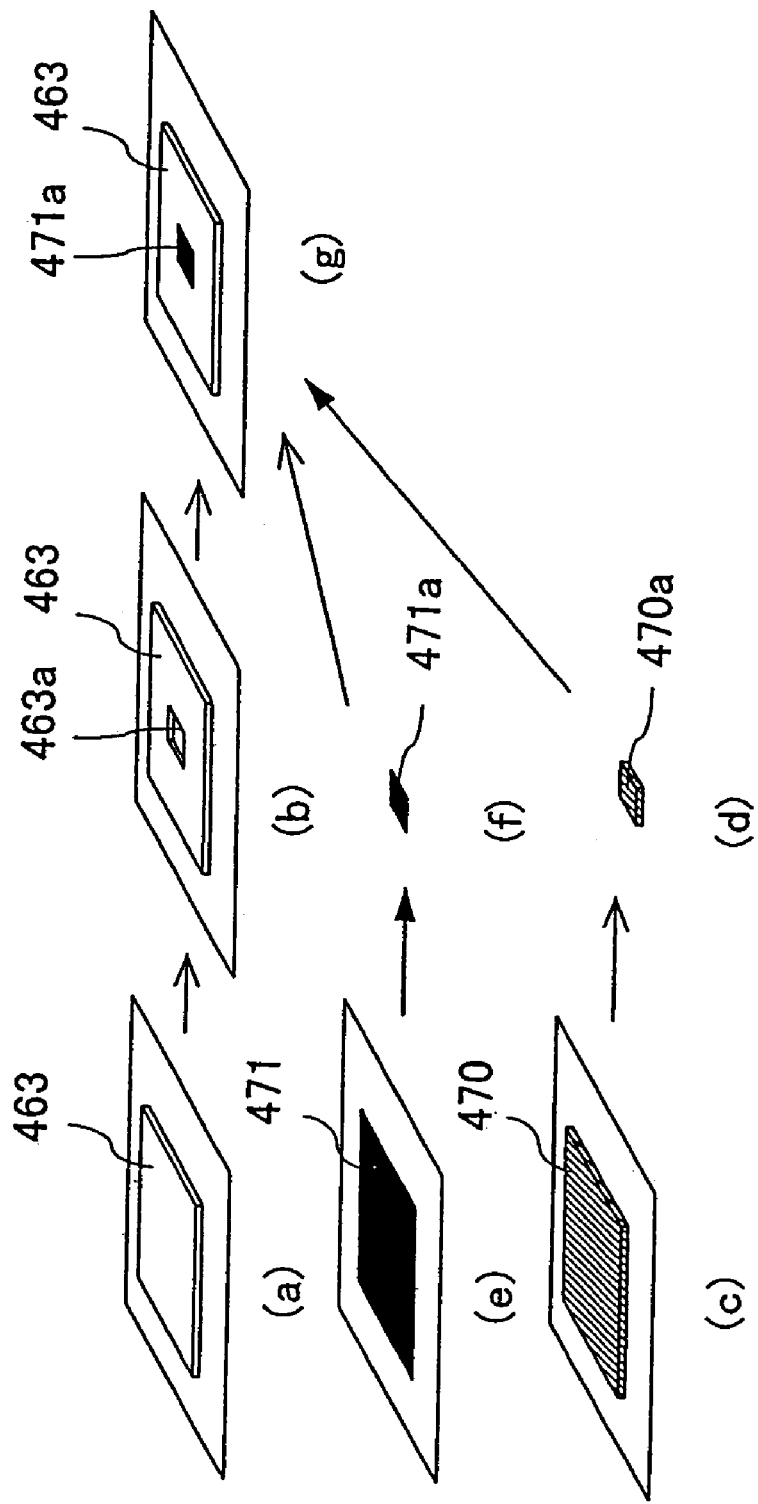

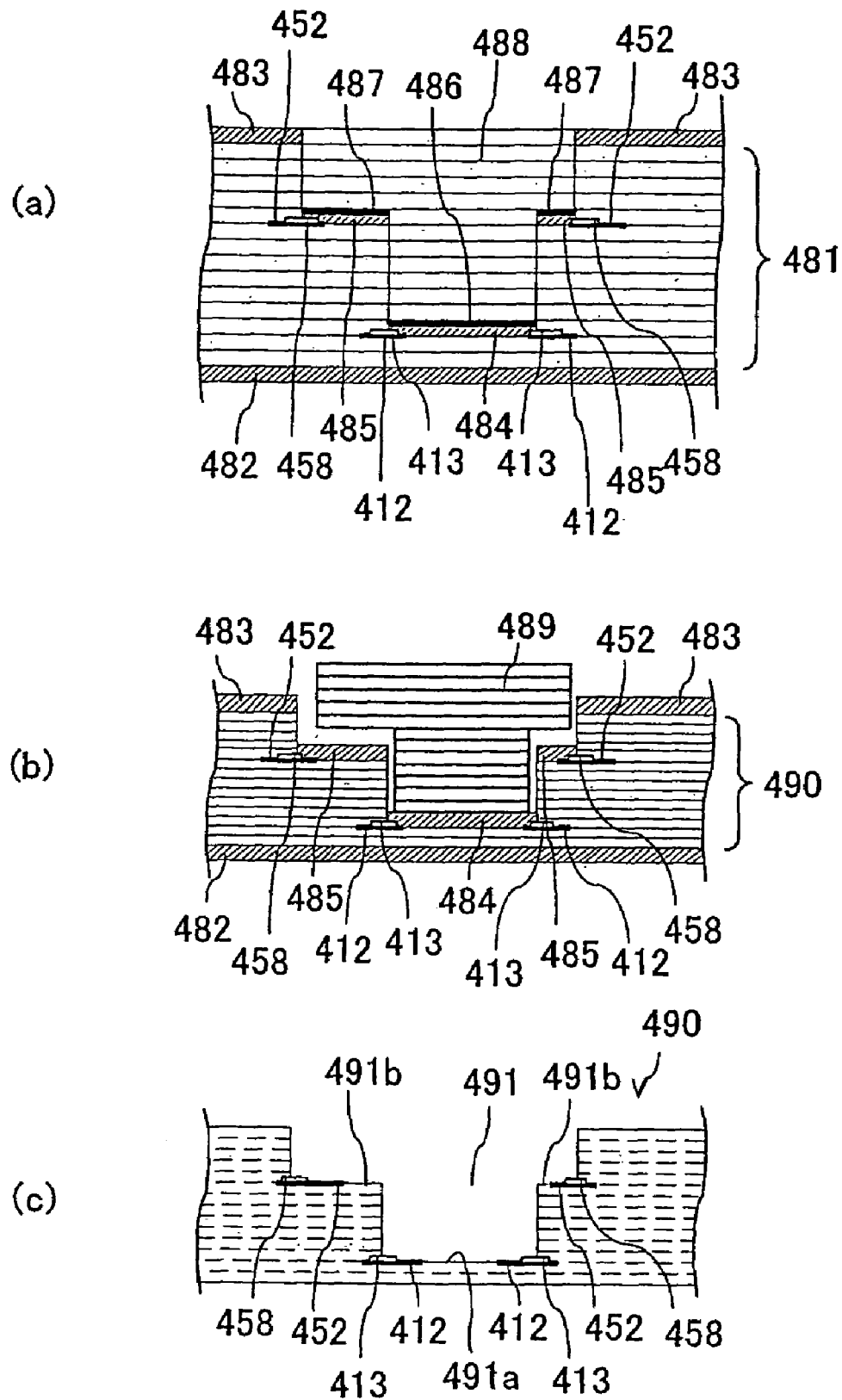
[Fig73]

[Fig74]
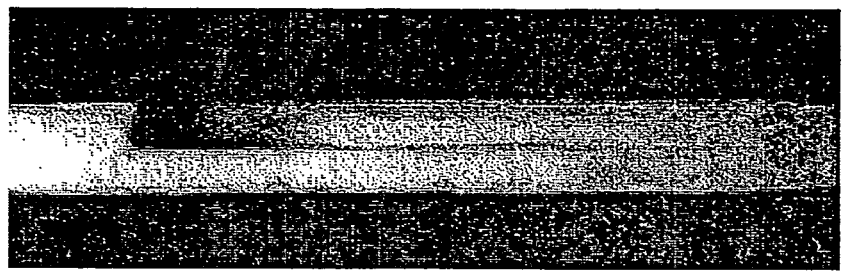
[Fig75]
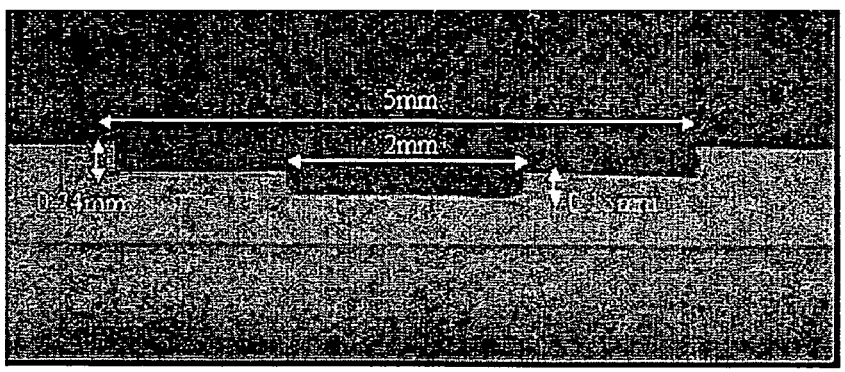

PRODUCTION METHOD OF A MULTILAYER CERAMIC SUBSTRATE

BACKGROUND OF THE INVENTION

1. Field of the Invention

The present invention relates to a production method of a multilayer ceramic substrate having a cavity, particularly to an improvement in a method for producing a multilayer ceramic substrate having a cavity utilizing a non-shrinkage firing process.

2. Description of the Prior Art

In the fields of electronics or other such devices, substrates for mounting electronic devices thereon have been being widely used. In recent years, however, multilayer ceramic substrates have been proposed and put to practical use as substrates satisfying demands for reduction in size and weight and for multifunctionality and having high reliability. A multilayer ceramic substrate is constituted by a plurality of ceramic layers laminated, and integral incorporation of a wiring conductor or an electronic device into each ceramic layer enables a substrate to be highly dense.

With respect to the multilayer ceramic substrates, with an aim of facilitating miniaturization and reduction in height of electronics, multilayer ceramic substrates having a cavity (concave part) formed therein for accommodating an electronic device have also been put to practical use. Since the multilayer ceramic substrate provided with a cavity can be mounted as having an electronic device accommodated in the cavity, the aforementioned demands can satisfactorily be fulfilled, thereby making it possible to realize reduction in size and height of the multilayer ceramic substrate per se.

Incidentally, the multilayer ceramic substrate can be obtained through the steps of laminating a plurality of green sheets to form a multilayer body and firing the multilayer body. The green sheet always shrinks as accompanied by sintering in the firing step. This is a serious cause in decreasing the dimensional accuracy of the multilayer ceramic substrate. To be concrete, a shrinkage variation arises as accompanied by the shrinkage and, in the multilayer ceramic substrate being obtained finally, the dimensional accuracy falls around 0.5%.

Under these circumstances, a so-called non-shrinkage firing process capable of suppressing the shrinkage in the in-plane direction and shrinking only in the thickness direction of the green sheets in the firing step of the multilayer ceramic substrate was proposed (JP-A HEI 10-75060, for example). As described in the prior art, when a multilayer body of green sheets having attached thereto a sheet not shrinkable even at the temperature in the aforementioned firing step is fired, the shrinkage in the in-plane direction is suppressed and only the shrinkage in the thickness direction is produced. According to this process, the dimensional accuracy in the in-plane direction of a multilayer ceramic substrate can be improved to fall around 0.05%.

When fabricating a multilayer ceramic substrate having the cavity mentioned above, even an application of the non-shrinkage firing process poses a problem of not always obtaining satisfactory dimensional accuracy or satisfactory flatness. This is because according to the ordinary non-shrinkage firing process the binding force of shrinkage suppression is not exerted onto the bottom of the cavity. When the binding force of shrinkage suppression is not exerted onto the bottom of the cavity, flatness of the bottom required for mounting an electronic device thereon cannot be secured to the effect that there is a possibility of failing to mount the electronic device on the bottom.

In view of the above, an attempt to also attach a shrinkage-suppressing sheet onto the bottom of the cavity was made to eliminate the disadvantage (JP-A 2003-318309, for example). The method of the prior art comprises the steps of forming on a carrier film a shrinkage-suppressing sheet containing an inorganic material for shrinkage suppression, inserting in the shrinkage-suppressing sheet a cut of the shape corresponding to the contour of the bottom of the cavity, removing the portion of the sheet outside the cut, transferring the shrinkage-suppressing sheet retained on the carrier sheet onto a ceramic green sheet for a substrate (substrate ceramic green sheet) that will constitute the bottom of the cavity in the step of laminating ceramic green sheets for fabricating a crude multilayer body for the substrate and performing the firing step, with the shrinkage-suppressing sheet disposed on the bottom of the cavity. With this, it is made possible to heighten the dimensional accuracy, difficult to form undesirable distortion within the cavity and possible to attain high density of wiring with high reliability.

However, only disposition of the shrinkage-suppressing sheet on the ceramic green sheet for the substrate that will constitute the bottom of the cavity is difficult to completely eliminate the problem of the deformation etc. of the cavity. Particularly, the method for producing a multilayer ceramic substrate requires a step of pressing a multilayer body having a plurality of green sheets laminated and, in the pressing step of the method for producing a multilayer ceramic substrate having a cavity, there is a fair possibility of the cavity opening being collapsed and deformed in the pressing step. Also in the firing step, a phenomenon of rendering the periphery of the cavity opening to bulge will occur, thus raising a possibility of the cavity opening being deformed.

As another method for fabricating a multilayer ceramic substrate having a cavity, also conceivable is a method comprising the steps of laminating a plurality of green sheets to form a multilayer body, firing the multilayer body and subjecting the multilayer body to a boring process. However, since the sintered multilayer body is hard and fragile, a process with high accuracy is difficult to perform and expensive equipment is required to use, leading to a high production cost.

The present invention has been proposed in view of the conventional state of affairs, and the object thereof is to provide a method for producing a multilayer ceramic substrate excellent in dimensional accuracy and flatness with ease at low cost and capable of eliminating generation of the deformation etc. of the periphery of the cavity.

SUMMARY OF THE INVENTION

To attain the above object, the present invention provides a production method of a multilayer ceramic substrate having a cavity, comprising the steps of laminating a plurality of substrate green sheets including cavity formation green sheets having through holes corresponding to the cavity to form a multilayer body, pressing the multilayer body and firing the pressed body, the method further comprising the steps of, before the pressing step, laminating shrinkage suppression green sheet pieces on surfaces of the substrate green sheets, respectively, which surfaces constitute an outermost layer of the multilayer body, laminating a shrinkage suppression green sheet piece on a substrate green sheet constituting a bottom of the cavity, disposing on the shrinkage suppression green sheet piece an embedded green sheet separate from the cavity formation green sheets to fill in the cavity and, after the firing step, removing the embedded green sheet fired.

In the above production method, since the non-shrinkage firing process is performed, with the shrinkage suppression green sheet disposed also on the substrate green sheets exposed to the bottom of the cavity, as described above, the dimensional accuracy is secured and, also, the flatness of the cavity bottom is sufficiently secured. At the same time, the pressing step of the multilayer body is performed, with the embedded green sheet disposed in the cavity, the pressing step is easy to perform with a flat mold die in the same manner as in the case of pressing a multilayer body having no cavity, and there is no possibility of deformation including cavity opening collapse and bulge of the periphery of the cavity opening.

In the production method, the embedded green sheet is disposed on the shrinkage suppression green sheet piece and, at this time, when the binding force of the shrinkage suppression green sheet is exerted on the embedded green sheet, there is a possibility of the stress accompanied by the shrinkage of the embedded green sheet affecting the substrate green sheet constituting the cavity bottom via the shrinkage suppression green sheet. When there is a fear of the affection, it is preferred that no binding force is exerted between the embedded green sheet and the shrinkage suppression green sheet piece.

To be specific, a sheet capable of being burnt down (burnable sheet) is interposed between the shrinkage suppression green sheet piece and the embedded green sheet. In this case, the embedded green sheet is disposed via the burnable sheet on the shrinkage suppression green sheet piece, and the burnable sheet is burnt down rapidly in the firing step. Therefore, no binding force of the shrinkage suppression sheet piece is exerted on the embedded green sheet and no shrinkage stress of the embedded green sheet affects the cavity bottom during the course of firing. In addition, the burnable sheet is burnt down in the firing step and the fired embedded green sheet is rapidly removed.

In the present invention, the cavity bottom includes all surfaces existing in the direction of the cavity depth. When the cavity forms a multistage, for example, the cavity bottom includes the bottom existing at the deepest position and the surfaces of steps existing at shallower positions. While the embedded green sheet has to be separate from the cavity formation green sheets, the separation in this case means both that the cut pierces the cavity formation green sheet in its depth direction and that the cut does not piece it.

On the other hand, in the multilayer ceramic substrate produced by the production method, the cavity assumes a specific shape different from the shape of a prior art cavity. The specific shape is prescribed by the multilayer ceramic substrate of the present invention. To be specific, the multilayer ceramic substrate of the present invention has a plurality of ceramic layers laminated and has a cavity, in which the opening area of the opening of the cavity is smaller than the opening area of a portion at a position midway in the depth direction.

In the multilayer ceramic substrate of the present invention, the shape of the cavity is advantageous in the case of sealing an electronic device within the cavity with a resin. In the multilayer ceramic substrates having a cavity, in many cases, an electronic device is accommodated in the cavity and sealed with a resin. In this resin-seal, the problem will arise in that the resin sealed exfoliates and falls off, resulting from the difference in thermal expansion coefficient between the ceramic constituting the multilayer ceramic substrate and the resin material used for the resin-seal. This problem becomes conspicuous particularly when a temperature change is repeated over a long period of time. In the multilayer ceramic substrate of the present invention, since the opening area of the opening of the cavity is smaller than the opening area of the portion at a position midway in the depth direction, as described above, the resin filled and hardened in the cavity cannot pass through the cavity and is physically retained within the cavity in an amassed state. Therefore, the sealed resin is prevented from exfoliating and falling off the ceramics. If the resin should exfoliate, there is no case where the resin falls off the cavity.

In the multilayer ceramic substrate, generally, a conductive pattern is formed on the cavity bottom or inside the multilayer ceramic substrate. When the production of a multilayer ceramic substrate having a conductive pattern formed as straddling the periphery of the cavity bottom is to be attempted using the non-shrinkage firing process, with a shrinkage suppression green sheet piece disposed on the cavity pattern, a problem of disconnection of the conductive pattern, with the portion of contact with the sidewall of the cavity as a boundary, will possibly be posed. This disconnection is caused by concentration of stress in the conductive pattern in contact with the lower end of the cavity sidewall (inner periphery of the cavity formation green sheet in contact with the cavity bottom formation green sheet) or in the cavity bottom formation ceramic layer, which stress is generated by great shrinkage of, for example, the cavity formation green sheet constituting the lower end in the direction apart from the center of the cavity, because the binding force of the shrinkage suppression green sheet piece and shrinkage suppression green sheet relative to the lower end of the cavity sidewall is small.

To eliminate the disadvantage, it is effective, in the portion on which a conductive pattern is formed as straddling the periphery of the cavity bottom, that the end face of the shrinkage suppression green sheet piece is disposed outside the end face of embedded green sheet to be laminated thereon. This is prescribed by the second configuration of a multilayer ceramic substrate according to the present invention, which has a cavity and comprises a plurality of ceramic layers integrally laminated and including a cavity bottom formation ceramic layer that constitutes a bottom of the cavity and cavity formation ceramic layers, each of which has a through hole conforming to an opening of the cavity, and a conductive pattern formed on the cavity bottom formation ceramic layer as straddling a periphery of the cavity bottom, wherein in a portion of the periphery of the cavity bottom overlapping the conductive pattern, a wall surface of the through hole of a first cavity formation ceramic layer laminated immediately on the cavity bottom formation ceramic layer is at a position outside a wall surface of the through hole of a second cavity formation ceramic layer laminated immediately on the first cavity formation ceramic layer.

A production method for producing the multilayer ceramic substrate of the second configuration further comprises, in addition to the steps in the previous configuration, the steps of forming a conductive pattern on the substrate green sheet constituting the bottom of the cavity as straddling a periphery of the cavity bottom, forming a first cavity formation green sheet having a through hole in which a shrinkage prevention green sheet piece is embedded and a second cavity formation green sheet laminated immediately on the first cavity formation green sheet and having an embedded green sheet that is separate from the cavity formation green sheet embedded in the cavity, laminating the first and second cavity formation green sheets, respectively, immediately on the substrate formation green sheet constituting the bottom of the cavity and immediately on the first cavity formation green sheet so that the cavity bottom, the shrinkage suppression green sheet piece and the embedded green sheet overlap to form the multilayer body, in which the shrinkage suppression green sheet piece in at least a portion of the periphery of the cavity bottom overlapping the conductive pattern has an end face disposed outside an end face of the embedded green sheet the second cavity formation green sheet has.

With the above configuration, the shrinkage suppression green sheet piece disposed on the cavity bottom comes into surface contact with the region of the second cavity formation green sheet disposed immediately thereon, which region constitutes the periphery of the cavity, thereby restricting the shrinkage of the second cavity formation green sheet and the cavity formation green sheet laminated thereon in the in-plane direction at the contact surface. Thus, since the stress exerted on the conductive pattern is dispersed, disconnection of the conductive pattern on the cavity bottom is suppressed.

The residuals of the shrinkage suppression green sheet, shrinkage suppression green sheet piece and embedded green sheet are removed from the fired multilayer body to obtain a multilayer ceramic substrate in which the wall surface of the through hole of the first cavity formation ceramic layer laminated immediately on the bottom formation ceramic layer is disposed outside the wall surface of the through hole of the second cavity formation ceramic layer, in at least the portion where the conductive pattern and the cavity bottom periphery overlap. In the multilayer ceramic substrate, disconnection of the conductive pattern formed on the cavity bottom is prevented.

In the multilayer ceramic substrate of the second configuration, the cavity bottom includes all surfaces existing in the direction of the cavity depth. When the cavity forms a multistage, for example, the cavity bottom includes the bottom existing at the deepest position and the surfaces of steps existing at shallower positions. While the embedded green sheet has to be separate from the cavity formation green sheets, the separation in this case means both that the cut pierces the cavity formation green sheet in its depth direction and that the cut does not piece it. Furthermore, the outside used in the present invention indicates the outside of the cavity of the multilayer ceramic substrate when seen from the top.

It is effective for solving the problem of disconnection to form on at least the surface of the conductive pattern of the portions corresponding to the periphery of the cavity bottom a softening layer that gets soft at the firing temperature in the firing step. This is prescribed in the multilayer ceramic substrate of the third configuration of the present invention, which is produced through firing of a plurality of substrate green sheets laminated, having a cavity with an opening and comprises a plurality of ceramic layers including a cavity bottom formation ceramic layer that constitutes a bottom of the cavity and integrally laminated, a conductive pattern formed on the cavity bottom formation ceramic layer as straddling a periphery of the cavity bottom and a softening layer that gets soft at a firing temperature of the firing and is provided at least on a surface of the conductive pattern of a portion corresponding to the periphery of the bottom on the cavity bottom formation ceramic layer.

A production method for producing the multilayer ceramic substrate of the third configuration further comprises, in addition to the steps in the previous configuration, the steps of forming a conductive pattern on the substrate green sheet constituting the bottom of the cavity as straddling a periphery of the cavity bottom and a softening layer that gets soft at a firing temperature of the firing and is provided at least on a surface of the conductive pattern of a portion corresponding to the periphery of the bottom on the cavity bottom formation ceramic layer, before the pressing step, laminating the cavity formation green sheet having the shrinkage suppression green sheet embedded in the through hole immediately on the substrate formation green sheet constituting the cavity bottom so that the cavity bottom and the shrinkage suppression green sheet piece overlap and laminating a cavity formation green sheet so that the embedded green sheet separate from each cavity formation green sheet as being filled in the cavity is disposed on the shrinkage suppressing green sheet piece and, after the firing step, removing the embedded green sheet fired.

Also, in the multilayer ceramic substrate of the third configuration, since the non-shrinkage firing process is performed, with the shrinkage suppression green sheet piece disposed also on the substrate green sheet exposed to the cavity bottom, the dimensional accuracy is secured, and the flatness of the cavity bottom is also satisfactorily secured. At the same time, since the multilayer body is pressed, with the embedded green sheet disposed in the cavity, the pressing step is easy to perform with a flat mold die in the same manner as in the case of pressing a multilayer body having no cavity, and there is no possibility of deformation including cavity opening collapse and bulge of the periphery of the cavity opening.

Furthermore, since the softening layer is interposed between the conductive pattern and the lower end of the sidewall of the cavity, when the cavity formation green sheet constituting the lower end of the sidewall of the cavity shrinks in the direction apart from the center of the cavity in the firing step, the lower end of the sidewall of the cavity is moved as being slid on the surface of the softening layer getting soft. For this reason, the concentration of stress in the conductive pattern resulting from the shrinkage of the cavity formation green sheet in the in-plane direction is alleviated by means of the softening layer to suppress disconnection of the conductive pattern on the cavity bottom.

The residuals of the shrinkage suppression green sheet, shrinkage suppression green sheet piece and embedded green sheet are removed from the fired multilayer body to obtain a multilayer ceramic substrate having the softening layer on at least the conducting pattern of the portions corresponding to the periphery of the cavity and giving rise to no disconnection of the conductive pattern on the cavity bottom.

Incidentally, also in the multilayer ceramic substrate of the third configuration, the cavity bottom includes all surfaces existing in the direction of the cavity depth. When the cavity forms a multistage, for example, the cavity bottom includes the bottom existing at the deepest position and the surfaces of steps existing at shallower positions. While the embedded green sheet has to be separate from the cavity sidewall formation green sheets, the separation in this case means both that the cut pierces the cavity formation green sheet in its depth direction and that the cut does not piece it.

According to the production method of the present invention, it is possible to produce a multilayer ceramic substrate having a cavity excellent in dimensional accuracy and flatness without any deformation including cavity opening collapse and bulge around the cavity opening. Also in the production method of the present invention does not require either adoption of a boring process after sintering or use of special equipment for the boring process, thus making it possible to produce the multilayer ceramic substrate with ease and at low cost.

Even when the multilayer ceramic substrate having an electronic device accommodated in the cavity and sealed with a resin, for example, has undergone thermal stress a great number of times over a long period of time, the resin would not exfoliate and fall off. Thus, it is possible to materialize a multilayer ceramic substrate with high reliability.

Moreover, according to the multilayer ceramic substrates and the production methods thereof having the second and third configurations, in addition to the aforementioned effects, it is possible to provide multilayer ceramic substrates elimination disconnection of the conductive pattern resulting from the shrinkage of the region around the cavity in the in-plane direction.

The above and other objects, characteristic features and advantages of the present invention will become apparent to those skilled in the art from the description to be made herein below with reference to the accompanying drawings.

BRIEF DESCRIPTION OF THE DRAWINGS

FIG. 1 is a schematic cross section of the principal part showing one example of a multilayer ceramic substrate to be produced.

FIG. 2 is a flowchart showing the production process in the first embodiment of the present invention.

FIG. 3(a) is a schematic side view of a ceramic green sheet and FIG. 3(b) a schematic side view of a shrinkage suppression green sheet.

FIG. 4(a) is a schematic plan view of a first composite green sheet and FIG. 4(b) a schematic plan view of a composite green sheet forming an outermost layer.

FIG. 5 is a schematic plan view of a cut formation sheet.

FIG. 6 is a schematic cross section of the principal part showing the production process for the multilayer ceramic substrate in the first embodiment, FIG. 6(a) showing a laminating step, FIG. 6(b) a firing step, FIG. 6(c) a cavity formation step and FIG. 6(d) a shrinkage suppression sheet removal step.

FIG. 7 is a schematic cross section showing the state in which an electronic device is mounted on the multilayer ceramic substrate produced in the first embodiment.

FIG. 8 is a typical view showing one example of the shape of the cavity of a multilayer ceramic substrate.

FIG. 9 is a schematic view showing the state in which the electronic device is sealed with a resin.

FIG. 10(a) is a schematic plan view showing a second composite green sheet produced in the second embodiment of the present invention and FIG. 10(b) a schematic plan view of a second cut formation sheet.

FIG. 11 is a schematic cross section of the principal part showing an example of the production process of a multilayer ceramic substrate having a cavity of a two-step structure in the second embodiment, FIG. 11(a) showing a laminating step, FIG. 11(b) a firing step and FIG. 11(c) a multilayer ceramic substrate.

FIG. 12 is a schematic cross section showing the state in which an electronic device is mounted onto the multilayer ceramic substrate produced in the second embodiment.

FIG. 13 is a typical view showing one example of the cavity shape of a multilayer ceramic substrate having a multistage cavity.

FIG. 14 is a typical view showing another example of the cavity shape of a multilayer ceramic substrate having a multistage cavity.

FIG. 15 is a schematic cross section of the principal part showing the deformation of a cavity bottom portion of a multilayer ceramic substrate.

FIG. 16 is a schematic cross section of the principal part showing an example of the configuration of a multilayer body according to the third embodiment of the present invention.

FIG. 17 is schematic cross section of the principal part showing another example of the configuration of a multilayer body according to the third embodiment.

FIG. 18 is a schematic cross section of the principal part showing the production process of a multilayer ceramic substrate according to the fourth embodiment of the present invention, FIG. 18(a) showing a laminating step, FIG. 18(b) a firing step, FIG. 18(c) a step of removing the fired embedded green sheet and FIG. 18(d) a completed multilayer ceramic substrate.

FIG. 19 is a schematic perspective view showing a step of applying a shrinkage suppression green sheet piece and a burnable sheet piece to a ceramic green sheet.

FIG. 20 is a schematic cross section of the principal part showing an example of the production process of a multilayer ceramic substrate having a cavity of a two-step structure according to the fifth embodiment of the present invention, FIG. 20(a) showing a laminating step, FIG. 20(b) a firing step and FIG. 20(c) a multilayer ceramic substrate.

FIG. 21(a) is a plan view of the principal part showing one example of a multilayer ceramic substrate according to the sixth embodiment of the present invention, FIG. 21(b) an enlarged plan view of the principal part in FIG. 21(a), FIG. 21(c) a cross section taken along line XXI(a)-XXI(a) and FIG. 21(d) an enlarged cross section of the principal part in FIG. 21(c).

FIG. 22 is a view showing in detail the cavity shape of the multilayer ceramic substrate shown in FIG. 21.

FIG. 23 is a schematic cross section showing the state in which an electronic device is sealed within the cavity with a resin.

FIG. 24(a) is a schematic side view of a ceramic green sheet and FIG. 24(b) a schematic side view of a shrinkage suppression green sheet.

FIG. 25(a) is a schematic plan view of a first composite green sheet and FIG. 25(b) a schematic plan view of a composite green sheet forming an outermost layer.

FIG. 26 is a schematic plan view of a cut formation sheet.

FIG. 27 is a schematic plan view of a cavity bottom formation green sheet.

FIG. 28 is a schematic cross section of the principal part of a production process of a multilayer ceramic substrate according to the sixth embodiment of the present invention, FIG. 28(a) showing a laminating step, FIG. 28(b) a firing step, FIG. 28(c) a cavity formation step and FIG. 28(d) a shrinkage suppression sheet removal step.

FIG. 29 is a schematic cross section of the principal part showing a laminating step in the production process of a multilayer ceramic substrate when a shrinkage suppression sheet piece and an embedded green sheet have substantially the same shape.

FIG. 30 is a schematic cross section showing the state in which an electronic device is mounted onto the multilayer ceramic substrate produced in the sixth embodiment.

FIG. 31 is a schematic plan view showing one example of a multilayer ceramic substrate according to the seventh embodiment of the present invention.

FIG. 32 is a schematic plan view showing another example of the multilayer ceramic substrate according to the seventh embodiment.

FIG. 33 is a schematic plan view showing still another example of the multilayer ceramic substrate according to the seventh embodiment.

FIG. 34 is a schematic cross section of the principal part showing one example of a multilayer ceramic substrate having a cavity of a multistage structure according to the eighth embodiment of the present invention.

FIG. 35 is a view showing one example of the cavity shape of a multilayer ceramic substrate having a multistage cavity.

FIG. 36 is a view showing another example of the cavity shape of a multilayer ceramic substrate having a multistage cavity.

FIG. 37(a) is a schematic plan view of a second composite green sheet produced in the eighth embodiment and FIG. 37(b) a schematic plan view of a second cut formation sheet.

FIG. 38 is a schematic plan view of a second cavity bottom formation green sheet.

FIG. 39 is a schematic cross section of the principal part showing an example of a production process of a multilayer ceramic substrate having a cavity of a two-step structure according to the eighth embodiment.

FIG. 40 is a schematic cross section showing the state in which an electronic device is mounted onto a multilayer ceramic substrate produced in the eighth embodiment.

FIG. 41 is a schematic cross section of the principal part showing the deformation of a cavity bottom portion of a multilayer ceramic substrate.

FIG. 42 is a schematic cross section of the principal part showing one example of a multilayer body according to the ninth embodiment of the present invention.

FIG. 43 is a schematic cross section of the principal part showing another example of the configuration of a multilayer body according to the ninth embodiment.

FIG. 44 is a schematic cross section of the principal part showing a production process of a multilayer ceramic substrate according to the tenth embodiment of the present invention, FIG. 44(a) showing a laminating step, FIG. 44(b) a firing step, FIG. 44(c) a step of removing the fired embedded green sheet and FIG. 44(d) a completed multilayer ceramic substrate.

FIG. 45 is a schematic perspective view showing a step of applying a ceramic green sheet piece and a burnable sheet piece to a ceramic green sheet.

FIG. 46 is a schematic cross section of the principal part of a production process of a multilayer ceramic substrate having a cavity of a two-step structure according to the eleventh embodiment of the present invention, FIG. 46(a) showing a laminating step, FIG. 46(b) a firing step and FIG. 46(c) a multilayer ceramic substrate.

FIG. 47(a) is a schematic plan view showing one example of a multilayer ceramic substrate according to the twelfth embodiment of the present invention. FIG. 47(b) is a sectional view of the main part of FIG. 47(a) taken along line XLVII(b)-XLVII(b) in FIG. 47(a).

FIG. 48 is a schematic cross section of the principal part showing a laminating step of the multilayer ceramic substrate according to the twelfth embodiment.

FIG. 49(a) is a schematic plan view showing one example of a multilayer ceramic substrate according to the thirteenth embodiment of the present invention, FIG. 49(b) an enlarged plan view of the principal part in FIG. 49(a), FIG. 49(c) a schematic cross section of the principal part taken along line XLIX(a)-XLIX(a) in FIG. 49(a) and FIG. 49(d) an enlarged cross section of the principal part in FIG. 49(c).

FIG. 50 is a view showing in detail the cavity shape of the multilayer ceramic substrate shown in FIG. 49.

FIG. 51 is a schematic cross section showing the state in which an electronic device is sealed within the cavity with a resin.

FIG. 52(a) is a schematic side view of a ceramic green sheet and FIG. 52(b) a schematic side view of a shrinkage suppression green sheet.

FIG. 53(a) is a schematic plan view of a first composite green sheet and FIG. 53(b) a schematic plan view of a composite green sheet forming an outermost layer.

FIG. 54 is a schematic plan view of a cut formation sheet.

FIG. 55 is a schematic plan view of a cavity bottom formation green sheet.

FIG. 56 is a schematic cross section of the principal part of a production process of a multilayer ceramic substrate according to the thirteenth embodiment of the present invention, FIG. 56(a) showing a laminating step, FIG. 56(b) a firing step, FIG. 56(c) a cavity formation step and FIG. 56(d) a shrinkage suppression sheet removal step.

FIG. 57 is a schematic cross section showing the state in which an electronic device is mounted onto the multilayer ceramic substrate produced in the thirteenth embodiment.

FIG. 58 is a schematic plan view showing one example of a multilayer ceramic substrate according to the fourteenth embodiment of the present invention.

FIG. 59 is a schematic plan view showing another example of the multilayer ceramic substrate according to the fourteenth embodiment.

FIG. 60 is a schematic cross section showing still another example of the multilayer ceramic substrate according to the fourteenth embodiment.

FIG. 61 is a schematic cross section showing one example of a multilayer ceramic substrate having a cavity of a multistage structure according to the fifteenth embodiment of the present invention.

FIG. 62 is a view showing one example of the cavity shape of the multilayer ceramic substrate having the cavity of the multistage structure.

FIG. 63 is a view showing another example of the cavity shape of the multilayer ceramic substrate having the cavity of the multistage structure.

FIG. 64(a) is a schematic plan view of a second composite green sheet produced in the fifteenth embodiment and FIG. 64(b) a schematic plan view of a second cut formation sheet.

FIG. 65 is a schematic plan view of a second cavity bottom formation green sheet.

FIG. 66 is a schematic cross section of the principal part showing the production process of the multilayer ceramic substrate produced in the fifteenth embodiment, FIG. 66(a) showing a laminating step and FIG. 66(b) a firing step.

FIG. 67 is a schematic cross section showing the state in which an electronic device is mounted onto the multilayer ceramic substrate produced in the fifteenth embodiment.

FIG. 68 is a schematic cross section of the principal part showing the deformation of the cavity bottom portion of the multilayer ceramic substrate.

FIG. 69 is a schematic cross section of the principal part showing one example of a multilayer body according to the sixteenth embodiment of the present invention.

FIG. 70 is a schematic cross section of the principal part showing another example of the configuration of the multilayer body according to the sixteenth embodiment.

FIG. 71 is a schematic cross section of the principal part showing a production process of a multilayer ceramic substrate according to the seventeenth embodiment of the present invention.

FIG. 72 is a schematic perspective view showing a step of applying a shrinkage suppression green sheet piece and a burnable sheet piece to a ceramic green sheet.

FIG. 73 is a schematic cross section of the principal part showing a production process of a multilayer ceramic substrate having a cavity of a two-step structure according to the eighteenth embodiment of the present invention, FIG. 73(a)

showing a laminating step, FIG. 73(b) a firing step and FIG. 73(c) a multilayer ceramic substrate.

FIG. 74 is a drawing-alternative picture showing a cavity shape of the multilayer ceramic substrate produced in Example 1.

FIG. 75 is a drawing-alternative picture showing a cavity shape of the multilayer ceramic substrate produced in Example 2.

DETAILED DESCRIPTION OF THE PREFERRED EMBODIMENTS

A production method of a multilayer ceramic substrate and a multilayer ceramic substrate produced by the production method and provided with a cavity of a specific shape according to the present invention will be described in detail herein below with reference to the accompanying drawings.

A multilayer ceramic substrate to be produced in the first embodiment will be described. It has a cavity (concave) for accommodating an electronic device or other such device.

FIG. 1 shows an example of the simplest model for a multilayer ceramic substrate 1 having a cavity. In this example, plural (nine here) ceramic layers 2 to 10 are laminated and made integral. Of these ceramic layers 2 to 10, two lower ceramic layers 2 and 3 are formed with no through hole for formation of a cavity and are flat ceramic layers. Of the two, the upper ceramic layer 3 has an upper surface 3a, part of which is exposed to a cavity to constitute the cavity bottom.

On the other hand, the remaining ceramic layers 4 to 10 laminated on the ceramic layer 3 are formed respectively with through holes corresponding to a cavity 11. These through holes are connected contiguously to form the cavity 11 as the prescribed space. The shape of the cavity opening is a square, for example, but may optionally be changed to a rectangle, an oval, etc. When a square or rectangular cavity is adopted, however, the angular corners thereof are preferably rounded into circular arcs. With this, otherwise generated stress can be alleviated, and otherwise formed cracks can be eliminated. When adopting the non-shrinkage firing process using a shrinkage suppression sheet with respect to the cavity with angular corners, the side walls of the cavity 11 are attracted outward to concentrate the stress in the angular corners, thereby possibly forming cracks. By rounding the angular corners into circular arcs, it is possible to alleviate the stress concentration and prevent the crack formation. The curvature radius R in the circular arc in this case is preferred to be 0.05 mm or more. It is more preferable to set the curvature radius R depending on the thickness of a shrinkage suppression sheet. It was experimentally confirmed that no crack was formed when the curvature radius was 0.1 mm or more relative to a 75 μm-thick shrinkage suppression sheet and when the curvature radius was 0.51 mm relative to a 250 μm-thick shrinkage suppression sheet. Though not shown in the drawings, provision of a conductive pattern for mounting an electronic device mounted thereon on the bottom of the cavity 11 is generally put into practice. There is a case where via holes for heat radiation are formed in the cavity bottom.

The multilayer ceramic substrate 1 having the cavity 11 is fabricated through a method comprising the steps of laminating plural green sheets, pressing the laminated sheets to form a multilayer body and firing the multilayer body. In order to secure the dimensional accuracy, it is necessary to suppress shrinkage during the firing step. This is still unsatisfactory and, it is further necessary to eliminate deformation including collapse of the opening of the cavity 11 and bulges around the opening of the cavity 11 that is made during the pressing step.

In view of the above, the present embodiment adopts the non-shrinkage firing process and performs the pressing and firing steps, with a sheet for being embedded (embedded sheet) disposed in the space corresponding to the cavity, to facilitate the elimination of collapse during the pressing step. A production method of the multilayer ceramic substrate of the present embodiment will be described.

A step flowchart of the production method of this embodiment is shown in FIG. 2. The production method fundamentally comprises a multilayer body formation step (S1), a firing step (S2) and a cavity formation step (S3). It may further comprise a shrinkage suppression sheet removal step (S4). The multilayer body formation step (S1) comprises a green sheet formation step (S11), a composite green sheet formation step (S12), a cut formation step (S13), a via hole formation step (S14), a conductor-printing step (S15), a laminating step (S16) and a pressing step (S17).

Each step will be described. To fabricate the multilayer ceramic substrate, the green sheet formation step (S11) that is the initial step in the multilayer body formation step (S1) is first performed. In the green sheet formation step (S11), a ceramic green sheet (corresponding to a green sheet for a substrate) 21 shown in a FIG. 3(a) and a shrinkage suppression green sheet 22 shown in FIG. 3(b) are formed. Each of the ceramic green sheet 21 and shrinkage suppression green sheet 22 are generally formed on a plastic sheet as a support 23 in the state of intimate contact with the surface of the plastic sheet. While the plastic sheet used as the support 23 is arbitral insofar as the surface thereof is flat and smooth. For example, a sheet of Polyethylene Telephthalate (PET) is preferably usable. The thickness of the support 23 is preferred to be not deformed during the step and be easy to handle. It is generally in the range of 50 to 150 μm.

As the production method of the ceramic green sheet 21, a method comprising mixing ceramic powder with an organic vehicle to prepare slurry (dielectric paste) and forming the slurry on the support 23 (resin sheet of PET) in the form of a film by a sheet formation method, such as the doctor blade method can be cited. When the multilayer ceramic substrate is intended to form a glass ceramic substrate, slurry having glass powder in addition to the ceramic power mixed therewith may be used.

Incidentally, the organic vehicle is a product having a binder dissolved in an organic solvent and is composed preponderantly of a solvent including terpineol, butylcarbitol, acetone, toluene, isopropyl alcohol, etc., a binder including ethylcellulose, polyvinyl butyral, etc. and a plasticizer including di-n-butylphthalate, etc. The content of the organic vehicle is not particularly limited, but an ordinary content comprises 1 to 5 mass % of a binder and 10 to 50 mass % of a solvent, for example.

The dielectric paste may be in the form of an organic paint containing the organic vehicle or a water-soluble paint having a water-soluble binder, dispersant, etc. dissolved in water. Here, the water-soluble binder is not particularly limited and may appropriately be selected from among polyvinyl alcohol, cellulose, water-soluble acrylic resin, emulsion, etc.

As described above, the dielectric paste contains ceramic powder constituted by a dielectric porcelain composition, the composition of which is arbitrarily determined. Therefore, in preparing the ceramic powder, raw materials (chief ingredients and accessory ingredients) are selected depending on the composition of the dielectric porcelain composition. In this case, modes of the chief ingredients and accessory ingredients that are the raw materials are not particularly limitative. As the chief ingredients and accessory ingredients that are the raw materials, oxides and compounds enabled by firing to be oxides can be used. As the compounds enabled by firing to be oxides, carbonates, nitrates, oxalates and organic metal compounds can be cited. Of course, an oxide and a compound enabled by firing to be an oxide may be used together. The contents of the ingredients in the raw materials may be determined so as to acquire the composition of the dielectric porcelain composition after the ingredients are fired. A ceramic powder production method is arbitrarily selected. Powder obtained from either the liquid-phase synthesis or the solid-phase method; for example, may be available.

When fabricating a glass ceramic substrate that is a Low Temperature Cofired Ceramic (LTCC) substrate, as described above, ceramic powder (ceramic ingredients) and glass powder (glass ingredients) are used together. At this time, these ceramic ingredients and glass ingredients may appropriately be selected based on the relative permittivity and firing temperature aimed at. To be specific, a combination of alumina enabled by firing at 1000° C. or less to be a glass ceramic substrate (ceramic ingredient: crystal phase) and silicon oxide (glass ingredient: glass phase) can be cited. Other ceramic ingredients include magnesia, spinel, silica, mulite, mullite, forsterite, steatite, cordierite, strontium, feldspar, quartz, zinc silicate, zirconia and titania. As the glass ingredient, borosilicate glass, barium borosilicate glass, strontium borosilicate glass, zinc borosilicate glass, potassium borosilicate glass can be cited. The glass ceramic substrate preferably comprises 60 to 80% by volume of the glass ingredient and 40 to 20% by volume of the ceramic ingredient that is an aggregate. When the glass ingredient falls outside the above range, a composite composition is difficult to form because the strength and sintering property are lowered.

While the shrinkage suppression green sheet 22 is produced fundamentally in the same manner as in the production method of the ceramic green sheet 21, the two sheets differ in ingredient. That is to say, the shrinkage suppression green sheet 22 is formed of a shrinkage suppression material difficult to shrink at the temperature at which the ceramic green sheet is fired and is a green sheet having its shrinkage suppressed. As the shrinkage suppression material, a composition containing at least one species of quartz, cristobalite and tridymite is usable. Otherwise, a composition containing alumina is available.

Since no part or only part of these shrinkage suppression materials is sintered at the firing temperature of the ceramic and glass ingredients contained in the ceramic green sheet 21, the materials do not initiate shrinking at the firing temperature of the ceramic green sheet 21. Therefore, when the shrinkage suppression green sheet 22 formed of the shrinkage suppressing material is laminated on the ceramic green sheet 21 in an intimate contact state, it functions to suppress shrinkage of the ceramic green sheet 21 in the plane surface direction during the course of firing.

Incidentally, in forming the shrinkage suppression green sheet 22, the shrinkage suppression material (composition containing at least one species of quartz, cristobalite and tridymite) may be added with sintering aids. Also in this case, the same effect can be obtained. Though the sintering aids are sintered at the firing temperature of the ceramic or glass ingredient, since the thermal expansion coefficients of quartz, cristobalite and tridymite that are the shrinkage suppression materials are 20 ppm/° C., 50 ppm/° C. and 40 ppm/° C., respectively, that are larger than that of the ceramic or glass ingredient, even when the sintering aids have shrunk after firing, the dimensional changes before and after the firing are cancelled each other to make it possible to suppress the ceramic green sheet from shrinking.

As the sintering aids to be used, oxides being softened or forming a liquid phase at the sintering initiating temperature of the ceramic or glass ingredient or less can be cited. In the former oxides, the soften sintering aids allow grains of the shrinkage suppression material to be joined and are consequently sintered. In the latter oxides, the produced liquid phase allows the grains surfaces of the shrinkage suppression material to react with each other, resulting in the grains being joined and are consequently sintered. While the oxides to be used as the sintering aids are not particularly limited, examples thereof include aluminum lead silicate glass, alkali lead silicate glass, alkaline earth lead silicate glass, lead borosilicate glass, alkali borosilicate glass, alkaline earth lead aluminum borate glass, aluminum lead borate glass, alkaline earth lead borate glass and zinc lead borate glass. One or more of these may be selected and used.

Alkali metal compounds can also be used as the sintering aids. The alkali metal compounds have an effect of facilitating the progress of sintering $SiO_2$. Accordingly, when adding an alkali metal compound to a composition containing at least one species of quartz, cristobalite and tridymite, the shrinkage suppression green sheet 22 is slightly sintered with the sintering of the ceramic green sheet 21. While the alkali metal compounds are not particularly limited, lithium carbonate, potassium carbonate, sodium carbonate, lithium oxide and potassium oxide, for example, can be cited.

Furthermore, as the material used for the shrinkage suppression green sheet 22, a composition containing tridymite and an oxide difficult to sinter can also be used. The tridymite is a material enabling the sintering temperature to be variously changed depending on the selection of a composition. However, the thermal expansion coefficient of tridymite is large and reaches 40 ppm/° C. depending on the temperature. For this reason, there is a possibility of tridymite exfoliating before the ceramic green sheet 21 being sintered due to an unduly difference in thermal expansion coefficient from the ceramic green sheet 21 (about 3 to 10 ppm/° C.), for example. In order to prevent this from occurring, therefore, an oxide not sintered at the firing temperature of the ceramic green sheet 21 is added to the tridymite to adjust the thermal expansion coefficient, thereby suppressing the composition from exfoliating before the ceramic green sheet 21 being sintered. While the oxides not sintered during the course of firing of the ceramic green sheet 21 are not particularly limited, quartz, molten quartz, alumina, mullite and zirconia, for example, can be cited.

The ceramic green sheet 21 and shrinkage suppression green sheet 22 are fabricated as described above. The thickness of each sheet is preferably in the range of around 20 μm to 300 μm in consideration of formation of a via electrode and an internal electrode described later.

In a composite green sheet formation step (S12) after the fabrication of the ceramic green sheet 21 and shrinkage suppression green sheet 22, a composite green sheet (green sheet combining the ceramic green sheet with the shrinkage suppression green sheet) is fabricated utilizing the description described above. The composite green sheet fabricated here comprises a first composite green sheet laminated immediately on the substrate green sheet (ceramic green sheet) constituting the cavity bottom and an uppermost composite green sheet laminated as an uppermost composite shrinkage suppression green sheet.

A first composite green sheet 26 shown in FIG. 4(a) is produced. First, the ceramic green sheet 21 produced in the green sheet formation step (S11) is formed with a first through hole 24. The first through hole 24 may be formed by punching out a predetermined portion of the ceramic green sheet 21, with the ceramic green sheet in intimate contact with the surface of a support 23, with a die of a puncher or using a laser beam or with a microdrill or by punching. The first through hole is formed to correspond to the shape of the cavity, and the shape thereof is not particularly restricted, but may be square, rectangular or circular.

The shrinkage suppression sheet 22 produced in the green sheet formation step (S11) is placed on a support 23 and cut into the same shape as the first through hole to obtain a first fitting sheet 25 (corresponding to the shrinkage suppression green sheet piece). The cut first fitting sheet 25 is fitted in the first through hole 24 to form a first composite green sheet 26. At this time, in order to make the first composite green sheet 26 flat, preferably, the thickness of the ceramic green sheet 21 is the same as that of the first fitting sheet 25.

An uppermost composite green sheet 29 is produced in accordance with the same production method as that of the first composite green sheet 26. In the uppermost composite green sheet 29, as shown in FIG. 4(b), the shrinkage suppression green sheet 22 is formed with a through hole in which a ceramic green sheet piece is fitted. To be specific, the shrinkage suppression green sheet produced in the green sheet formation step (S11) is formed with a second through hole 27 corresponding to the opening of the cavity. The production method of the second through hole 27 is the same as that of the first through hole 24. The ceramic green sheet 21 produced in the green sheet formation step (S11) is placed on a support 23 and cut into the same shape as the second through hole 27 to obtain a second fitting sheet 28. The cut second fitting sheet 28 is fitted in the second through hole 27, and the resultant composite sheet is allowed to exfoliate from the support 23 to form an uppermost composite green sheet 29. Also in this case, in order to make the uppermost composite green sheet 29 flat, preferably, the thickness of the shrinkage suppression green sheet 22 is the same as that of the second fitting sheet 28.

In the cut formation step (S13), the ceramic green sheet 21 is formed with a cut to be used as a cavity formation green sheet. Specifically, in the cut formation step (S13), the ceramic green sheet 21 produced in the green sheet formation step (S11) is formed with a cut (or a discontinuous portion) 31 to form a cut formation sheet 30 as shown in FIG. 5. The cut 31 indicates the discontinuous portion pierced in the direction of the thickness of the ceramic green sheet 21. Incidentally, the discontinuous portion includes what is not pierced in the sheet width direction. The cut 31 is formed at the same position and in the same shape as the first through hole 24 to overlap the first through hole 24 when the cut formation sheet 30 overlaps the previously produced first composite green sheet 26. The cut 31 may be formed by punching out a predetermined portion of the ceramic green sheet 21, with the ceramic green sheet 21 in intimate contact with the surface of the support 23, with a die of a puncher or using a laser beam or with a microdrill or by punching.

In the cut formation step (S13), the cut may be inserted into the ceramic green sheets 21 one by one or together in a lump. In either case, in the cut formation sheets 30, the portions 30a separated by the cuts 31 are left intact and utilized as embedded green sheets in the laminating and firing steps.

The first composite green sheet 26, cut formation sheets 30 and ceramic green sheet constituting the bottom of the cavity that are ceramic green sheet constituting the ceramic layers of a multilayer ceramic substrate after being fired (hereinafter referred to collectively as "dielectric layer sheets") are provided with a via hole, via electrode, internal electrode pattern, etc.

In the via hole formation step (S14), for example, a via hole for forming a via electrode therein is formed using a laser beam or a microdrill or by punching. When the dielectric layer sheet is irradiated with a laser beam, the ceramic powder and binder resin are sublimed to form a hole. The laser to be used advantageously is a short-wavelength UV-YAG laser or excimer laser. Use of a laser beam enables the diameter of the via hole to be 100 µm or less with ease. On the other hand, while it is difficult to make the diameter of the via hole small with a microdrill or by punching, compared with the use of a laser beam, there is a merit in that the processing can be performed at low cost. At any rate, conductor paste is filled in the via hole thus formed by these techniques to form a minute via electrode with high precision.

In the conductor-printing step (S15), conductor paste is filled in the via hole formed in the via hole formation step (S14) to form a via electrode. The conductor paste contains metal or alloy powder of copper, silver, silver-palladium, palladium, nickel, etc. and is adjusted to have viscosity having prescribed flowability. Also in the conductor-printing step (S15), an internal electrode pattern is printed on the surface of the dielectric layer sheet in a prescribed pattern. Paste for the internal pattern, similarly to the conductive paste, contains metal or alloy powder of copper, silver, silver-palladium, palladium, nickel, etc. and is adjusted to have viscosity having prescribed flowability. The internal electrode paste and via electrode paste may be formed of different materials.

Since the material constituting the dielectric layer sheet has a reduction resistant property and since inexpensive base metal can be used as the conductive material, nickel or nickel alloy may be used as the conductive material. As the nickel alloy, alloy of nickel and one or more elements selected from the group consisting of manganese, chromium, cobalt and aluminum is preferred. The content of nickel in the alloy is preferably 95 mass % or more. The via electrode and internal electrode pattern may contain minute various ingredients, such as phosphorus (P), in an amount of around 0.1 mass % or less. The thickness of the internal electrode pattern is appropriately determined depending on the application thereof and is preferably around 1 µm to 15 µm, more preferably around 2.5 µm to 10 µm.

The via electrode paste or internal electrode paste is produced through kneading with a vehicle similar to that of the conductive paste. The content of the vehicle in the via electrode paste or internal electrode paste is adjusted similarly in the case of the conductive paste. The via electrode paste or internal electrode paste may be added with additives, such as dispersants, plasticizers, dielectric materials, insulating materials, etc. as occasion demands. The amount of the additives is preferred to be 10 mass % or less in total.

Subsequently, the via electrode paste or internal electrode paste is printed on the dielectric layer sheet to form a via electrode or internal electrode pattern. The via electrode paste is filled and solidified by the stopgap printing, for example, to form a via electrode. The internal electrode paste is applied onto the ceramic green sheet, for example, in a prescribed pattern by the screen printing to form an internal electrode pattern.

After the via electrode or internal electrode pattern is formed on each dielectric layer sheet, the thus fabricated sheets are laminated in the laminating step (S16) to form a multilayer body 32. The configuration of the multilayer body 32 from the laminating step (S16) to the shrinkage suppression sheet removal step (S4) is shown in FIG. 6(a) to FIG. 6(d). Incidentally, the step shown in FIG. 6(c) and the step shown in FIG. 6(d) may be performed inversely or simultaneously.

In the laminating step (S16), as shown in FIG. 6(a), a shrinkage suppression green sheet 22, ceramic green sheet 21, first composite green sheet 26, cut formation sheet 30 and uppermost composite green sheet 29 are laminated in the order mentioned from the lowermost layer. The number of each sheet may be singular or plural. In the example shown, laminated on the lowermost sheet are two ceramic green sheets 21 on which a first composite green sheet 26 and six cut formation sheets 30 are laminated to configure a multilayer body 32. Therefore, the nine layers constitute the substrate green sheet, and the first composite green sheet 26 and six cut formation sheets 30 constitute the cavity formation green sheet. The configuration of the multilayer body 32 may be an upside-down configuration or a configuration having the same configuration added across the shrinkage suppression green sheet 22.

When laminating two or more cut formation sheets 30, for example, these may be formed of the same material or differ materials. In the latter case, however, they are preferred to be substantially the same in compressibility at the time of pressing and in degree of shrinkage and thermal expansion coefficient at the time of firing. By so doing, warp of the substrate resulting from the difference in compressibility, degree of shrinkage and thermal expansion coefficient of the cut formation sheets 30 can be suppressed.

The thickness of the multilayer body 32 thus obtained by the lamination is preferred to be 1 mm or less on demand for making the size and height of a multilayer ceramic substrate small. The lamination height of the cavity formation sheets (six cut formation sheets 10 and first composite green sheet 26) of the multilayer body 32 constituting the cavity is set in conformity to the size of an electronic device to be accommodated in the cavity.

After the laminating step (S16), the pressing step (S17) is performed. The pressing step (S17) is a press-on step for the multilayer body 32 produced in the laminating step (S16). The press-on step is performed, with the multilayer body placed in a die having upper and lower flat punches. The preferable conditions of the press-on step include a pressure of 30 to 80 MPa and a period of around 10 minutes. In the present embodiment, since the uppermost and lowermost layers of the multilayer body 32 are flat and further since the portion 31a separated by the cut 31 is left intact in the portion where the cavity is formed, pressure in the pressing step can be applied uniformly. Therefore, there is no case where the opening of the cavity is deformed by collapse or damaged by the pressure applied as in the prior art.

The firing step (S2) is then performed, in which the multilayer body 32 pressed on in the pressing step (S17) is fired. The multilayer body 32 is subjected to debinder treatment before the firing step. The conditions of the debinder treatment may be generally adopted ones. The firing step is then performed to form a fired multilayer body 34. The atmosphere in the firing step is not particularly restricted. When a base metal, such as nickel or nickel alloy, is used for the via electrode and internal electrode pattern, the atmosphere is preferred to be a reduction atmosphere. The firing temperature is preferred to be in the range of 800° C. to 1000° C. As a consequence, the conductive material and resistance material can be fired at the same time, and the multilayer ceramic substrate subsequently obtained can be used for LTCC modules including high-frequency superposed modules, antenna switch modules, filter modules, etc.

In the fired multilayer body 34 having undergone the firing step (S2), as shown in FIG. 6(b), the portion 30a of the cut formation sheet 30 inside the cut 31 projects from the cavity. The reason therefor is as follows. When the multilayer body 32 is fired, the ceramic green sheet and the first composite green sheet 26 that are the dielectric layer sheet and the cut formation sheet 30 are sintered and intended to shrink. At this time, the ceramic green sheet 21 is in intimate contact with the lower shrinkage suppression green sheet 22. Since the shrinkage suppression green sheet does not shrink at the firing temperature of the dielectric layer sheet, as described earlier, the shrinkage of the ceramic green sheet 21 in the plane surface direction is suppressed. Since the portion 30b of the cut formation sheet 30 outside the cut 31 is in intimate contact with the uppermost composite green sheet 29, the shrinkage thereof is also suppressed. In addition, since the ceramic green sheet 21 is in intimate contact with the first fitting sheet 25 of the first composite green sheet 26, the shrinkage thereof is similarly suppressed.

On the other hand, the portion 30a of the cut formation sheet 30 inside the cut 31 is not provided on the upper side thereof with a shrinkage suppression sheet, the shrinkage thereof is not suppressed. Thus, the inside portion 30a of the cut 31 is shrunk in the plane surface direction to separate from the outside portion 30b of the cut 31. The degree of this shrinkage is larger toward the upper layer from the first fitting sheet 25 on the bottom of the cavity, and the degree of shrinkage in the thickness direction is made smaller by the amount of the inside portion 30a of the cut 31 shrunk in the plane surface direction. Therefore, the first fitting sheet 25, second fitting sheet 28 and the portion sandwiched between the two sheets (inside portion 30a of the cut 31) after being fired project from the surface of the fired multilayer body 34.

As described above, the first fitting sheet 25, second fitting sheet 28 and the portion sandwiched between the two sheets (inside portion 30a of the cut 31) are brought to the state of shrinkage different from that of the portion 30b of the ceramic green sheet 21 and cut formation sheet 30 outside the cut 31. For example, the portion 30a of the cut formation sheet 30 inside the cut 31 is completely separated from the outside portion 30b. Also at the cavity bottom, the first fitting 25 is made fragile by the firing and the binding force at this portion becomes weak. Therefore, the first fitting sheet 25, second fitting sheet 28 and the portion sandwiched between the two sheets (inside portion 30a of the cut 31) filled in the cavity are enabled to fall off with a slight stimulus to form the cavity 11. Even in the case of the cavity having a complicated shape, the inside portion 30a of the cut 31 is enabled to fall off. In order to cause the inside portion 30a of the cut 31 to fall off, a small force may be exerted onto it.

Specifically, as shown in FIG. 6(c), the first fitting sheet 25, second fitting sheet 28 and the portion sandwiched between the two sheets (inside portion 30a of the cut 31) are removed to form the cavity and, at the same time, the shrinkage compression sheet removal step (S4) is performed when necessary. In the step (S4), the uppermost sheet 35 and the lowermost sheet 36 of the fired multilayer body 34 (shrinkage compression green sheet 22 and uppermost composite green sheet 29 that have been fired) are removed through ordinary ultrasonic washing in a solvent or wet blasting. The wet blasting is a method comprising accelerating a liquid having an abrasive mixed in water with compressed air from a compressor and blowing the water against a substance to be processed to thereby perform both washing and surface treatment simultaneously. When the shrinkage suppression green sheet 22 is formed of a tridymite-silica-based material or cristobalite-silica-based material, since the major parts of the uppermost sheet 35 and lowermost sheet 36 after the firing exfoliate spontaneously, washing of the slightly remaining part will suffice.

Besides the steps described above, a cutting step, a polishing step, etc. are performed as occasion demands to obtain the multilayer ceramic substrate 1 shown in FIG. 1. The cutting step includes division with a diamond scriber and, when the fired multilayer body is thick, cutting by a dicing system. The polishing step is performed through the lapping process. The lapping process is a processing method for buffing the object to be processed using a processed liquid containing abrasive coating, with abrasive coating not contained in a rotary bed. Use of a wet barrel is also available.

An electronic device 40 is mounted on the multilayer ceramic substrate 1 produced. The state of the electronic device 40 mounted on the substrate is shown in FIG. 7. As shown in FIG. 7, the electronic device 40 is accommodated in the cavity 11 of the multilayer ceramic substrate 1. The electronic device 40 is connected to electrodes (not shown) formed on the multilayer ceramic substrate 1 with bonding wires 41. The electrodes include surface electrodes and via electrodes printed on the surface of the multilayer ceramic substrate 1 and internal electrodes printed inside the multilayer ceramic substrate 1. The multilayer ceramic substrate 1 thus fabricated by the method of the present embodiment permits accommodation of an electronic device therein and satisfies the demand of making the substrate small in size and height.

In the multilayer ceramic substrate fabricated by the production method described above, the cavity has a specific shape having superiority in the property of sealing with a resin to the shape of the cavity of the prior art multilayer ceramic substrates. The shape of the cavity of the multilayer ceramic substrate fabricate will be described hereinafter.

The multilayer ceramic substrate 1 fabricated by the method according to the first embodiment comprises plural (nine here) ceramic layers 2 to 10 laminated and made integral. Of these ceramic layers 2 to 10, two lower layers 2 and 3 are formed with no through hole for formation of a cavity and are flat ceramic layers. Of the two, the upper ceramic layer 3 has an upper surface 3a, part of which is exposed to a cavity lower portion to constitute the cavity bottom. The remaining ceramic layers 4 to 10 laminated on the ceramic layer 3 are formed respectively with through holes corresponding to a cavity. These through holes are connected contiguously to form the cavity 11 as the prescribed space.

As already described in the production method, in fabricating the multilayer ceramic substrate 1, the firing step is conducted while the first fitting sheet 25, the uppermost layer of composite green sheet 29 and shrinkage suppression green sheet 22 afford a binding force to the substrate green sheet to suppress the shrinkage in the in-plane direction. In this case, since the opposite ends of the multilayer body are bound by means of the shrinkage suppression green sheets during the step of firing, the substrate green sheet after the step of firing is shrunk only in the width direction and would not be shrunk in the surface direction.

When observing it in detail, however, while no virtually discernible shrinkage of the substrate green sheet immediately close to the shrinkage suppression green sheets (first fitting sheet 25, uppermost layer of composite green sheet 29 and shrinkage suppression green sheet 22) in the surface direction is recognized, it can be recognized that the substrate green sheet shrinks only slightly in the surface direction with an increasing distance from the shrinkage suppression green sheets. The surface direction shrinkage increases with increasing distance from the shrinkage suppression green sheets. For this, when observing the shape of the cavity 11 in detail, as typically shown in FIG. 8, the cavity has a larger opening diameter at the inside than at the opening immediately close to the shrinkage suppression green sheets, like a drum-shaped cavity.

The description on this point will be given in more detail. In the cavity 11, the opening dimension W1 at an opening 11a is smaller than the opening dimension W2 at a position 11b midway in the depth direction of the cavity 11. In other words, the opening area at the opening 11a of the cavity 11 is smaller than the opening area at the position 11b midway in the depth direction of the cavity 11. In this example, the opening area of the cavity 11 is gradually increased up to the position 11b midway in the depth direction of the cavity and then gradually decreased up to the cavity bottom and, thus, the inner wall of the cavity 11 assumes a substantially circular arc in cross section. Thus, the portion of the cavity midway in the depth direction is bulged out to shape a drum-shaped cavity.

The multilayer ceramic substrate 1 having the cavity 11 of the shape mentioned above, owing to the specific shape, has a significant merit in terms of reliability. As shown in FIG. 9, for example, when the electronic device 40 is mounted within the cavity 11 and sealed with a resin 100, the opening dimension at the opening 11a of the cavity is smaller than that of the cavity inside, the resin filled in the cavity will not fall off at all. As described earlier, in the seal with the resin 100, the problem will arise in that the resin sealed exfoliates and falls off, resulting from the difference in thermal expansion coefficient between the ceramic sheets 2 to 10 constituting the multilayer ceramic substrate 1 and the resin 100 used for the seal. This problem becomes conspicuous particularly when a temperature change is repeated over a long period of time. In the multilayer ceramic substrate 1, since the opening area at the opening 11a of the cavity 11 is smaller than the opening area of the portion at the position 11b midway in the depth direction of the cavity 11, the resin filled and hardened in the cavity cannot pass through because of the larger area of the inside of the cavity and is retained within the cavity.

The multilayer ceramic substrate 1 having the cavity 11 of the specific shape has not yet been materialized. This substrate 1 can be formed through the fact that the firing step is conducted, with the substrate green sheet bound by means of the first fitting sheet 25, uppermost composite green sheet 29 and shrinkage suppression green sheet 22 and the fact that the portion 31 separated by the cut 31 are left intact, in the portion where the cavity is to be formed, in the form of an embedded green sheet when forming a multilayer body before being fired so that pressure may be exerted uniformly in the pressing step. Though the detailed reasons for this is not explicitly ascertained, it has experimentally been confirmed that the shape of the cavity cannot be obtained only through the binding force by the shrinkage suppression green sheets, but has been materialized for the first time through the method of the present invention.

The second embodiment of the present invention will now be described. The difference thereof from the first embodiment is to form the cavity into a multistage cavity (two-step cavity with two bottoms in this case). To be specific, the different points in step are to dispose a first composite green sheet on the deepest bottom of the cavity, dispose a second composite green sheet on the second bottom (step surface) and laminate the cut formation sheets having through holes different in size from each other.

In the present embodiment, a second composite green sheet 43 shown in FIG. 10(a) is formed in the composite green sheet formation step (S12). In producing the second composite green sheet 43, the ceramic green sheet 21 produced in the green sheet formation step (S11) is formed with a third through hole 44 that overlaps the first through hole 24 and is larger than the first through hole 24. The formation method of the third through hole 44 is the same as the formation method of the first through hole 24.

The shrinkage suppression green sheet 22 produced in the green sheet formation step (S11) is cut into the same shape as the third through hole 44 to form a third fitting sheet 45, which is fitted in the third through hole 44. In addition, the third fitting sheet 45 fitted is formed with a fourth through hole 46 formed at the same position as the first through hole 24 to have substantially the same shape as the first through hole, in which fourth through hole the second fitting sheet 28 obtained by cutting the ceramic green sheet 21 into substantially the same shape as the fourth through hole is fitted. A second composite green sheet 43 is thus produced. In producing the second composite green sheet 43, a reverse procedure of first fitting the second fitting sheet 28 in the fourth through hole 46 and then fitting the third fitting sheet 45 in the third through hole 44 may be adopted.

In the present embodiment, as shown in FIG. 10(b), a cut formation sheet (second cut formation sheet 47) different from the cut formation sheet 30 in the first embodiment is formed in the cut formation step (S13). The difference of the second cut formation sheet 47 and the previous cut formation sheet 30 is the size of a cut 48 that is larger than that of the cut 31. To be specific, the cut 48 in the second cut formation sheet 47 is formed at the same position as the third through hole 44 of the second composite green sheet 43 to have substantially the same shape as the third through hole 44.

An example of a multilayer body 49 having the sheets laminated in the present embodiment is shown in FIG. 11(a). The sheets are laminated in order from below. That is to say, the shrinkage suppression green sheet 22, ceramic green sheet 21, first composite green sheet 26, cut formation sheet 30, second composite green sheet 43, second cut formation sheet 47 and uppermost composite green sheet 29 are laminated in the order mentioned from the lowermost layer. In this example, the number of each of the shrinkage suppression green sheet 22, first composite green sheet 26, second composite green sheet 43 and uppermost composite green sheet 29 to be laminated is one. Of course, plural number of each of these sheets may be laminated. The number of each of the ceramic green sheet 21, cut formation sheet 30 and second cut formation sheet 47 is determined depending on the interlayer electrode pattern configuration required for the multilayer ceramic substrate and the size of an electronic device mounted on the inside of the substrate and is generally two or more. In this example, two ceramic green sheets 21, six cut formation sheets 30 and four second cut formation sheets 47 are laminated. Of course, the number of each of these sheets is not restricted to this example, but is optional. The multilayer body 49 may also be formed with another cavity on the side of the shrinkage suppression green sheet 22, for example, besides the cavity shown in FIG. 11(a).

When the multilayer body 49 has been fired, as shown in FIG. 11(b), the portion 49a embedded in the cavity is shrunk in the surface direction to project from the cavity. The portion is removed in the same manner as in the first embodiment and, when necessary, the shrinkage suppression sheet removal step (S4) is performed to complete a multilayer ceramic substrate 50 having a two-step cavity 51 with two bottoms as shown in FIG. 11(c).

An example in which an electronic device 40 is mounted on the multilayer ceramic substrate 50 having the two-step cavity with two bottoms is shown in FIG. 12. As shown in FIG. 12, the electronic device 40 is accommodated in a lower cavity portion 51a. The electronic device 40 is connected to the electrodes on the bottom of an upper cavity portion 51b with bonding wires 41. In this way, the multilayer ceramic substrate 50 fabricated by the production method of the second embodiment enables both the electronic device 40 and the bonding wires 41 to be accommodated in the inside thereof. Thus, the bonding wires and the like do not protrude from the surface of the multilayer ceramic substrate. Also in a multilayer ceramic substrate provided therein with a plurality of dielectric layers, an electronic device can be mounted at high density to satisfy the demand of making the size and height small.

By making use of the production method of a multilayer ceramic substrate according to the present embodiment, a multilayer ceramic substrate having a three or more step cavity with three or more bottoms can be fabricated. In the multilayer body formation step, for example, between the uppermost composite green sheet and the ceramic green sheet provided at the same position as the second through hole with a cut of substantially the same shape as the second through hole or with a discontinuous portion, at least one third composite green sheet and at least one overlapping ceramic green sheet are sandwiched. The third composite green sheet is obtained through the steps of providing a ceramic green sheet with a fourth through hole overlapping the second through hole and having a larger size than the second through hole, fitting a shrinkage suppression green sheet having substantially the same shape and thickness in the fourth through hole, providing the shrinkage suppression green sheet fitted in the fourth through hole at the same position as the second through hole with a fifth through hole having substantially the same shape as the second through hole and fitting a ceramic green sheet having substantially the same shape and thickness as the fifth through hole in the fifth through hole. The overlapping ceramic green sheet is provided at the same position as the fourth through hole with a cut of substantially the same shape as the fourth through hole or with a discontinuous portion. In this state, the step of pressing is performed in the lamination direction to obtain a multilayer body. The multilayer body is subjected to the cavity formation step to enable a three-step cavity with three bottoms to be formed.

Even in the case of forming a multistage cavity (two-step cavity with two bottoms in the present embodiment), the cavity has a specific shape and therefore has superiority in resin-seal to the multistage cavity of the conventional multilayer ceramic substrate. The shapes of the cavities of the multilayer ceramic substrates fabricated will be described below.

FIG. 13 is a diagram typically showing a multilayer ceramic substrate having a multistage cavity. The multilayer ceramic substrate 50 is fabricated through the steps shown in FIG. 11 and has a two-step cavity with two bottoms comprising cavity portions 51a and 51b similarly to the multilayer ceramic substrate shown in FIG. 12. In each of the cavity portions 51a and 51b, the shrinkage in the surface direction gradually increases with an increasing distance from the shrinkage suppressing green sheet, and the opening size at each opening is smaller than that at a position midway in the depth direction. To be specific, in the first step (upper) cavity portion 51b, when the opening size at the opening is denoted by W3 and the opening size at a position midway in the depth direction by W4, W3<W4. Similarly, in the second step (lower) cavity portion 51a, when the opening size at the opening is denoted by W5 and the opening size at a position midway in the depth direction by W6, W5<W6. The cross-sectional shape of the sidewall of each of the cavity portions 51a and 51b is a circular arc and, therefore, the shape of each of the cavity portions assumes a pot or urceolate shape.

The second and subsequent step cavity portions (cavity portion 51*a* here) do not always assume a pot or urceolate shape, but may be of a shape having the largest opening area and gradually reducing the opening area toward the depth direction as shown in FIG. 14. In this case, when the opening size at the opening is set to be W5 and the opening size at a position midway in the depth direction to be W6, W5>W6. The first step (upper) cavity portion 51*b* assumes a pot or urceolate shape, whereas the second step (lower) cavity portion 51*a* assumes a shape of bowl. By making the second and subsequent cavity portions bowl-shaped, wire bonding in mounting an electronic device on the cavity portion 51*a* is ready to perform, thereby enabling efficient device mounting.

In the multistage cavity 51 of the multilayer ceramic substrate 50, since at least the first step (upper) cavity portion 51*b* has a shape of a drum having the opening area larger at the inside than at the opening, reliable resin-seal in the cavity portions 51*a* and 51*b* can be secured.

In the production method of the first embodiment, for example, failure to achieve a balance of the upper and lower shrinkage suppression forces depending on the layer structure of the multilayer ceramic substrate will possibly deform the cavity bottom, as extremely depicted in FIG. 15, for example. In such a case, the thickness of the shrinkage suppressing green sheets sandwiching the cavity bottom is adjusted to avoid the deformation. The third embodiment of the present invention is directed to this adjustment.

To be specific, as shown in FIG. 16, the thickness of the first composite green sheet 26 having the shrinkage suppression green sheet piece (first fitting sheet 25) fitted in the cavity formation portion thereof is adjusted. In this case, in order to compensate the change in thickness, though the thickness of the first fitting sheet 25 may only be adjusted, the thickness of the first composite green sheet as a whole may be adjusted. Otherwise, as shown in FIG. 17, the thickness of the portion of the shrinkage suppression green sheet 22 corresponding to the cavity may be adjusted. In this case, the shrinkage suppression green sheet 22 shown in FIG. 17 comprises a lamination of a thin shrinkage suppression green sheet 22*a* and a green sheet 22*b* having a through hole at a cavity formation portion thereof and having a ceramic green sheet fitted in the through hole. With this, shrinkage suppression of the multilayer body as a whole and shrinkage suppression of the cavity bottom can independently be controlled.

In the shrinkage suppression green sheet 22*b*, the shape of the ceramic green sheet to be fitted (shape of the through hole) may not be the same as the cavity shape, but is determined in view of the balance of the shrinkage compression forces. The thickness of each of the first fitting sheet 25 and the shrinkage suppression green sheets 22*a* and 22*b* may appropriately be set similarly in consideration of the balance of the shrinkage suppression forces.

The fourth embodiment of the present invention is directed to use of a burnable sheet. FIG. 18 shows the fundamental production process in this embodiment that mainly comprises the steps of laminating and pressing green sheets and shrinkage suppressing green sheets that constitute ceramic layers after being fired, firing the pressed body, removing embedded green sheets fired and removing the shrinkage suppression green sheets fired.

In fabricating a multilayer ceramic substrate, as shown in FIG. 18(*a*), a plurality of ceramic green sheets are laminated as green sheets for a substrate in accordance with the number of the ceramic layers constituting a multilayer ceramic substrate. Here, nine ceramic green sheets 61 to 69 are laminated. Each of the ceramic green sheets 61 to 69 is formed through the steps of mixing ceramic powder, an organic binder and an organic solvent to form dielectric paste in the form of slurry, for example, and allowing the paste to grow on a PET sheet of support, for example, in accordance with the doctor blade method. Any of known ceramic powder and organic vehicles (organic binder and organic solvent) is usable in the present embodiment.

Of the ceramic green sheets 61 to 69, the two lower ceramic green sheets 61 and 62 are not required to form a cavity formation through hole therein, but formed as ordinary flat green sheets. Of the two ceramic green sheets 61 and 62, the upper ceramic green sheet 62 constitutes the cavity bottom.

On the ceramic green sheet 62 constitutes the cavity bottom, laminated are the seven remaining ceramic green sheets 63 to 69 given cuts 63*a* to 69*a* (partially left out) of a prescribed shape corresponding to the shape of the cavity 11, respectively, to form separate portions 63*b* to 69*b* (partially left out) that correspond to the cavity space. Thus, the seven ceramic green sheets 63 to 69 correspond to the cavity formation green sheets.

In the present embodiment, the portions 64*b* to 69*b* separated by the cuts 64*a* to 69*a* exclusive of the ceramic green sheet 63 in contact with the ceramic green sheet 62 constituting the cavity bottom are utilized as embedded green sheets. However, this is not limitative. A separately formed embedded green sheet may be fitted in the through holes corresponding to the cavity formed in the ceramic green sheets 64 to 69. From the standpoint of productivity, however, utilization of the portions 64*b* to 69*b* separated by the cuts 64*a* to 69*a* as embedded green sheets is advantageous.

The ceramic green sheet 63 in contact with the ceramic green sheet 62 constituting the cavity bottom has its portion corresponding to the cavity removed therefrom to form a through hole, and a shrinkage suppression green sheet piece 70*a* and a burnable sheet piece 71*a* each having a shape corresponding to the through hole are fitted and buried in the through hole. This is shown in detail in FIG. 19.

As shown in FIG. 19(*a*), a ceramic green sheet 63 is formed and, as shown in FIG. 19(*b*), the portion of the ceramic green sheet corresponding to the cavity is punched out to form a through hole. As shown in FIG. 19(*c*), a shrinkage suppression green sheet 70 is formed and, as shown in FIG. 19(*d*), a shrinkage suppression green sheet piece 70*a* punched out so as to have a shape substantially conforming to the shape of the through hole is formed. Similarly, as shown in FIG. 19(*e*), a burnable sheet 71 is formed and, as shown in FIG. 19(*f*), it is punched out to form a burnable sheet piece 71*a* having a shape substantially conforming to the through hole. Subsequently, as shown in FIG. 19(*g*), the shrinkage suppression green sheet piece 70*a* and burnable sheet piece 71*a* are fitted in the order mentioned and buried in the through hole of the ceramic green sheet 63. Preferably, the total thickness of the shrinkage suppression green sheet piece 70*a* and burnable sheet piece 71*a* conforms substantially to the thickness of the ceramic green sheet 63.

The shrinkage suppression green sheet 70 (shrinkage suppression green sheet piece 70*a*) is formed of a material not shrunk at the firing temperature of the ceramic green sheets 61 to 69, such as tridymite or cristobalite, or of a composition containing quartz, molten quartz, alumina, mullite zirconia, aluminum nitride, boron nitride, magnesium oxide, silicon carbide, etc. The shrinkage suppression green sheet piece 71*a* is disposed in contact with the ceramic green sheet (ceramic green sheet 62 in this case). The firing step is performed under these conditions to suppress shrinkage of the ceramic green sheet 62 in the in-plane direction.

The burnable sheet 71 (burnable sheet piece 71*a*) is formed of a material burnt down at the firing temperature of the ceramic green sheets 61 to 69, such as a resin material. Particularly preferably, the organic binder contained in the ceramic green sheets 61 to 69 is used as the material for the burnable sheet 71 (burnable sheet piece 71a). By so doing, the burnable sheet 71 (burnable sheet piece 71a) is burnt down with exactitude in the firing step. While the burnable sheet piece 71a may be formed through punching the burnable sheet out as described above, it may be formed by the printing method, etc.

As described above, the ceramic green sheets 61 to 69 are laminated and, the shrinkage suppression green sheets 72 and 23 overlap the surfaces of the outermost green sheets 61 and 69, respectively. The shrinkage suppression green sheet 72 and 73 are formed of the same material as the aforementioned shrinkage suppression green sheet 70. The shrinkage suppression green sheet 73 disposed on the side of the ceramic green sheet 69 formed with a through hole (by the cut 69a) corresponding to the cavity is also formed with a through hole 73 corresponding to the opening of the cavity, in which an embedded ceramic green sheet piece 74 separately punched out is fitted.

The multilayer body having these sheets laminated is in a state shown in FIG. 18(a), in which the shrinkage suppression green sheets 72 and 73 are laminated, respectively, on the opposite surfaces of the multilayer body having the plural ceramic green sheets 61 to 69 laminated, thereby suppressing shrinkage of the entire multilayer body in the in-plane direction. In addition, the shrinkage suppression green sheet piece 70a disposed in the through hole of the ceramic green sheet 63 is in contact with the ceramic green sheet 62 exposed to the cavity bottom, thereby suppressing shrinkage of this portion in the in-plane direction.

Though the space corresponding to the cavity is ordinarily formed as a space (concave) at this stage, in the production method in this embodiment, the portions 64b to 69b separated by the cuts 64a to 69a and the embedded ceramic green sheet piece 74 are disposed as the embedded green sheet. When seeing the entire shape of the multilayer body, the multilayer body is formed as that flat without any concave.

The multilayer body having the ceramic green sheets 61 to 69 and shrinkage suppression green sheets 72 and 73 laminated is to be pressed in the pressing step preparatory to the firing step. At this time, when the multilayer body is formed with a concave corresponding to the cavity, the concave will possibly collapse to deform the opening of the cavity. In the present embodiment, however, since the multilayer body fabricated is uniform in thickness in the lamination direction and flattened over the entire thereof inclusive of the cavity portion owing to the presence of embedded green sheets, an ordinary flat mold die can be used to press the multilayer body. Thus, the pressing step can be performed with a simple means. While pressure is applied with the multilayer body sandwiched between the flat mold dies, as described above, the multilayer body coated with waterproof resin, etc. may be subjected to isostatic pressing.

After the firing step subsequent to the pressing step, as shown in FIG. 18(b), the ceramic green sheets 61 to 69 are converted to ceramic layers 2 to 10. At the time of firing, since the ceramic green sheets 61 to 69 bound by the shrinkage suppression green sheets 72 and 73 laminated thereon, they are shrunk only in the width direction and are seldom shrunk in the in-plane direction. The ceramic green sheet 62 exposed to the cavity bottom is also suppressed from being shrunk in the in-plane direction.

In addition, the burnable sheet piece 71 intervening between the embedded green sheets (ceramic green sheets 64 to 69 and embedded ceramic green sheet piece 70a) and the shrinkage suppression green sheet piece 70a is burnt down before the ceramic green sheets 61 to 69 are sintered. As a result, the binding force of the shrinkage suppressing green sheet piece 70a disposed on the cavity bottom is not exerted on the embedded green sheets to shrink the embedded green sheets in the in-plane direction. A fired body 75 protrudes from the fired multilayer body because the shrinkage in the thickness direction is small. Since the binding force is not exerted, as described above, the embedded green sheets are shrunk and consequently no stress is applied to the shrinkage suppression green sheet piece 70a and also to the ceramic green sheet 62 immediately under it. The flatness of the ceramic layer 3 formed as a consequence of firing of the ceramic green sheet 62 is not deteriorated.

Upon completion of the firing, the fired body 75 of the embedded green sheets is removed from the cavity space as shown in FIG. 18(c). The fired body is separated from the shrinkage suppression green sheet piece 70a because the burnable sheet piece 71a is burnt down and, therefore, can easily be removed by, for example, turning the fired multilayer body upside down.

Finally, residuals 76 of the fired shrinkage suppression green sheets 72 and 73 and the fired shrinkage suppression green sheet piece 70a are removed to complete a multilayer substrate 1 having a cavity 11 as shown in FIG. 18(d). The residuals 76 can be removed with ease by some sort of cleaning step. The removal can be attained by stimulus of a degree by ultrasonic cleaning, for example. Thus, as the cleaning step, the step of ultrasonic cleaning in a solvent will suffice. When alumina-based green sheets are used as the shrinkage suppressing green sheets, however, the residuals 76 do not exfoliate spontaneously. Therefore, the residuals 76 are to be removed through polishing and cleaning by a wet blasting step.

The multilayer ceramic substrate 1 is excellent in dimensional accuracy and flatness of the cavity bottom has no deformation including collapse of the cavity opening and bulges around the cavity opening.

The fifth embodiment of the present invention is directed to use of a burnable sheet on each of the bottoms of the cavity portions in producing a multilayer ceramic substrate having a multistage cavity (of a two-step structure). In this case, as shown in FIG. 20(a), shrinkage suppression green sheets 82 and 83 are laminated on the opposite surfaces of a multilayer body 81 of ceramic green sheets and, at the same time, shrinkage suppression green sheets 82 and 83 are laminated on both surfaces of the multilayer body 81 of the ceramic green sheets, respectively, and shrinkage suppression green sheet pieces 84 and 85 and burnable sheet pieces 86 and 87 are disposed on the cavity bottom and the stepped surface, respectively. The pressing step and firing step are performed, with embedded green sheets 88 filled in the cavity space of the two-step structure. Also in the present embodiment, the flatness of the multilayer body is secured, and the pressing step is easy to perform.

Though a fired body 89 of the embedded green sheets after the firing step protrudes form the multilayer body as shown in FIG. 20(b), it can easily be removed by turning the multilayer body upside down in the same manner as described above. A multilayer ceramic substrate 90 obtained is as shown in FGI. 20(c) and is excellent in entire dimensional accuracy as well as in dimensional accuracy of the bottom 91a and stepped surface 91b of the cavity 91 and in their flatness. Incidentally, in the case of the cavity 91 of the two-step structure, an electronic device is mounted on the bottom 91a and the stepped surface 91b is provided with a conductive pattern connected to the electronic device with bonding wires.

The sixth embodiment of the present invention is directed to a multilayer ceramic substrate having a conductive pattern formed as straddling the periphery of the cavity bottom.

FIG. 21(a) to FIG. 21(d) illustrate an example of the simplest model of a multilayer ceramic substrate 101 having a cavity 111. In this example, plural (nine here) ceramic layers 102 to 110 are laminated and made integral. Of these ceramic layers 102 to 110, two lower ceramic layers 102 and 103 are flat ceramic layers provided with no through hole for the formation of a cavity. Of the two layers, the upper ceramic layer 103 corresponds to a bottom formation ceramic layer, and part of the upper surface thereof faces the lower portion of the cavity and constitutes the cavity bottom 111a.

The remaining ceramic layers 104 to 110 laminated on the ceramic layer 103 are provided with through holes 104a to 110a corresponding to the sidewall of the cavity 111 and constitute cavity formation ceramic layers. Of these, the ceramic layer 104 corresponds to the first cavity ceramic layer, and the ceramic layer 105 corresponds to the second cavity ceramic layer. The surface of the ceramic layer 103 constituting the cavity bottom 111a and the sidewalls of the through holes 104a to 110a of the ceramic layers 104 to 110 made contiguous define the cavity space. The shape of the opening of the cavity 111 is the same as that of the first embodiment, for example.

On the surface of the ceramic layer 113 is formed a conductive pattern 112 that straddles the periphery of the bottom 111a of the cavity 111. One end of the conductive pattern 112 is exposed to the bottom 111a of the cavity 111 and connected to an electronic device accommodated in the cavity 111. The other end of the conductive pattern 112 is disposed between the ceramic layers 103 and 104 and connected to the internal electrodes or wirings formed inside the multilayer ceramic substrate 101. In FIG. 21, two sides of the square cavity 111 opposed when seen from top have two conductive patterns 112 in the form of a strip of paper, respectively, i.e. four in total. However, the shape and number of the conductive patterns can arbitrarily be set. There is a case where the bottom 111a of the cavity 111 is provided with via holes for heat radiation etc. though not shown.

In the multilayer ceramic substrate 101 of the present embodiment, at at-least two sides the conductive patterns overlap, the wall surface of the through hole 104a of the ceramic layer 104 is disposed outside the wall surface of the through hole 105a of the ceramic layer 105 laminated immediately on the ceramic layer 104. Also in the present embodiment, the opening area of the through hole 104a of the ceramic layer 104 is larger than that of the through hole 105a of the ceramic layer 105. Thus, the opening dimension of the cavity 111 is enlarged in the vicinity of the cavity bottom 111a.

The wall surface of the through hole 104a formed in the ceramic layer 104 may be positioned slightly outward of the wall surface of the through hole 105a of the ceramic layer 105. A distance "A" between the wall surfaces 104a and 105a may be 0.1 mm or more, for example. When the distance "A" is unduly large, since a dead space formed on the bottom of the cavity 111 becomes large, it is preferably 0.5 mm or less.

A multilayer ceramic substrate fabricated by each production method described later has a cavity of a specific shape. Specifically as is typically shown in FIG. 22, the opening area of the inside is larger than that of the opening close immediately to the shrinkage compression green sheet to form a drum-shaped cavity.

In the cavity 111, the opening dimension W1 at an opening 111b is smaller than the opening dimension W2 at a position 111c midway in the depth direction of the cavity 111. In other words, the opening area at the opening 111b of the cavity 111 is smaller than the opening area at the position 111c midway in the depth direction of the cavity 111. In this example, the opening area of the cavity 111 is gradually increased up to the position 111c midway in the depth direction of the cavity and then gradually decreased up to at least the ceramic layer 105 and, thus, the inner wall of the cavity 111 assumes a substantially circular arc in cross section. Thus, the portion of the cavity midway in the depth direction is bulged out to shape a drum-shaped cavity.

Incidentally, in the present embodiment, the position of the through hole 104a of the ceramic layer 104 laminated immediately on the cavity bottom formation ceramic layer 103 has nothing to do with the portion 111c midway in the depth direction of the cavity 111.

The multilayer ceramic substrate 101 having the cavity 111 of the shape described above has a great merit in terms of reliability owing to its shape specificity. As shown in FIG. 23, for example, when an electronic device 140 is mounted within the cavity 111 and sealed with a resin J, the opening dimension at the opening 111b of the cavity 111 is smaller than that of the cavity inside, the resin J filled in the cavity will not fall off at all. As described earlier, in the seal with the resin J relative to the conventional shape, the problem will arise in that the resin sealed exfoliates and falls off, resulting from the difference in thermal expansion coefficient between the ceramic sheets 102 to 110 constituting the multilayer ceramic substrate 101 and the resin J used for the seal. This problem becomes conspicuous particularly when a temperature change is repeated over a long period of time. In the multilayer ceramic substrate 101, since the opening area at the opening 111b of the cavity 111 is smaller than the opening area of the portion at the position 111c midway in the depth direction of the cavity 111, the resin J filled and hardened in the cavity 111 cannot pass through the opening 111b of the cavity 111 because of the larger area of the inside of the cavity and is retained within the cavity 111.

The multilayer ceramic substrate 101 having the configuration described above is formed through the production process performed. The production process of the multilayer ceramic substrate in the present embodiment will be described.

Also in the present embodiment, the non-shrinkage firing process is adopted, and the pressing and firing steps are performed, with the embedded green sheet disposed in a space corresponding to the cavity to eliminate collapse etc. at the pressing step in the same manner as in the first embodiment. The step flowchart in the production process is pursuant to that shown in FIG. 2.

To be specific, in the green sheet formation step (S11) shown in FIG. 2, a ceramic green sheet (green sheet for a substrate) 121 shown in FIG. 24(a) and a shrinkage suppression green sheet 122 shown in FIG. 24(b) are formed. Generally, these sheets 121 and 122 are formed as being in intimate contact with the surface of a support 123 that is a plastic sheet etc.

The ceramic green sheets 121 and shrinkage suppression green sheets 122 are thus formed. The thickness of each sheet is preferred to be 20 μm to 300 μm in consideration of the formation of a via electrode or an internal electrode that will be described later.

After the fabrication of the ceramic green sheet 121 and shrinkage suppression green sheet 122, a composite green sheet (green sheet combining the ceramic green sheet with the shrinkage suppression green sheet) is fabricated utilizing the two sheets (S12). The composite green sheet fabricated here comprises a first composite green sheet (green sheet for formation of a first cavity) laminated immediately on the green sheet for formation of the cavity bottom and an uppermost composite green sheet laminated as an uppermost composite shrinkage suppression green sheet.

A first composite green sheet 126 shown in FIG. 25(*a*) is produced. First, the ceramic green sheet 121 produced in the green sheet formation step (S11) is formed with a first through hole 124. The first through hole 24 may be formed by punching out a predetermined portion of the ceramic green sheet 121, with the ceramic green sheet in intimate contact with the surface of a support 123, with a die of a puncher or using a laser beam or with a microdrill or by punching. The first through hole 124 is formed to correspond to the shape of the cavity bottom, and the shape thereof is not particularly restricted, but may be square, rectangular or circular.

The shrinkage suppression sheet 122 produced in the green sheet formation step (S11) is placed on the support 123 and cut into the same shape as the first through hole 124 to obtain a first fitting sheet 125 (corresponding to the shrinkage suppression green sheet piece). The cut first fitting sheet 125 is fitted in the first through hole 124 to form a first composite green sheet 126. At this time, in order to make the first composite green sheet 126 flat, preferably, the thickness of the ceramic green sheet 121 is the same as that of the first fitting sheet 125.

An uppermost composite green sheet 129 is produced in accordance with the same production method as that of the first composite green sheet 126. In the uppermost composite green sheet 129, as shown in FIG. 25(*b*), the shrinkage suppression green sheet 122 is formed with a through hole in which a ceramic green sheet piece is fitted. To be specific, the shrinkage suppression green sheet 122 produced in the green sheet formation step (S11) is formed with a second through hole 127 corresponding to the opening of the cavity. The production method of the second through hole 127 is the same as that of the first through hole 124. The ceramic green sheet produced in the green sheet formation step (S11) is placed on the support and cut into the same shape as the second through hole 127 to obtain a second fitting sheet 128. The cut second fitting sheet 128 is fitted in the second through hole 127, and the resultant composite sheet is allowed to exfoliate from the support 123 to form an uppermost composite green sheet 129. Also in this case, in order to make the uppermost composite green sheet 129 flat, preferably, the thickness of the shrinkage suppression green sheet 122 is the same as that of the second fitting sheet 128.

In the cut formation step (S13), the ceramic green sheet 121 is formed with a cut to be used as a cavity formation green sheet. Specifically, in the cut formation step (S13), the ceramic green sheet 121 produced in the green sheet formation step (S18) is formed with a cut (or a discontinuous portion) 131 to form a cut formation sheet 130 as shown in FIG. 26. The cut 131 indicates the discontinuous portion pierced in the direction of the thickness of the ceramic green sheet 121. Incidentally, the discontinuous portion includes what is not pierced in the sheet width direction. The end face of the portion 130*a* defined by the cut 131 is set to be at a position inside the wall surface of the first through hole 124 of the first composite green sheet 126 at at-least the portion shown in FIG. 28 where the conductive pattern 112 formed on the cavity bottom formation green sheet 132 straddles the periphery 111*a* of the cavity 111 when the cut formation sheet 130 has overlapped the caity bottom formation green sheet 132 shown in FIG. 27 that overlaps the first composite green sheet 126. The cut 131 is formed at the same position and in the same shape as the second through hole 127 to overlap the second through hole 127 when the uppermost composite green sheet 129 has overlapped the cut formation sheet 130.

The cut 131 may be formed by punching out a predetermined portion of the ceramic green sheet 121, with the ceramic green sheet 121 in intimate contact with the surface of the support 123, with a die of a puncher or using a laser beam or with a microdrill or by punching.

In the cut formation step (S13), the cut may be inserted into the ceramic green sheets 121 one by one or together in a lump. In either case, in the cut formation sheets 130, the inside portions 130*a* separated by the cuts 131 are left intact and utilized as embedded green sheets in the laminating and firing steps.

The first composite green sheet 126, cut formation sheets 130 and ceramic green sheet constituting the bottom of the cavity (cavity bottom formation green sheet) that are ceramic green sheets constituting the ceramic layers of a multilayer ceramic substrate after being fired (hereinafter referred to collectively as "dielectric layer sheets") are provided with a via hole, via electrode, internal electrode pattern, etc. Via electrode paste is filled and solidified by the stopgap printing, for example, to form a via electrode. Internal electrode paste is applied onto the ceramic green sheet, for example, in a prescribed pattern by the screen printing to form an internal electrode pattern.

Specifically, in the via hole formation step (S14), a via hole for forming a via electrode therein is formed in the dielectric layer sheet. In the conductor-printing step (S15), conductive paste is filled in the via hole formed in the via hole formation step (S14) to form a via electrode. Also in the conductor-printing step (S15), an internal electrode pattern is printed in a prescribed pattern on the surface of the dielectric layer sheet. Particularly in the conductor-printing step (S15), as shown in FIG. 27, conductive patterns 112 are formed on the ceramic green sheet 132 to fabricate a cavity bottom formation green sheet 132. The conductive patterns 112 are formed as straddling the periphery (shown by dashed line in FIG. 27) of the region constituting the bottom 111*a* of the cavity 111 in the fired multilayer ceramic substrate.

After the formation of the via electrode and internal electrode pattern on each of the dielectric layer sheets, the sheets are laminated in the laminating step (S16) to form a multilayer body 133. The configurations of the multilayer body from the laminating step (16) to the shrinkage suppression sheet removal step (S4) are shown in FIG. 28(*a*) to FIG. 28(*d*). Incidentally, the step shown in FIG. 28(*c*) and the step shown in FIG. 28(*d*) may be performed inversely in order or simultaneously.

In the laminating step (S16), as shown in FIG. 28(*a*), a shrinkage suppression green sheet 122, ceramic green sheet 121, cavity bottom formation green sheet 132, first composite green sheet 126, cut formation sheet 130 and uppermost composite green sheet 129 are laminated in the order mentioned from the lowermost layer.

In the present embodiment, at the portion where the periphery of the bottom 111*a* of the cavity 111 and the conductive pattern 112 overlap in a planar state in the multilayer ceramic substrate having undergone the firing step, it is required to set the end face of the first fitting sheet 125 (shrinkage suppression sheet piece) to be positioned outside the end face of the inside portion 130*a* (embedded green sheet) of the cut 131 formed in the cut formation sheet 130 laminated immediately on the first fitting sheet 125. In the present embodiment, as shown in FIG. 28(*a*), it is set that the size of the first fitting sheet 125 (shrinkage suppression sheet piece) is larger than that of the portion (embedded green sheet) separated by the cut 131 from the cut formation sheet 130 laminated-thereon.

The end face of the first fitting sheet 125 (shrinkage compression sheet piece) may be positioned slightly outside the end face of the inside portion 130a of the cut 131 (embedded green sheet) laminated immediately thereon. The sizes of the first fitting sheet 125 and inside portion 130a of the cut 131 of the cut formation sheet 130 may be set so that the distance "A" between the wall surface of the through hole 104a of the ceramic layer 104 and the wall surface of the through hole 105 of the ceramic layer 105 may be 0.1 mm to 0.5 mm.

The number of each sheet may be singular or plural. In the example shown, laminated on a ceramic green sheet 121 is a cavity bottom formation green sheet 132 on which a first composite green sheet 126 and six cut formation sheets 130 are laminated. Therefore, the nine sheets correspond to green sheets for a substrate, and the first composite green sheet 126 and the six cut formation sheets 130 correspond to green sheets for formation of a cavity. Of the cavity formation green sheets, the first composite green sheet 126 corresponds to a first cavity formation green sheet, and the cut formation sheets 130 correspond to the second cavity formation sheets. The configuration of the multilayer body 133 may be an upside-down configuration or a configuration having the same configuration added across the shrinkage suppression green sheet 122.

When laminating two or more cut formation sheets 130, for example, these may be formed of the same material or differ materials. In the latter case, however, they are preferred to be substantially the same in compressibility at the time of pressing and in degree of shrinkage and thermal expansion coefficient at the time of firing. By so doing, warp of the substrate resulting from the difference in compressibility, degree of shrinkage and thermal expansion coefficient of the cut formation sheets 130 can be suppressed.

The entire thickness of the multilayer body 133 thus obtained by the lamination is preferred to be 1 mm or less on demand for making the size and height of a multilayer ceramic substrate small. The lamination height of the cavity formation sheets (six cut formation sheets 130 and first composite green sheet 126) of the multilayer body 133 (corresponding to the cavity depth) is set in conformity to the size of an electronic device to be accommodated in the cavity.

After the laminating step (S16), the pressing step (S17) is performed. The pressing step (S17) is a press-on step for the multilayer body 133 produced in the laminating step (S16). The press-on step is performed, with the multilayer body 133 placed in a die having upper and lower flat punches. The preferable conditions of the press-on step include a pressure of 30 to 80 MPa and a period of around 10 minutes. In the present embodiment, since the uppermost and lowermost layers of the multilayer body 133 are flat and further since the portion 131a separated by the cut 131 is left intact in the portion where the cavity is formed as the embedded green sheet filled in the cavity, pressure in the pressing step can be applied uniformly. Therefore, there is no case where the opening of the cavity is deformed by collapse or damaged by the pressure applied as in the prior art.

The firing step (S2) is then performed, in which the multilayer body 133 pressed on in the pressing step (S17) is fired. Generally, the multilayer body 133 is subjected to debinder treatment before the firing step. The conditions of the debinder treatment may be generally adopted ones. The firing step is then performed to form a fired multilayer body 134. The atmosphere in the firing step is not particularly restricted. When a base metal, such as nickel or nickel alloy, is used for the via electrode and internal electrode pattern, the atmosphere is preferred to be a reduction atmosphere. The firing temperature is preferred to be in the range of 800° C. to 1000° C. As a consequence, the conductive material and resistance material can be fired at the same time, and the multilayer ceramic substrate subsequently obtained can be used for LTCC modules including high-frequency superposed modules, antenna switch modules, filter modules, etc.

In the fired multilayer body 134 having undergone the firing step (S2), as shown in FIG. 28(b), the portion 130a of the cut formation sheet 30 inside the cut 31 projects from the cavity. The reason therefor is as follows. When the multilayer body 133 is fired, the ceramic green sheet 121, cavity bottom formation green sheet 132, first composite green sheet 126 and cut formation green sheet 130 that are the dielectric layer sheets are sintered and intended to shrink. At this time, the ceramic green sheet 121 is in intimate contact with the lower shrinkage suppression green sheet 122. Since the shrinkage suppression green sheet 122 does not shrink at the firing temperature of the dielectric layer sheets, as described earlier, the shrinkage of the ceramic green sheet 121 in the plane surface direction is suppressed. Since the portion 130b of the cut formation sheet 130 outside the cut 131 is in intimate contact with the uppermost composite green sheet 129, the shrinkage thereof is also suppressed. In addition, at the bottom of the cavity, since the cavity bottom formation 132 is in intimate contact with the first fitting sheet 125 of the first composite green sheet 126, the shrinkage thereof is similarly suppressed.

On the other hand, the portion 130a of the cut formation sheet 130 inside the cut 131 is provided on the upper side thereof with no shrinkage suppression sheet, the shrinkage thereof is not suppressed. Thus, the inside portion 130a of the cut 131 is shrunk in the plane surface direction to separate from the outside portion 130b of the cut 131. The degree of this shrinkage is larger toward the upper layer from the first fitting sheet 125 on the bottom of the cavity, and the degree of shrinkage in the thickness direction is made smaller by the amount of the inside portion 130a of the cut 131 shrunk in the plane surface direction. Therefore the first fitting sheet 125, second fitting sheet 128 and the portion sandwiched between the two sheets (inside portion 130a of the cut 131) after being fired project from the surface of the fired multilayer body 134.

As shown in FIG. 29, for example, when the first fitting sheet (shrinkage suppression sheet piece) 303 and the region of the cut formation sheet surrounded by the cut (embedded green sheet) 309 are formed in substantially the same shape and when the end face of the shrinkage suppression sheet piece 303 is flush with the end face of the embedded green sheet 309 thereon, a problem of disconnection of the conductive pattern 301 disposed as straddling the periphery of the cavity bottom will be imposed. Of the cavity bottom formation green sheets 302, the region (cavity bottom) on which the first fitting sheet 303 is disposed is seldom shrunk in the in-plane direction owing to a strong binding force of the first fitting sheet 303, whereas since the binding force of the shrinkage suppression green sheet 306 and uppermost composite green sheet 307 relative to the region around the side wall of the cavity (cut formation sheets 304, first composite green sheet 305 and bottom formation green sheets 302) tends to be weakened toward the center of the lamination direction, the lower end 308 of the sidewall of the cavity small in binding force is greatly shrunk in the in-plane direction apart from the cavity. As a consequence, stress is concentrated in the periphery of the cavity bottom to induce disconnection of the conductive pattern 301 disposed at such periphery.

In the present embodiment, therefore, the end face of the first fitting sheet (shrinkage suppression sheet piece) 125 is disposed outside the end face of the inside portion (embedded green sheet) 130a of the cut 131 of the cut formation sheet 130 in at least the portion where the peripheral portion of the cavity bottom and the conductive pattern overlap. With this, part of the upper surface of the first fitting sheet 125 is in surface contact with the lower surface of the lowermost layer of the cut formation sheets 130, and the contact surface 125*a* causes the binding force of the first fitting sheet 125 to extend to the region of the plurality of cut formation sheets 130 laminated thereon in the vicinity of the cavity sidewall. For this reason, the first fitting sheet 125 can bind the shrinkage of the cut formation sheets (lower end of the cavity sidewall) in the in-plane direction to weaken the stress applied to the conductive pattern 112, thereby suppressing disconnection of the conductive pattern 112.

As described above, the first fitting sheet 125, second fitting sheet 128 and the portion sandwiched between the two sheets (inside portion 130*a* of the cut 131) are brought to the state of shrinkage different from that of the portion 130*b* of the ceramic green sheet 121 and cut formation sheet 130 outside the cut 131. For example, the portion 130*a* of the cut formation sheet 130 inside the cut 131 is completely separated from the outside portion 130*b*. Also at the cavity bottom, the first fitting 125 is made fragile by the firing and the binding force at this portion becomes weak. As is shown in FIG. 28(*c*), therefore, the first fitting sheet 125, second fitting sheet 128 and the portion sandwiched between the two sheets (inside portion 130*a* of the cut 131) filled in the cavity are enabled to fall off with a slight stimulus. Even in the case of the cavity having a complicated shape, the inside portion 130*a* of the cut 131 is enabled to fall off. In order to cause the inside portion 130*a* of the cut 131 to fall off, a small force may be exerted onto it.

Specifically, as shown in FIG. 28(*c*), the first fitting sheet 125, second fitting sheet 128 and the portion sandwiched between the two sheets (inside portion 130*a* of the cut 131) are removed to form the cavity and, at the same time, the shrinkage compression sheet removal step (S4) is performed when necessary. In the step (S4), as is shown in FIG. 28(*d*), the uppermost sheet 135 and the lowermost sheet 136 of the fired multilayer body 134 (shrinkage compression green sheet 122 and uppermost composite green sheet 129 that have been fired) are removed through ordinary ultrasonic washing in a solvent or wet blasting. The wet blasting is a method comprising accelerating a liquid having an abrasive mixed in water with compressed air from a compressor and blowing the water against a substance to be processed to thereby perform both washing and surface treatment simultaneously. When the shrinkage suppression green sheet is formed of a tridymite-silica-based or cristobalite-silica-based material, since the major parts of the uppermost sheet 135 and lowermost sheet 136 after the firing step exfoliate spontaneously, washing of the slightly remaining part will suffice.

As shown in FIG. 28(*c*), of the fired body of the first fitting sheet 125, at least part overlapping the outside portion 130*b* of the cut forming sheets 130 is collapsed, and the collapsed part though not shown remains as the residual in a position before falling-off of the inside portion 130*a* (dead space in the vicinity of the bottom of the cavity 111). Preferably, the residual is removed by cleaning with wet blasting. The removal of the residual of the first fitting sheet 125 and the cleaning removal of the uppermost sheet 135 and lower most sheet 136 of the fired multilayer body 134 (fired bodies of the uppermost green sheet 129 and shrinkage suppression green sheet 122) may be performed either simultaneously or separately.

Besides the steps described above, a cutting step, a polishing step, etc. are performed as occasion demands to obtain the multilayer ceramic substrate 1 shown in FIG. 21. The cutting step includes division with a diamond scriber and, when the fired multilayer body 134 is thick, cutting by a dicing system. The polishing step is performed through the lapping process, for example. The lapping process is a processing method for buffing the object to be processed using a processed liquid containing abrasive coating, with abrasive coating not contained in a rotary bed. Use of a wet barrel is also available.

An electronic device 140 is mounted on the multilayer ceramic substrate 101 produced. The state of the electronic device 40 mounted on the substrate is shown in FIG. 30. As shown in FIG. 30, the electronic device 140 is accommodated in the cavity 111 of the multilayer ceramic substrate 101. The bottom surface of the electronic device 140 is connected to the conductive pattern 112 exposed to the bottom 111*a* of the cavity 111 and the electronic device 140 is also connected to electrodes (not shown) formed on the multilayer ceramic substrate 101 with bonding wires 141. The electrodes include surface electrodes and via electrodes printed on the surface of the multilayer ceramic substrate 101 and internal electrodes printed inside the multilayer ceramic substrate 101. The multilayer ceramic substrate thus fabricated by the method of the present embodiment permits accommodation of an electronic device therein and satisfies the demand of making the substrate small in size and height.

The seventh embodiment of the present invention is directed to an example in which the wall surface of the through hole in the ceramic layer for forming a first cavity is disposed outside the wall surface of the through hole in the ceramic layer for forming a second cavity over the entire periphery of the cavity bottom. The description of part of the present embodiment overlapping the sixth embodiment will be omitted.

In the sixth embodiment, since there is no concern that disconnection arises at the sides on which no conductive pattern exists, the first fitting sheet 125 corresponding to the shrinkage suppression green sheet piece and embedded green sheet 130*a* are used to allow their end faces to be in flush with each other. For this reason, the cut formation sheet 130 corresponding to this portion is not bound by the first fitting sheet 125 to be greatly shrunk in the in-plane direction. When an internal electrode pattern is interposed between the lower ceramic layers of the sidewalls of the cavity, for example, there is a possibility of the internal electrode pattern being disconnected.

In the present embodiment, therefore, the end face of the first fitting sheet 125 is positioned outside the end face of the embedded green sheet 130*a* over the entire periphery of the bottom 111*a* of the cavity 111 to dispose the wall surface of the through hole 104*a* of the ceramic layer 104 outside the wall surface of the through hole 105*a* of the ceramic layer 105. Specifically, as shown in FIG. 31, in the multilayer ceramic substrate 145 of the present embodiment, the wall surface of the through hole 104*a* of the ceramic layer is positioned outside the wall surface of the through hole 105*a* of the ceramic layer 105 even at the periphery of the bottom 111*a* of the cavity 111 where no conductive pattern 112 is formed.

To obtain the multilayer ceramic substrate 145 as shown in FIG. 31, it may be set that the entire end face of the first fitting sheet 125 is positioned outside the inside portion (embedded green sheet) 130*a* of the cut 131 of the cut formation sheet 130 when the first fitting sheet 126 and cut formation sheet 131 have been laminated with each other. With this, since the first fitting sheet 125 binds the entirety in the vicinity of the inner periphery of the cut formation sheet 130, shrinkage of the cut formation sheet 130 in the in-plane direction in the entire periphery of the bottom 111*a* of the cavity 111 is suppressed to enable not only the conductive pattern 112 but also the internal electrode pattern provided in the lower portion of the sidewall of the cavity to be suppressed from disconnection.

FIG. 32 shows an example in which all sides of the periphery of a cavity 111 having a square opening are provided with conductive patterns 112. In a multilayer ceramic substrate 101 shown in FIG. 32, the wall surface of the through hole 104a of the ceramic layer 104 is positioned outside the wall surface of the through hole 105a of the ceramic layer 105 over the entire periphery of the bottom 111a of the cavity 111 to reliably suppress disconnection of the conductive patterns 112 exposed to the cavity bottom or the internal electrode pattern.

As shown in FIG. 33, for example, a conductive pattern 112 may be formed entirely on the bottom 111a of the cavity 111. Also in this case, since in a multilayer ceramic substrate 101 obtained the wall surface of the through hole 104a of the ceramic layer 104 in at least the portion overlapping the conductive pattern 112 is disposed outside the wall surface of the through hole 105a of the ceramic layer 105, disconnection of the conductive patterns or internal electrode pattern can reliably be suppressed.

The eighth embodiment of the present invention will be described. The difference between the sixth embodiment and the present embodiment is that the present embodiment adopts a multistage cavity (two-step cavity with two bottoms).

A multilayer ceramic substrate having a cavity with two bottoms will be described hereinafter with reference to FIG. 34. The multilayer ceramic substrate 150 shown in FIG. 34 has a cavity 151 with two bottoms and comprises plural (14 here) ceramic layers laminated and made integral. A ceramic layer 103 corresponds to the cavity bottom formation ceramic layer and a part thereof is exposed to the cavity bottom to constitute the deepest bottom 151a of the cavity 151 with two bottoms. Of the ceramic layers constituting the multilayer ceramic substrate 150, the configuration of the ceramic layers 102 to 109 is substantially the same as that of the sixth embodiment. Part of the ceramic layer 110 constitutes a bottom 151a of the first-step bottom 151a of the cavity 151 with two bottoms. Therefore, the ceramic layer 110 corresponds to a cavity bottom formation ceramic layer. The surface of the ceramic layer 110 is provided thereon with a conductive pattern 152.

The ceramic layers 153 to 157 laminated on the ceramic layer 110 are provided with through holes 153a to 157a and correspond to cavity formation ceramic layers. The sidewalls of the through holes 153a to 157a of the ceramic layers 153 to 157 made contiguous define the shallower space of the two-step cavity 151.

In the multilayer ceramic substrate 150 of the present embodiment, at the portion where the conductive pattern 152 straddles the periphery of the first step bottom 51b, the wall surface of the through hole 153a of the ceramic layer 153 in contact with the ceramic layer 110 is positioned outside the wall surface of the through hole 154a of the ceramic layer 154.

In fabricating the multilayer ceramic substrate of the present embodiment, a first composite green sheet is disposed on the deepest bottom of the cavity, a second composite green sheet is disposed on the first bottom (step surface) and the cut formation sheets having through holes different in size from each other to conform to the dimensions of the multistage cavity portions are laminated thereon.

FIG. 35 shows the detailed shape of the cavity of the multilayer ceramic substrate shown in FIG. 34. Here, in each of the cavity portions 151c and 151d, the shrinkage in the surface direction gradually increases with an increasing distance from the shrinkage suppressing green sheet, and the opening size at each opening is smaller than that at a position midway in the depth direction. In this embodiment, the first step cavity portion 151c has a shape bulged at a position midway in the depth direction, and the opening area of the cavity portion 151c increases gradually up to the midway position and then decreases gradually up to the penultimate cavity formation layer of the layers defining the first step cavity 151c. To be specific, in the first step cavity portion 151b, when the opening size at the opening is denoted by W3 and the opening size at a position midway in the depth direction by W4, W3<W4. Similarly, in the second step cavity portion 151d, when the opening size at the opening is denoted by W5 and the opening size at a position midway in the depth direction by W6, W5<W6. The cross-sectional shape of the sidewall of each of the cavity portions 151c and 151d is a circular arc and, therefore, the shape of each of the cavity portions 151c and 151d assumes a pot or urceolate shape.

The second and subsequent step cavity portions (cavity portion 151d here) do not always assume a pot or urceolate shape, but may be of a shape having the largest opening area and gradually reducing the opening area toward the depth direction as shown in FIG. 36. In this case, when the opening size at the opening is set to be W5 and the opening size at a position midway in the depth direction to be W6, W5>W6. The first step cavity portion 151c assumes a pot or urceolate shape, whereas the second step cavity portion 151d assumes a shape of bowl. By making the second and subsequent cavity portions bowl-shaped, wire bonding in mounting an electronic device on the cavity portion 151d is ready to perform, thereby enabling efficient device mounting.

In the multistage cavity 151 of the multilayer ceramic substrate 150, since at least the first step cavity portion 151c has a shape of a drum having the opening area larger at the inside than at the opening, reliable resin-seal in the cavity portions 151c and 151d can be secured.

A production method of the multilayer ceramic substrate 150 having the configuration described above will be described. The difference thereof from the sixth embodiment is to form the cavity into a multistage cavity (two-step cavity with two bottoms in this case). To be specific, the different points in step are to dispose a first composite green sheet on the deepest bottom of the cavity, dispose a second composite green sheet on the first step bottom (step surface) and laminate the cut formation sheets having through holes different in size from each other.

In the present embodiment, a second composite green sheet 143 shown in FIG. 37(a) is formed in the composite green sheet formation step (S12). In producing the second composite green sheet 143, the ceramic green sheet 121 produced in the green sheet formation step (S11) is formed with a third through hole 144 that overlaps the first through hole 124 and is larger than the first through hole 124. The formation method of the third through hole 144 is the same as the formation method of the first through hole 124.

The shrinkage suppression green sheet 122 produced in the green sheet formation step (S11) is cut into the same shape as the third through hole 144 to form a third fitting sheet 145, which is fitted in the third through hole 144. In addition, the third fitting sheet 145 fitted is formed with a fourth through hole 146 formed at the same position as the cut 131 to have substantially the same shape as the cut, in which fourth through hole the second fitting sheet 128 obtained by cutting the ceramic green sheet 121 into substantially the same shape as the fourth through hole 146 is fitted. A second composite green sheet 143 is thus produced. In producing the second composite green sheet 143, a reverse procedure of first fitting the second fitting sheet 128 in the fourth through hole 146 and then fitting the third fitting sheet 145 in the third through hole 144 may be adopted.

In the present embodiment, as shown in FIG. 37(*b*), a cut formation sheet (second cut formation sheet 147) different from the cut formation sheet 130 in the sixth embodiment is formed in the cut formation step (S13). The difference between the second cut formation sheet 147 and the previous cut formation sheet 130 is the size of a cut 148 that is larger than that of the cut 131. To be specific, the cut 148 in the second cut formation sheet 147 overlaps the third through hole 144 of the second composite green sheet 143 and has a size smaller than that of the third through hole 144. Also in the second cut formation sheet 147 similarly to the cut formation sheet 130, a portion 147*a* separated by a cut 148 is left intact and utilized as embedded green sheets in the laminating and firing steps.

In the conductor-printing step (S15), as shown in FIG. 38, conductive patterns 152 are formed on the surface of the uppermost cut formation sheet 130 as straddling the periphery of the cavity bottom 151*b* to fabricate a second cavity bottom formation green sheet 158. The conductive patterns 112 are formed on the surface of the green sheet 121 in the same manner as in the sixth embodiment to form a bottom formation green sheet 132.

In the present embodiment, it is necessary to pay attention to the size of the third fitting sheet 145 (third through hole 144) to be fitted in the second composite sheet 143 in the green sheet formation step (S11) and to the region of the cut 148 formed in the second cut formation sheet 147 in the cut formation step (S13). Specifically, when the second composite sheet 143 and second cut formation sheet 147 have been laminated on the second bottom formation green sheet 158, at at-least the portion where the conductive pattern 152 is disposed as straddling the periphery of the first step bottom 151*b*, it is set that the end face of the third fitting sheet 145 (third through hole 144) in the second composite sheet 143 is positioned outside the end face of the portion 147*a* of the second cut formation sheet 147 separated by the cut 148. Incidentally, when there are an inner end face and an outer end face like the third fitting sheet 145, the outer end face opposed to the sidewall of the cavity may be disposed outside the end face of the portion 147*a* separated by the cut 148.

An example of the multilayer body 154 having the sheets laminated in the present embodiment is shown in FIG. 39(*a*). The sheets constituting the multilayer body 154 are laminated in order from below. That is to say, the shrinkage suppression green sheet 122, ceramic green sheet 121, cavity bottom formation green sheet 132, first composite green sheet 126, cut formation sheet 130, second cavity bottom formation green sheet 158, second composite green sheet 143, second cut formation sheet 147 and uppermost composite green sheet 129 are laminated in the order mentioned from the lowermost layer. Incidentally, the number of each of the shrinkage suppression green sheet 122, cavity bottom formation green sheet 132, first composite green sheet 126, second cavity bottom formation green sheet 158, second composite green sheet 143 and uppermost composite green sheet 129 to be laminated is one. Of course, plural number of each of these sheets may be laminated. The number of each of the ceramic green sheet 121, cut formation sheet 130 and second cut formation sheet 147 is determined depending on the interlayer electrode pattern configuration required for the multilayer ceramic substrate and the size of an electronic device mounted on the inside of the substrate and is generally two or more. In this example, one ceramic green sheet 121, five cut formation sheets 130 and four second cut formation sheets 147 are laminated. Of course, the number of each of these sheets is not restricted to this example, but is optional. The multilayer body 154 may also be formed with another cavity on the side of the shrinkage suppression green sheet 122, for example, besides the cavity shown in FIG. 39(*a*).

When the multilayer body 154 has been fired, a fired multilayer body 155 shown in FIG. 39(*b*) is obtained. In the fired multilayer body 155, the portion 156*a* filled in the cavity is shrunk in the surface direction to project from the cavity. The portion is removed in the same manner as in the sixth embodiment and, when necessary, the shrinkage suppression sheet removal step (S4) is performed to complete a multilayer ceramic substrate 150 having a two-step cavity 151 with two bottoms as shown in FIG. 34.

An example in which an electronic device 140 is mounted on the multilayer ceramic substrate 150 having the two-step cavity 151 with two bottoms is shown in FIG. 40. As shown in FIG. 40, the electronic device 140 is accommodated in a lower cavity portion. The electronic device 140 is connected to the conductive pattern 152 exposed to the bottom 151*a* of an upper cavity portion with bonding wires 141. In this way, the multilayer ceramic substrate 150 fabricated by the production method of the present embodiment enables both the electronic device 140 and the bonding wires 141 to be accommodated in the inside thereof. Thus, the bonding wires and the like do not protrude from the surface of the multilayer ceramic substrate. Also in a multilayer ceramic substrate provided therein with a plurality of dielectric layers, an electronic device can be mounted at high density to satisfy the demand of making the size and height small.

Since the end face of the third fitting sheet 145 is disposed outside the end face of the portion 147*a* of the second cut formation sheet 147 separated by the cut 148, the binding force of the third fitting sheet 145 extends to the plurality of second cut formation sheets 147 laminated thereon. For this reason, the shrinkage of the second cut formation sheets 147 in the direction apart from the cavity is suppressed to weaken the stress applied to the conductive pattern 152 on the surface of the first step bottom 151*b*, thereby suppressing disconnection of the conductive pattern 152.

By making use of the production method of a multilayer ceramic substrate according to the present embodiment, a multilayer ceramic substrate having a three or more step cavity with three or more bottoms can be fabricated. In the multilayer body formation step, for example, between the uppermost composite green sheet and the ceramic green sheet provided at the same position as the third through hole with a cut of substantially the same shape as the third through hole or with a discontinuous portion, at least one third composite green sheet and at least one overlapping ceramic green sheet are sandwiched. The third composite green sheet is obtained through the steps of providing a ceramic green sheet with a fifth through hole overlapping the third through hole and having a larger size than the third through hole, fitting a shrinkage suppression green sheet having substantially the same shape and thickness in the fifth through hole, providing the shrinkage suppression green sheet fitted in the fifth through hole at the same position as the cut 148 with a sixth through hole having substantially the same shape as the cut and fitting a ceramic green sheet having substantially the same shape and thickness as the sixth through hole in the sixth through hole. The overlapping ceramic green sheet is provided at the same position as the fifth through hole with a cut of substantially the same shape as the fourth through hole or with a discontinuous portion. In this state, the step of pressing is performed in the lamination direction to obtain a multilayer body. The multilayer body is subjected to the cavity formation step to enable a three-step cavity with three bottoms to be formed.

When a conductive pattern is formed on the uppermost bottom as straddling the boundary portion between the uppermost bottom and the sidewall, similarly to the production method of a multilayer ceramic substrate having a two-step cavity, the end face of a fitting sheet (shrinkage suppression green sheet piece) fitted in a third composite green sheet is disposed outside the end face of a cut or discontinuous portion (embedded green sheet) of the ceramic green sheet laminated thereon. With this, disconnection of the conductive pattern formed on the uppermost step bottom can be suppressed.

In the production method of the sixth embodiment, for example, failure to achieve a balance of the upper and lower shrinkage suppression forces depending on the layer structure of the multilayer ceramic substrate will possibly deform the cavity bottom, as extremely depicted in FIG. 41, for example. In such a case, the thickness of the shrinkage suppressing green sheets sandwiching the cavity bottom is adjusted to avoid the deformation. The ninth embodiment of the present invention is directed to this adjustment.

To be specific, as shown in FIG. 42, the thickness of the first composite green sheet 126 having a shrinkage suppression green sheet piece (first fitting sheet 125) fitted in the cavity formation portion thereof is adjusted. In this case, in order to compensate the change in thickness, though the thickness of the first fitting sheet 125 may only be adjusted, the thickness of the first composite green sheet as a whole may be adjusted. Otherwise, as shown in FIG. 43, the thickness of the portion of the shrinkage suppression green sheet 122 corresponding to the cavity may be adjusted. In this case, the shrinkage suppression green sheet 122 shown in FIG. 43 comprises a lamination of a thin shrinkage suppression green sheet 122a and a shrinkage suppression green sheet 122b having a through hole at a cavity formation portion thereof and having a ceramic green sheet fitted in the through hole. With this, shrinkage suppression of the multilayer body as a whole and shrinkage suppression of the cavity bottom can independently be controlled.

In the shrinkage suppression green sheet 122b, the shape of the ceramic green sheet to be fitted (shape of the through hole) may not be the same as the cavity shape, but is determined in view of the balance of the shrinkage compression forces. The thickness of each of the first fitting sheet 125 and the shrinkage suppression green sheets 122a and 122b may appropriately be set similarly in consideration of the balance of the shrinkage suppression forces. A burnable sheet in place of the ceramic green sheet may be fitted in the through hole of the shrinkage suppression green sheet 122b. By setting the thickness of the ceramic green sheet or burnable sheet to conform to the thickness of the shrinkage suppression green sheet 122b, uniform pressure can be applied to the multilayer ceramic substrate in the pressing step.

The tenth embodiment of the present invention is directed to use of a burnable sheet when producing the multilayer ceramic substrate 101 shown in FIG. 21. FIG. 44 shows the fundamental production process in this embodiment that mainly comprises the steps of laminating and pressing green sheets and shrinkage suppressing green sheets that constitute ceramic layers after being fired, firing the pressed body, removing fired embedded green sheet body and removing fired shrinkage suppression green sheets.

In fabricating a multilayer ceramic substrate, as shown in FIG. 44(a), a plurality of ceramic green sheets are laminated as green sheets for a substrate in accordance with the number of the ceramic layers constituting a multilayer ceramic substrate. Here, nine ceramic green sheets 161 to 169 are laminated. Each of the ceramic green sheets 161 to 169 is formed through the steps of mixing ceramic powder, an organic binder and an organic solvent to form dielectric paste in the form of slurry, for example, and allowing the paste to grow on a PET sheet of support, for example, in accordance with the doctor blade method. Any of known ceramic powder and organic vehicles (organic binder and organic solvent) is usable in the present embodiment.

Of the ceramic green sheets 161 to 169, the two lower ceramic green sheets 161 and 162 are not required to form a cavity formation through hole therein, but formed as ordinary flat green sheets. Of the two ceramic green sheets 161 and 162, the upper ceramic green sheet 162 constitutes the cavity bottom.

On the ceramic green sheet 162, laminated are the seven remaining ceramic green sheets 163 to 169 given through holes 163a and 164a of a prescribed shape corresponding to the opening shape of the cavity 111 and cuts 165a to 169a to form separate portions 163b to 169b that correspond to the cavity space. Thus, the seven ceramic green sheets 163 to 169 correspond to the cavity formation green sheets.

In the present embodiment, the portions 165b to 169b separated by the cuts 165a to 169a exclusive of the ceramic green sheet 163 in contact with the ceramic green sheet 162 constituting the cavity bottom and the ceramic green sheet 164 thereon are utilized as embedded green sheets. However, this is not limitative. A separately formed embedded green sheet may be fitted in the through holes corresponding to the cavity formed in the ceramic green sheets 165 to 169. From the standpoint of productivity, however, utilization of the portions 165b to 169b separated by the cuts 165a to 169a as embedded green sheets is advantageous.

The ceramic green sheet 163 in contact with the ceramic green sheet 162 constituting the cavity bottom has its portion corresponding to the cavity removed therefrom to form a through hole 163a, and a shrinkage suppression green sheet piece 170a having a shape corresponding to the through hole 163a is fitted and buried in the through hole.

The shrinkage suppression green sheet piece 170a is obtained by being punched out so as to have a shape substantially conforming to the shape of the through hole 163a. The punching-out of the shrinkage suppression green sheet can be performed in the same manner as in the sixth embodiment, for example. The shrinkage suppression green sheet piece 170a is formed of a material not shrunk at the firing temperature of the ceramic green sheets 161 to 169, such as tridymite or cristobalite, or of a composition containing quartz, molten quartz, alumina, mullite zirconia, aluminum nitride, boron nitride, magnesium oxide, silicon carbide, etc. The shrinkage suppression green sheet piece 170a is disposed in contact with the ceramic green sheet (ceramic green sheet 162 in this case). The firing step is performed under these conditions to suppress shrinkage of the ceramic green sheet 162 in the in-plane direction.

The ceramic green sheet 164 in contact with the ceramic green sheet 163 has its portion corresponding to the cavity removed therefrom to form a through hole 164a, and a burnable sheet piece 171a and a shrinkage suppression green sheet piece 172a each having a shape corresponding to the through hole 164a are fitted and buried in the through hole. This is shown in detail in FIG. 45.

As shown in FIG. 45(a), a ceramic green sheet 164 is formed and, as shown in FIG. 45(b), the portion of the ceramic green sheet corresponding to the cavity is punched out to form a through hole 164a. As shown in FIG. 45(c), a ceramic green sheet 172 is formed and, as shown in FIG.

45(*d*), a ceramic green sheet piece 170*a* punched out so as to have a shape substantially conforming to the shape of the through hole is formed. Similarly, as shown in FIG. 45(*e*), a burnable sheet 171 is formed and, as shown in FIG. 45(*f*), it is punched out to form a burnable sheet piece 171*a* having a shape substantially conforming to the through hole 164*a*. Subsequently, as shown in FIG. 45(*g*), the burnable sheet piece 171*a* and shrinkage suppression green sheet piece 172*a* are fitted in the order mentioned and buried in the through hole 164*a*. Preferably, the total thickness of burnable sheet piece 171*a* and shrinkage suppression green sheet piece 172*a* conforms substantially to the thickness of the ceramic green sheet 164.

In the present embodiment, it is necessary to pay attention to the sizes of the through hole 163*a*, shrinkage suppression green sheet 170*a*, through hole 164*a* and cuts 165*a* to 169*a*. Specifically, when the ceramic green sheets 163 to 169 have been laminated on the ceramic green sheet 162 constituting the bottom of the cavity, at at-least the portion where the conductive pattern 112 is disposed, the shapes of the respective through holes and cuts are controlled so that the end face of the shrinkage suppression green sheet piece 170*a* (wall surface of the through hole 163*a* of the ceramic green sheet 163) may be positioned outside the end faces of the ceramic green sheet piece 172*a* and the portions 165*b* to 169*b* separated by the cuts 165*a* to 169*a*.

The burnable sheet 171 (burnable sheet piece 171*a*) is formed of a material burnt down at the firing temperature of the ceramic green sheets 161 to 169, such as a resin material. Particularly preferably, the organic binder contained in the ceramic green sheets 161 to 169 is used as the material for the burnable sheet 171 (burnable sheet piece 171*a*). By so doing, the burnable sheet 171 (burnable sheet piece 171*a*) is burnt down with exactitude in the firing step. While the burnable sheet piece 117*a* may be formed through punching the burnable sheet out as described above, it may be formed by the printing method, etc.

The multilayer body having these sheets laminated is in a state shown in FIG. 44(*a*), in which the shrinkage suppression green sheets 173 and 174 are laminated, respectively, on the opposite surfaces of the multilayer body having the plural ceramic green sheets 161 to 169 laminated, thereby suppressing shrinkage of the entire multilayer body in the in-plane direction. On the surface of the ceramic green sheet 162, the conductive pattern 112 is disposed as straddling the periphery of the cavity bottom. In addition, the shrinkage suppression green sheet piece 170*a* disposed in the through hole 163*a* of the ceramic green sheet 163 is in contact with the region of the ceramic green sheet 162 constituting the cavity bottom, thereby suppressing shrinkage of this portion in the in-plane direction.

Though the space corresponding to the cavity is ordinarily formed as a space (concave) at this stage, in the production method of this embodiment, the ceramic green sheet piece 172*a*, portions 165*b* to 169*b* separated by the cuts 165*a* to 169*a* and embedded ceramic green sheet piece 175 are disposed as the embedded green sheets. When seeing the entire shape of the multilayer body, the multilayer body is formed as that flat without any concave.

The multilayer body having the ceramic green sheets 161 to 169 and shrinkage suppression green sheets 173 and 174 laminated is to be pressed in the pressing step preparatory to the firing step. At this time, when the multilayer body is formed with a concave corresponding to the cavity, the concave will possibly collapse to deform the opening of the cavity. In the present embodiment, however, since the multilayer body fabricated is uniform in thickness in the lamination direction and flattened over the entire thereof inclusive of the cavity portion owing to the presence of embedded green sheets, an ordinary flat mold die can be used to press the multilayer body. Thus, the pressing step can be performed with a simple means. While pressure is applied with the multilayer body sandwiched between the flat mold dies, as described above, the multilayer body coated with waterproof resin, etc. may be subjected to isostatic pressing.

After the firing step subsequent to the pressing step, as shown in FIG. 44(*b*), the ceramic green sheets 161 to 169 are converted to ceramic layers 102 to 110. At the time of firing, since the ceramic green sheets 161 to 169 bound by the shrinkage suppression green sheets 173 and 174 laminated thereon, they are shrunk only in the width direction and are seldom shrunk in the in-plane direction. The ceramic green sheet 162 exposed to the cavity bottom is also suppressed from being shrunk in the in-plane direction.

In addition, the burnable sheet piece 171*a* intervening between the embedded green sheets (ceramic green sheet piece 172*a*, portions 164*b* to 169*b* of the ceramic green sheets 164 to 169 separated by the cuts 164*a* to 169*a* and embedded ceramic green sheet piece 175) and the shrinkage suppression green sheet piece 170*a* is burnt down before the ceramic green sheets 161 to 169 are sintered. As a result, the binding force of the shrinkage suppressing green sheet piece 170*a* disposed on the cavity bottom is not exerted on the embedded green sheets to shrink the embedded green sheets in the in-plane direction. A fired body 176 protrudes from the fired multilayer body as shown in FIG. 44(*b*) because the shrinkage in the thickness direction is small. Since the binding force is not exerted, as described above, the embedded green sheets are shrunk and consequently no stress is applied to the shrinkage suppression green sheet piece 170*a* and also to the ceramic green sheet 162 immediately under it. The flatness of the ceramic layer 103 formed as a consequence of firing of the ceramic green sheet 162 is not deteriorated.

Upon completion of the firing, the fired body 176 of the embedded green sheets is removed from the cavity space as shown in FIG. 44(*c*). The fired body is separated from the shrinkage suppression green sheet piece 170*a* because the burnable sheet piece 171*a* is burnt down and, therefore, can easily be removed by, for example, turning the fired multilayer body upside down.

Finally, residuals 177 of the fired shrinkage suppression green sheets 173 and 174 and the fired shrinkage suppression green sheet piece 170*a* are removed to complete a multilayer substrate 101 having a cavity 111 as shown in FIG. 44(*d*). The residuals 176 can be removed with ease by some sort of cleaning step. The removal can be attained by stimulus of a degree by ultrasonic cleaning, for example. Thus, as the cleaning step, the step of ultrasonic cleaning in a solvent will suffice. When alumina-based green sheets are used as the shrinkage suppressing green sheets, however, the residuals 176 do not exfoliate spontaneously. Therefore, the residuals 76 are to be removed through polishing and cleaning by a wet blasting step.

The multilayer ceramic substrate 101 thus fabricated is excellent in dimensional accuracy and in flatness of the cavity bottom and has no deformation, such as by collapse of the cavity opening or bulge formation around the cavity opening. Furthermore, since the shrinkage of the lower end of the sidewall of the cavity 111 is suppressed, disconnection of the conductive pattern 112 otherwise made by the shrinkage can be suppressed.

The eleventh embodiment of the present invention is directed to the application of burnable sheets to a production method of a multilayer ceramic substrate having a cavity of multistage structure (two-step structure). FIG. 46 shows this embodiment. As shown in FIG. 46(a), shrinkage suppression green sheets 182 and 183 are laminated on the opposite surfaces of a multilayer body 181 of ceramic green sheets, and shrinkage suppression green sheet pieces 184 and 185 and burnable sheet pieces 186 and 187 are disposed respectively on the cavity bottom and step bottom, with embedded green sheet 188 filled in the cavity. The multilayer body in this state is subjected to pressing and firing steps. Also in this embodiment, since flatness of the multilayer body is maintained, the pressing step is easy to perform. This embodiment does not adopt the step of compensating the embedded green sheet 188 corresponding to the sheet on which the burnable sheet 187 is disposed to have a small thickness.

After the firing step, as shown in FIG. 46(b), a fired boy 189 of embedded green sheets protrudes from a fired multilayer body and can easily be removed such as by turning the fired multiplayer body upside down. A multilayer ceramic substrate 190 obtained is as shown in FIG. 46(c) and is excellent in dimensional accuracy as a whole and, furthermore, the bottom 191a and step surface 191b of the cavity 111 are excellent in dimensional accuracy and flatness. Moreover, disconnection of a conductive pattern 152 accompanied by the shrinkage of the region around the cavity in the surface direction can be suppressed. In the cavity of two-step structure, an electronic device is mounted on the bottom 191a, and the conductive pattern connected to the electronic device with bonding wires is provided on the step surface 191b.

The twelfth embodiment of the present invention adopts the disposition of the first cavity formation ceramic layers and second cavity formation ceramic layers having through holes of the same shape in which a layer is shifted so that the through holes partially overlap each other. In the sixth to eleventh embodiments, the opening area of the through holes in the first cavity formation ceramic layers has been made larger than that of the second cavity formation layers. In the present embodiment, however, at at-least part of the periphery of the cavity bottom overlapping a conductive pattern, insofar as the through hole wall surface of the first cavity formation ceramic layer is disposed outside the through hole wall surface of the second cavity formation ceramic layer, the dimensional relationship and shapes of the through holes can be made arbitrary.

A multilayer ceramic substrate of the present embodiment will be described citing a multilayer ceramic substrate 201 shown in FIGS. 47(a) and 47(b) in which a conductive pattern 112 is disposed on only one side of the periphery of the bottom 111a of a square cavity 111 as straddling the one side.

In producing the multilayer ceramic substrate 201, as shown in FIG. 48, a first composite green sheet 211 (first cavity formation green sheet) is formed in the composite green sheet formation step S12 so that the shape of a first fitting sheet 212 (shrinkage suppression sheet piece) may conform to the shape of the inside portion (embedded green sheet) 130a of the cut in a cut formation sheet 130 laminated thereon.

In the laminating step S16, a shrinkage suppression green sheet 122, ceramic green sheet 121, cavity bottom formation green sheet 132, first composite green sheet 211, plural cut formation sheets 130 and uppermost composite green sheet 129 are laminated in the order mentioned to obtain a multilayer body. At this time, the first composite green sheet 211 and the cut formation green sheet 130 are laminated to the effect that the first fitting sheet 212 and the embedded green sheet 130a disposed immediately thereon are shifted to have an overlapping portion so that the end face of the first fitting sheet 212 (shrinkage suppression green sheet piece) may be disposed outside the end face of the inside portion (embedded green sheet) 130a of the cut in the cut formation green sheet 130 laminated immediately thereon at at-least the portion of the first fitting sheet 212 overlapping a conductive pattern 112.

Thereafter, the firing step S2, cavity formation step S3 and shrinkage suppressing sheet removal step S4 are taken in the same manner as in the sixth embodiment. In the multilayer ceramic substrate 201 obtained, the through hole 202a of the ceramic layer 202 has the same shape as the through hole 105a of the ceramic layer 105 and, at the same time, the through holes 202a and 105a are disposed as shifted from each other in a partially overlapped fashion. Thus, the state is realized in which the wall surface of the through hole 202a of the ceramic layer 202 at the portion corresponding to the conductive pattern 112 is positioned outside the wall surface of the through hole 105a of the ceramic layer 105.

The thirteenth embodiment of the present invention is directed to a multilayer ceramic substrate having on the surface of a conductive pattern of the portions corresponding to the periphery of the cavity bottom a softening layer that gets soft at the firing temperature in the firing step.

FIG. 49(a) to FIG. 49(d) show the simplest model of a multilayer ceramic substrate 401 having a cavity 411 and comprising plural (nine here) ceramic layers 402 to 410 stacked and integrated. Of the ceramic layers 402 to 410, two lower layers 402 and 403 are flat ceramic layers provided with no through hole for formation of a cavity. Of these, the upper ceramic layer 403 corresponds to a cavity bottom formation ceramic layer, and part of the upper surface thereof is exposed to the bottom portion of the cavity 411 to constitute a bottom 411a of the cavity.

The remaining ceramic layers 404 to 410 stacked on the ceramic layer 403 are formed with through holes 404a to 410a, respectively, for defining the sidewall of the cavity 411 and correspond to cavity formation ceramic layers. The bottom 411a constituted by the ceramic layer 403 and the sidewalls of the through holes 404a to 410a of the ceramic layers 404 to 410 made contiguous define the cavity 411 as a prescribed space. The shape of the opening of the cavity is the same as that of the first embodiment.

A conductive pattern 412 is formed on the surface of the ceramic layer 403 as straddling the periphery of the bottom 411a of the cavity 411 and has one end thereof exposed to the bottom 411a of the cavity 411 and connected to an electronic device to be accommodated within the cavity 411. The other end of the conductive pattern 412 is disposed between the ceramic layers 403 and 404 and connected to an internal electrode or wiring formed inside the multilayer ceramic substrate 411. FIG. 49 shows the case where on each of the two opposed sides of the square cavity seen from top two strips of conductive patterns 412, i.e. four in total, are provided. The number and shape of the conductive patterns are made optional. There is a case where the bottom 411a of the cavity 411 is provided with a via hole for heat radiation.

In the multilayer ceramic substrate 401 of the present embodiment, at least on the surfaces of the conductive patterns 412 of the portion corresponding to the periphery of the bottom of the cavity 411, a softening layer 413 is disposed. The softening layers 413 shown in FIG. 46 rim in the form of a strap the two sides on which the conductive patterns are disposed.

The softening layer 413 is formed of a material that gets soft at a firing temperature used for obtaining a multilayer ceramic substrate 401 through the steps of lamination, pressing and firing of various kinds of ceramic green sheets. The interposition of the softened layer between the conductive pattern 412 and the cavity formation and cavity bottom formation green sheets that become the cavity formation ceramic layers 404 to 410 in the firing step enables stress applied to the ceramic layer and conductive layer by the shrinkage of the cavity formation green sheets to be alleviated, thereby suppressing disconnection of the conductive pattern 412.

The softening layer is formed of a material required to get soft at the firing temperature in the firing step for obtaining a multilayer ceramic substrate 401 and preferably not reacting with the ceramic layers. As the material, for example, glass can be used. Particularly, use of the glass of the same kind of glass contained in the ceramic layers 402 to 410 is preferred. Examples thereof include borosilicate glass, barium borosilicate glass, strontium borosilicate glass, zinc borosilicate glass and potassium borosilicate glass.

It is desirable that the width of the softening layer 413 outside the cavity 411 be so secured as to suppress disconnection of the conductive pattern 412. Specifically, the distance A1 between the periphery of the bottom 411a of the cavity 411 and the outside edge of the softening layer is preferably in the range of 0.1 mm to 0.5 mm.

The width of the softening layer 413 inside the cavity 411 is desired to be as small as possible from the standpoint of securing the flatness of the bottom 411a of the cavity 411 in the ceramic layer 403. To be concrete, the distance A2 between the periphery of the bottom 411a of the cavity 411 and the inside edge of the softening layer 413 can be set to 0.5 mm or less (excluding 0 mm), for example. In order to reliably suppress disconnection of the conductive pattern 412, the distance A2 is preferably in the range of 0.05 mm to 0.5 mm and more preferably in the range of 0.1 mm to 0.5 mm.

The thickness of the softening layer 413 is too small to possibly allow the effect of suppressing disconnection of the conductive pattern 412 to become insufficient and too large to possibly interfere with the lamination of the substrate green sheets.

A multilayer ceramic substrate fabricated by each production method described later has a cavity of a specific shape. Specifically as is typically shown in FIG. 50, the opening area of the inside is larger than that of the opening close immediately to the shrinkage compression green sheet to form a drum-shaped cavity.

The description on this point will be given in more detail. In the cavity 411, the opening dimension W1 at an opening 411b is smaller than the opening dimension W2 at a position midway in the depth direction of the cavity 411. In other words, the opening area at the opening 411b of the cavity 411 is smaller than the opening area at the position 411c midway in the depth direction of the cavity 411. In this example, the opening area of the cavity 411 is gradually increased up to the position 411c midway in the depth direction of the cavity and then gradually decreased and, thus, the inner wall of the cavity 411 assumes a substantially circular arc in cross section. Thus, the portion of the cavity midway in the depth direction is bulged out to shape a drum-shaped cavity.

The multilayer ceramic substrate 401 having the cavity 411 of the shape described above has a great merit in terms of reliability owing to its shape specificity. As shown in FIG. 51, for example, when an electronic device 440 is mounted within the cavity 411 and sealed with a resin J, the opening dimension at the opening 411b of the cavity 411 is smaller than that of the cavity inside, the resin J filled in the cavity will not fall off at all. As described earlier, in the seal with the resin J relative to the conventional shape, the problem will arise in that the resin sealed exfoliates and falls off, resulting from the difference in thermal expansion coefficient between the ceramic layers 402 to 410 constituting the multilayer ceramic substrate 401 and the resin J used for the seal. This problem becomes conspicuous particularly when a temperature change is repeated over a long period of time. In the multilayer ceramic substrate 401, since the opening area at the opening 411b of the cavity 411 is smaller than the opening area of the portion at the position 411c midway in the depth direction of the cavity 411, the resin J filled and hardened in the cavity 411 cannot pass through the opening 411b of the cavity 411 because of the larger area of the inside of the cavity and is retained within the cavity 411.

The multilayer ceramic substrate 401 having the configuration described above is formed through the production process performed. The production process of the multilayer ceramic substrate in the present embodiment will be described.

Also in the present embodiment, the non-shrinkage firing process is adopted, and the pressing and firing steps are performed, with the embedded green sheet disposed in a space corresponding to the cavity to eliminate collapse etc. at the pressing step in the same manner as in the first embodiment. The step flowchart in the production process is pursuant to that shown in FIG. 2.

To be specific, in the green sheet formation step (S11) shown in FIG. 2, a ceramic green sheet (green sheet for a substrate) 421 shown in FIG. 52(a) and a shrinkage suppression green sheet 422 shown in FIG. 52(b) are formed. Generally, these sheets 421 and 422 are formed as being in intimate contact with the surface of a support 423 that is a plastic sheet etc. The method of formation of the sheets 421 and 422 is the same as that in the first embodiment.

After the fabrication of the ceramic green sheet 421 and shrinkage suppression green sheet 422, a composite green sheet (green sheet combining the ceramic green sheet with the shrinkage suppression green sheet) is fabricated utilizing the two sheets in the composite green sheet formation step (S12). The composite green sheet fabricated here comprises a first composite green sheet 426 laminated immediately on the green sheet for formation of the cavity bottom and an uppermost composite green sheet laminated as an uppermost shrinkage suppression green sheet. To fabricate the first composite green sheet 426, as shown in FIG. 53(a), first, the ceramic green sheet 421 produced in the green sheet formation step (S11) is formed with a first through hole 424.

The shrinkage suppression sheet 422 produced in the green sheet formation step (S11) is placed on the support 423 and cut into the same shape as the first through hole 424 to obtain a first fitting sheet 425 (corresponding to the shrinkage suppression green sheet piece). The cut first fitting sheet 425 is fitted in the first through hole 424 to form a first composite green sheet 426. At this time, in order to make the first composite green sheet 426 flat, preferably, the thickness of the ceramic green sheet 421 is the same as that of the first fitting sheet 425.

An uppermost composite green sheet 429 is produced in accordance with the same production method as that of the first composite green sheet 426. In the uppermost composite green sheet 429, as shown in FIG. 53(b), the shrinkage suppression green sheet 422 is formed with a through hole in which a ceramic green sheet piece is fitted. To be specific, the shrinkage suppression green sheet 422 produced in the green sheet formation step (S11) is formed with a second through hole 427 corresponding to the opening of the cavity. The production method of the second through hole 427 is the same as that of the first through hole 424. The ceramic green sheet 421 produced in the green sheet formation step (S11) is placed on the support 423 and cut into the same shape as the second through hole 427 to obtain a second fitting sheet 428.

The cut second fitting sheet 428 is fitted in the second through hole 427, and the resultant composite sheet is allowed to exfoliate from the support 423 to form an uppermost composite green sheet 429. Also in this case, in order to make the uppermost composite green sheet 429 flat, preferably, the thickness of the shrinkage suppression green sheet 422 is the same as that of the second fitting sheet 428.

In the cut formation step (S13), the ceramic green sheet 421 is formed with a cut to be used as a cavity formation green sheet. Specifically, in the cut formation step (S13), the ceramic green sheet 421 produced in the green sheet formation step (S11) is formed with a cut (or a discontinuous portion) 431 to form a cut formation sheet 430 as shown in FIG. 54. The cut 431 indicates the discontinuous portion pierced in the direction of the thickness of the ceramic green sheet 421. Incidentally, the discontinuous portion includes what is not pierced in the sheet width direction. The cut 431 is formed at the same position and in the same shape as the first through hole 424 to overlap the first through hole 424 when the first composite green sheet 426 previously prepared has overlapped the cut formation sheet 430. The cut 431 may be formed by punching out a predetermined portion of the ceramic green sheet 421, with the ceramic green sheet 421 in intimate contact with the surface of the support 423, with a die of a puncher or using a laser beam or with a microdrill or by punching.

In the cut formation step (S13), the cut may be inserted into the ceramic green sheets 421 one by one or together in a lump. In either case, in the cut formation sheets 430, the inside portions 430a separated by the cuts 431 are left intact and utilized as embedded green sheets in the laminating and firing steps.

The first composite green sheet 426, cut formation sheets 430 (cavity formation green sheets) and ceramic green sheet constituting the bottom of the cavity (cavity bottom formation green sheet) that are ceramic green sheets constituting the ceramic layers of a multilayer ceramic substrate after being fired (hereinafter referred to collectively as "dielectric layer sheets") are provided with a via hole, via electrode, internal electrode pattern, etc. Via electrode paste is filled and solidified by the stopgap printing, for example, to form a via electrode. Internal electrode paste is applied onto the ceramic green sheet, for example, in a prescribed pattern by the screen printing to form an internal electrode pattern.

Specifically, in the via hole formation step (S14), a via hole for forming a via electrode therein is formed in the dielectric layer sheet. In the conductor-printing step (S15), conductive paste is filled in the via hole formed in the via hole formation step (S14) to form a via electrode. Also in the conductor-printing step (S15), an internal electrode pattern is printed in a prescribed pattern on the surface of the dielectric layer sheet. In the conductor-printing step (S15), an internal electrode pattern (conductive pattern) is formed on the surface of the substrate green sheet. As shown in FIG. 55, for example, conductive patterns 412 are formed on the surface of the ceramic green sheet 421 as straddling the periphery (shown by dashed line in FIG. 55) of the region constituting the bottom 411a of the cavity 411.

In the softening layer formation step, a softening layer 413 is formed on part of the substrate green sheets having the conductive patterns 412 formed in the conductor-printing step (S15). The softening layer 413 is formed at least on the surfaces of the conductive patterns 412 of the portion corresponding to the periphery of the bottom 411a of the cavity 411 in the multilayer ceramic substrate 401 fired. In FIG. 55, the softening layers 413 rim the two sides of the periphery (shown by dashed line) of the region constituting the bottom of the cavity 411 after being fired, on which sides the conductive patterns 412 are disposed.

The softening layer 413 may be formed of any material that gets soft at the firing temperature at which the firing step (S2) described later is performed. It is also important that the material of the softening layer 413 does not adversely affect the conductive pattern 412 and substrate green sheet. As the favorable material, glass can be cited. Use of the same glass as contained in the substrate green sheets as the softening layer 413 is most preferable.

After the via electrode or internal electrode pattern is formed on each dielectric layer sheet and the softening layer 413 is formed, the thus fabricated sheets are laminated in the laminating step (S16) to form a multilayer body 433. The configuration of the multilayer body from the laminating step (S16) to the shrinkage suppression sheet removal step (S4) is shown in FIG. 56(a) to FIG. 56(d). Incidentally, the step shown in FIG. 56(c) and the step shown in FIG. 56(d) may be performed inversely or simultaneously.

In the laminating step (S16), as shown in FIG. 56(a), a shrinkage suppression green sheet 422, ceramic green sheet 421, cavity bottom formation green sheet 432, first composite green sheet 426, cut formation sheet 430 and uppermost composite green sheet 429 are laminated in the order mentioned from the lowermost layer.

After the laminating step (S16), the pressing step (S17) is performed. The pressing step (S17) is a press-on step for the multilayer body 433 produced in the laminating step (S16). The press-on step is performed, with the multilayer body placed in an ordinary die having upper and lower flat punches. The preferable conditions of the press-on step include a pressure of 30 to 80 MPa and a period of around 10 minutes. In the present embodiment, since the uppermost and lowermost layers of the multilayer body 433 are flat and further since the portion 430a separated by the cut 431 is left intact and filled in the portion where the cavity is formed, pressure in the pressing step can be applied uniformly. Therefore, there is no case where the opening of the cavity is deformed by collapse or damaged by the pressure applied as in the prior art.

The firing step (S2) is then performed, in which the multilayer body 433 pressed on in the pressing step (S17) is fired. The multilayer body 433 is subjected to debinder treatment before the firing step. The conditions of the debinder treatment may be generally adopted ones. The firing step is then performed to form a fired multilayer body 434. The atmosphere in the firing step is not particularly restricted. When a base metal, such as nickel or nickel alloy, is used for the via electrode and internal electrode pattern, the atmosphere is preferred to be a reduction atmosphere. The firing temperature is preferred to be in the range of 800° C. to 1000° C. As a consequence, the conductive material and resistance material can be fired at the same time, and the multilayer ceramic substrate subsequently obtained can be used for LTCC modules including high-frequency superposed modules, antenna switch modules, filter modules, etc.

In the fired multilayer body 434 having undergone the firing step (S2), as shown in FIG. 56(b), the portion 430a of the cut formation sheet 430 inside the cut 431 projects from the cavity. The reason therefor is as follows. When the multilayer body 433 is fired, the ceramic green sheet 421, cavity bottom formation sheet 432, first composite green sheet 426 and cut formation sheet 430 that are the dielectric layer sheets are sintered and intended to shrink. At this time, the ceramic green sheet 421 is in intimate contact with the lower shrinkage suppression green sheet 422. Since the shrinkage suppression green sheet 422 does not shrink at the firing temperature of the dielectric layer sheets, as described earlier, the shrinkage of the ceramic green sheet 421 in the plane surface direction is suppressed. Since the portion 430b of the cut formation sheet 430 outside the cut 431 is in intimate contact with the uppermost composite green sheet 429, the shrinkage thereof is also suppressed. In addition, since the cavity bottom formation green sheet 432 is in intimate contact with the first fitting sheet 425 of the first composite green sheet 426 at the cavity bottom, the shrinkage thereof is similarly suppressed.

On the other hand, the portion 430a of the cut formation sheet 430 inside the cut 431 is not provided on the upper side thereof with a shrinkage suppression sheet, the shrinkage thereof is not suppressed. Thus, the inside portion 430a of the cut 431 is shrunk in the plane surface direction to separate from the outside portion 430b of the cut 431. The degree of this shrinkage is larger toward the upper layer from the first fitting sheet 425 on the cavity bottom, and the degree of shrinkage in the thickness direction is made smaller by the amount of the inside portion 340a of the cut 431 shrunk in the plane surface direction. Therefore, the first fitting sheet 425, second fitting sheet 428 and the portion sandwiched between the two sheets (inside portion 430a of the cut 431) after being fired project from the surface of the fired multilayer body 434.

In the present embodiment, since the softening layer that has got soft at the firing temperature at which the firing step (S2) is performed is interposed between the conductive pattern 412 and the cavity formation green sheet constituting the lower end of the sidewall of the cavity 411a (ceramic green sheet 421 constituting the first composite sheet 426). When the cavity formation green sheet shrinks in the direction apart from the center of the cavity, therefore, it is moved as being slid on the surface of the softening layer that has got soft. For this reason, the stress exerted on the conductive pattern 412 is alleviated to suppress disconnection of the conductive pattern 412.

Of the periphery of the cavity bottom, since two sides on which no conductive pattern 412 exists have no softening layer 413, they are greatly shrunk in the in-plane direction, but do not adversely affect the conductive pattern 412 exposed to the cavity bottom.

As described earlier, the first fitting sheet 425, second fitting sheet 428 and the portion sandwiched between the two sheets (inside portion 430a of the cut 431) are brought to the state of shrinkage different from that of the portion 430b of the ceramic green sheet 421 and cut formation sheet 430 outside the cut 431. For example, the portion 430a of the cut formation sheet 430 inside the cut 431 is completely separated from the outside portion 30b. Also at the cavity bottom, the first fitting 425 is made fragile by the firing and the binding force at this portion becomes weak. As shown in FIG. 56(c), therefore, the first fitting sheet 425, second fitting sheet 428 and the portion sandwiched between the two sheets (inside portion 430a of the cut 431) filled in the cavity are enabled to fall off with a slight stimulus. Even in the case of the cavity having a complicated shape, the inside portion 430a of the cut 431 is enabled to fall off. In order to cause the inside portion 430a of the cut 431 to fall off, a small force may be exerted onto it.

Specifically, as shown in FIG. 56(c), the first fitting sheet 425, second fitting sheet 428 and the portion sandwiched between the two sheets (inside portion 430a of the cut 431) are removed to form the cavity and, at the same time, the shrinkage compression sheet removal step (S4) is performed when necessary. In the step (S4), the uppermost sheet 435 and the lowermost sheet 436 of the fired multilayer body 434 (shrinkage compression green sheet 422 and uppermost composite green sheet 229 that have been fired) are removed. The removal method comprises subjecting the fired multilayer body 434 to ordinary ultrasonic washing in a solvent or wet blasting. When the shrinkage suppression green sheet 422 is formed of a tridymite-silica-based material or cristobalite-silica-based material, since the major parts of the uppermost sheet 435 and lowermost sheet 436 after the firing exfoliate spontaneously, washing of the slightly remaining part will suffice.

Besides the steps described above, a cutting step, a polishing step, etc. are performed as occasion demands to obtain the multilayer ceramic substrate 401 shown in FIG. 49. The cutting step includes division with a diamond scriber and, when the fired multilayer body is thick, cutting by a dicing system. The polishing step is performed through the lapping process, for example. lapping process is a processing method for buffing the object to be processed using a processed liquid containing abrasive coating, with abrasive coating not contained in a rotary bed. Use of a wet barrel is also available.

An electronic device 440 is mounted on the multilayer ceramic substrate 401 produced. The state of the electronic device 440 mounted on the substrate is shown in FIG. 57. As shown in FIG. 57, the electronic device 440 is accommodated in the cavity 411 of the multilayer ceramic substrate 401. The backside of the electronic device 440 is connected to the conductive patterns 412 exposed to the cavity bottom. The electronic device is further connected to electrodes (not shown) formed on the multilayer ceramic substrate 401 with bonding wires 441. The electrodes include surface electrodes and via electrodes printed on the surface of the multilayer ceramic substrate 401 and internal electrodes printed inside the multilayer ceramic substrate 401. The multilayer ceramic substrate thus fabricated by the method of the present embodiment permits accommodation of an electronic device therein and satisfies the demand of making the substrate small in size and height.

The fourteenth embodiment of the present invention is directed to a softening layer formed so as to rim the entire periphery of the cavity bottom.

In the thirteenth embodiment, since there is no concern that disconnection of the conductive pattern 412 arises at the sides of the periphery of the bottom 411a of the cavity 411 on which no conductive pattern 412 exists, no softening layer exists on the sides. For this reason, the bottom 411a of the cavity 411 corresponding to the sides is strongly bound by the first fitting sheet 425 and, as a result, a large stress is generated at the boundary between the bottom 411a of the cavity 411 and the outside of the bottom. When an internal electrode pattern is interposed between the lower ceramic layers of the sidewalls of the cavity 411, for example, there is a possibility of the internal electrode pattern being disconnected.

In the present embodiment, the shape of the softening layer 413 is in the form of a frame, for example, to rim the entire periphery of the bottom of the cavity 411. As shown in FIG. 58, in the multilayer ceramic substrate 445 of the present embodiment, the softening layer 413 is disposed on the entire periphery of the bottom of the cavity 411 including the portion of the cavity 411 provided with no conductive pattern 412, i.e. along the lower end of the sidewall of the cavity 411. The softening layer 413 is disposed between the ceramic layers 403 and 404.

To obtain the multilayer ceramic substrate 445 shown in FIG. 58, the softening layer 413 is formed so as to rim the entire periphery of the region that becomes the bottom of the cavity 411 after being fired, thereby forming the bottom formation green sheet 432.

In the multilayer ceramic substrate 445, the softening layer 413 is formed also on the portion of the periphery of the bottom 411a of the cavity 411 provided with no conductive pattern 412. In the portion of the periphery of the bottom 411a of the cavity 411 provided with no conductive pattern 412, therefore, the softening layer 413 alleviates the stress exerted on the bottom formation green sheet, resulting in suppression of disconnection of the internal electrode pattern disposed on the lower portion of the sidewall of the cavity.

FIG. 59 shows an example in which conductive patterns 412 are provided on all sides of the periphery of the cavity 411 having a square opening. Also in this example, a softening layer 413 is formed to rim the entire periphery of the bottom 411a of the cavity 411. In the multilayer ceramic substrate, as shown in FIG. 60, the conductive pattern 412 may be formed on the entire bottom of the cavity. In either case, disconnection of the conductive pattern 412 exposed to the cavity bottom or the internal electrode pattern can reliably be suppressed.

The fifteenth embodiment of the present invention will now be described. The difference thereof from the thirteenth embodiment is to form the cavity into a multistage cavity (two-step cavity with two bottoms in this case).

A multilayer ceramic substrate having a two-step cavity with two bottoms will be described hereinafter with reference to FIG. 61. The multilayer ceramic substrate 450 shown in FIG. 61 has a cavity 451 with two bottoms and comprises plural (14 here) ceramic layers laminated and made integral. A ceramic layer 403 corresponds to the cavity bottom formation ceramic layer and a part thereof is exposed to the cavity bottom to constitute the deepest bottom 451a of the cavity 451 with two bottoms. Of the ceramic layers constituting the multilayer ceramic substrate 450, the configuration of the ceramic layers 402 to 409 is substantially the same as that of the thirteenth embodiment. Part of the ceramic layer 410 constitutes a second-step bottom 451a of the cavity 451 with two bottoms. Therefore, the ceramic layer 410 corresponds to a cavity bottom formation ceramic layer. The surface of the ceramic layer 410 is provided thereon with a conductive pattern 452.

The ceramic layers 453 to 457 laminated on the ceramic layer 410 are provided with through holes 453a to 457a and correspond to cavity formation ceramic layers. The sidewalls of the through holes 453a to 457a of the ceramic layers 453 to 457 made contiguous define the shallower space of the two-step cavity 451.

The multilayer ceramic substrate 450 of the present embodiment, when a conductive pattern 452 is formed on the second bottom 451b as straddling the periphery of the bottom 451b, a second softening layer 458 is disposed at least on the surface of the conductive pattern 452 of the periphery of the bottom 451b.

In fabricating the multilayer ceramic substrate of the present embodiment, a first composite green sheet is disposed on the deepest bottom of the cavity, a second composite green sheet is disposed on the second bottom (step surface) and the cut formation sheets having through holes different in size from each other to conform to the dimensions of the multistage cavity portions are laminated thereon.

FIG. 62 shows the detailed shape of the cavity of the multilayer ceramic substrate shown in FIG. 61. Here, in the sidewall of each of the cavity portions 451c and 451d, the shrinkage in the surface direction gradually increases with an increasing distance from the shrinkage suppressing green sheet, and the opening size at each opening is smaller than that at a position midway in the depth direction. In the cavity portion 451c, when the opening size at the opening is denoted by W3 and the opening size at a position midway in the depth direction by W4, W3<W4. Similarly, in the cavity portion 451d, when the opening size at the opening is denoted by W5 and the opening size at a position midway in the depth direction by W6, W5<W6. The cross-sectional shape of the sidewall of each of the cavity portions 451c and 451d is a circular arc and, therefore, the shape of each of the cavity portions 451c and 451d assumes a pot or urceolate shape.

The second and subsequent step cavity portions (cavity portion 451d here) do not always assume a pot or urceolate shape, but may be of a shape having the largest opening area and gradually reducing the opening area toward the depth direction as shown in FIG. 63. In this case, when the opening size at the opening is set to be W5 and the opening size at a position midway in the depth direction to be W6, W5>W6. The first step cavity portion 451c assumes a pot or urceolate shape, whereas the second step cavity portion 451d assumes a shape of bowl. By making the second and subsequent cavity portions bowl-shaped, wire bonding in mounting an electronic device on the cavity portion 451d is ready to perform, thereby enabling efficient device mounting.

In the multistage cavity 451 of the multilayer ceramic substrate 450, since at least the first step cavity portion 451c has a shape of a drum having the opening area larger at the inside than at the opening, reliable resin-seal in the cavity portions 451c and 451d can be secured.

A production method of the multilayer ceramic substrate 450 having the configuration described above will be described. The difference thereof from the thirteenth embodiment is to form the cavity into a multistage cavity (two-step cavity with two bottoms in this case). To be specific, the different points in step are to dispose a first composite green sheet on the deepest bottom of the cavity, dispose a second composite green sheet on the second step bottom (step surface) and laminate the cut formation sheets having through holes different in size from each other.

In the present embodiment, a second composite green sheet 443 shown in FIG. 64(a) is formed in the composite green sheet formation step (S12). In producing the second composite green sheet 443, the ceramic green sheet 421 produced in the green sheet formation step (S11) is formed with a third through hole 444 that overlaps the first through hole 424 and is larger than the first through hole 424. The formation method of the third through hole 444 is the same as the formation method of the first through hole 424.

The shrinkage suppression green sheet 422 produced in the green sheet formation step (S11) is cut into substantially the same shape as the third through hole 444 to form a third fitting sheet 445, which is fitted in the third through hole 444. In addition, the third fitting sheet 445 fitted is formed with a fourth through hole 446 formed at the same position as the first through hole 424 to have substantially the same shape as the first through hole, in which fourth through hole the second fitting sheet 428 obtained by cutting the ceramic green sheet 421 into substantially the same shape as the fourth through hole 446 is fitted. A second composite green sheet 443 is thus produced.

In producing the second composite green sheet 443, a reverse procedure of first fitting the second fitting sheet 428 in the fourth through hole 446 and then fitting the third fitting sheet 445 in the third through hole 444 may be adopted.

In the present embodiment, as shown in FIG. 64(b), a cut formation sheet (second cut formation sheet 447) different from the cut formation sheet 430 in the thirteenth embodiment is formed in the cut formation step (813). The difference between the second cut formation sheet 447 and the previous cut formation sheet 430 is the size of a cut 448 that is larger than that of the cut 431. To be specific, the cut 448 in the second cut formation sheet 447 is formed at the same position and in substantially the same shape as the third through hole 444 of the second composite green sheet 443.

In the conductor-printing step (S15), as shown in FIG. 65, conductive patterns 452 are formed on the surface of the uppermost cut formation sheet 430 as straddling the periphery of the cavity bottom 451*b* to fabricate a second cavity bottom formation green sheet 453. The conductive patterns 412 are formed on the surface of the green sheet 421 in the same manner as in the thirteenth embodiment to form a bottom formation green sheet 432.

In the softening layer formation step, as shown in FIG. 65, a second softening layer 458 is formed to rim at least two sides, on which the conductive patterns 452 are formed, of the periphery (shown by dashed line) of the region constituting the second step bottom 451*b* of the cavity 411.

An example of the multilayer body 454 having the sheets laminated in the present embodiment is shown in FIG. 66(*a*). The sheets constituting the multilayer body 454 are laminated in order from below. That is to say, the shrinkage suppression green sheet 422, ceramic green sheet 421, cavity bottom formation green sheet 432, first composite green sheet 426, cut formation sheet 430, second cavity bottom formation green sheet 453, second composite green sheet 443, second cut formation sheet 447 and uppermost composite green sheet 429 are laminated in the order mentioned from the lowermost layer. Incidentally, the number of each of the shrinkage suppression green sheet 422, cavity bottom formation green sheet 432, first composite green sheet 426, second cavity bottom formation green sheet 453, second composite green sheet 443 and uppermost composite green sheet 429 to be laminated is one. Of course, plural number of each of these sheets may be laminated. The number of each of the ceramic green sheet 421, cut formation sheet 430 and second cut formation sheet 447 is determined depending on the interlayer electrode pattern configuration required for the multilayer ceramic substrate and the size of an electronic device mounted on the inside of the substrate and is generally two or more. In this example, one ceramic green sheet 421, five cut formation sheets 430 and four second cut formation sheets 447 are laminated. Of course, the number of each of these sheets is not restricted to this example, but is optional. The multilayer body 454 may also be formed with another cavity on the side of the shrinkage suppression green sheet 422, for example, besides the cavity shown in FIG. 66(*a*).

When the multilayer body 454 has been fired, a fired multilayer body 455 shown in FIG. 66(*b*) is obtained. In the fired multilayer body 455, the portion 456*a* filled in the cavity is shrunk in the surface direction to project from the cavity. The portion is removed in the same manner as in the thirteenth embodiment and, when necessary, the shrinkage suppression sheet removal step (S4) is performed to complete a multilayer ceramic substrate 450 having a two-step cavity 451 with two bottoms as shown in FIG. 61 (FIG. 62).

An example in which an electronic device 440 is mounted on the multilayer ceramic substrate 450 having the two-step cavity 451 with two bottoms is shown in FIG. 67. As shown in FIG. 67, the electronic device 440 is accommodated in a lower cavity portion and connected to the conductive pattern 412 exposed to the deepest bottom 411*a*. The electronic device 440 is also connected to the conductive pattern 452 exposed to the bottom 451*b* of the upper cavity portion with bonding wires 441. In this way, the multilayer ceramic substrate 450 fabricated by the production method of the present embodiment enables both the electronic device 440 and the bonding wires 441 to be accommodated in the inside thereof. Thus, the bonding wires and the like do not protrude from the surface of the multilayer ceramic substrate. Also in a multilayer ceramic substrate provided therein with a plurality of dielectric layers, an electronic device can be mounted at high density to satisfy the demand of making the size and height small.

In addition, since the second softening layer 458 is disposed on the surface of the conductive pattern 452 of the periphery of the second step bottom 451*b* of the two-step cavity 451, concentration of stress to the conductive pattern 452 when the lower end of the sidewalls of the ceramic layers 453 to 457 is shrunk in the in-plane direction is alleviated to suppress disconnection of the conductive pattern 452.

By making use of the production method of a multilayer ceramic substrate according to the present embodiment, a multilayer ceramic substrate having a three or more step cavity with three or more bottoms can be fabricated. At this time, when a conductive pattern is formed as straddling the periphery of a third step bottom, for example, a softening layer is disposed at a prescribed position in the same manner as in the production process of the multilayer ceramic substrate having a two-step cavity with two bottoms. With this, disconnection of the conductive pattern formed on the third step bottom.

In the production method of the thirteenth embodiment, for example, failure to achieve a balance of the upper and lower shrinkage suppression forces depending on the layer structure of the multilayer ceramic substrate will possibly deform the cavity bottom, as extremely depicted in FIG. 68, for example. In such a case, the thickness of the shrinkage suppressing green sheets sandwiching the cavity bottom is adjusted to avoid the deformation. The sixteenth embodiment of the present invention is directed to this adjustment.

To be specific, as shown in FIG. 69, the thickness of the first composite green sheet 426 having the shrinkage suppression green sheet piece (first fitting sheet 425) fitted in the cavity formation portion thereof is adjusted. In this case, in order to compensate the change in thickness, though the thickness of the first fitting sheet 425 may only be adjusted, the thickness of the first composite green sheet as a whole may be adjusted. Otherwise, as shown in FIG. 07, the thickness of the portion of the shrinkage suppression green sheet 422 corresponding to the cavity may be adjusted. In this case, the shrinkage suppression green sheet 422 shown in FIG. 70 comprises a lamination of a thin shrinkage suppression green sheet 422*a* and a shrinkage suppression green sheet 422*b* having a through hole at a cavity formation portion thereof and having a ceramic green sheet fitted in the through hole. With this, shrinkage suppression of the multilayer body as a whole and shrinkage suppression of the cavity bottom can independently be controlled.

In the shrinkage suppression green sheet 222*b*, the shape of the ceramic green sheet to be fitted (shape of the through hole) may not be the same as the cavity shape, but is determined in view of the balance of the shrinkage compression forces. The thickness of each of the first fitting sheet 425 and the shrinkage suppression green sheets 422*a* and 422*b* may appropriately be set similarly in consideration of the balance of the shrinkage suppression forces. In addition, a burnable sheet in place of the ceramic green sheet may be fitted in the through hole of the shrinkage suppression green sheet 422*b*. Also in this case, uniform pressure can be applied in the pressing step.

The seventeenth embodiment of the present invention is directed to use of a burnable sheet when producing the multilayer ceramic substrate 401 shown in FIG. 49. FIG. 71 shows the fundamental production process in this embodiment that mainly comprises the steps of laminating and pressing green sheets and shrinkage suppressing green sheets that constitute ceramic layers after being fired, firing the pressed body, removing fired embedded green sheet body and removing fired shrinkage suppression green sheets.

In fabricating a multilayer ceramic substrate, as shown in FIG. 71(a), a plurality of ceramic green sheets are laminated as green sheets for a substrate in accordance with the number of the ceramic layers constituting a multilayer ceramic substrate. Here, nine ceramic green sheets 461 to 469 are laminated. Each of the ceramic green sheets 461 to 469 is formed through the steps of mixing ceramic powder, an organic binder and an organic solvent to form dielectric paste in the form of slurry, for example, and allowing the paste to grow on a PET sheet of support, for example, in accordance with the doctor blade method. Any of known ceramic powder and organic vehicles (organic binder and organic solvent) is usable in the present embodiment.

Of the ceramic green sheets 461 to 469, the two lower ceramic green sheets 461 and 462 are not required to form a cavity formation through hole therein, but formed as ordinary flat green sheets. Of the two ceramic green sheets 461 and 462, the upper ceramic green sheet 462 corresponds to a cavity bottom formation green sheet constituting the cavity bottom.

On the ceramic green sheet 462, laminated are the seven remaining ceramic green sheets 463 to 469 given a through hole 463a and cuts 464a to 469a of a prescribed shape corresponding to the opening shape of the cavity 411 to form separate portions 463b to 469b that correspond to the cavity space. Thus, the seven ceramic green sheets 463 to 469 correspond to the cavity formation green sheets.

In the present embodiment, the portions 464b to 469b separated by the cuts 464a to 469a exclusive of the ceramic green sheet 463 in contact with the ceramic green sheet 462 constituting the cavity bottom are utilized as embedded green sheets. However, this is not limitative. A separately formed embedded green sheet may be fitted in the through holes corresponding to the cavity formed in the ceramic green sheets 464 to 469. From the standpoint of productivity, however, utilization of the portions 464b to 469b separated by the cuts 464a to 469a as embedded green sheets is, advantageous.

On the other hand, the ceramic green sheet 463 in contact with the ceramic green sheet 462 constituting the cavity bottom has its portion corresponding to the cavity removed therefrom to form a through hole 463a, and a shrinkage suppression green sheet piece 470a having a shape corresponding to the through hole 463a and burnable sheet piece 471a are fitted and filled in the through hole 463a. This is shown in detail in FIG. 72.

As shown in FIG. 72(a), a ceramic green sheet 463 is formed and, as shown in FIG. 72(b), the portion of the ceramic green sheet corresponding to the cavity is punched out to form a through hole 463a. As shown in FIG. 72(c), a shrinkage suppression green sheet 470 is formed and, as shown in FIG. 72(d), a shrinkage suppression green sheet piece 470a punched out so as to have a shape substantially conforming to the shape of the through hole 463a is formed. Similarly, as shown in FIG. 72(e), a burnable sheet 471 is formed and, as shown in FIG. 72(f), it is punched out to form a burnable sheet piece 471a having a shape substantially conforming to the through hole 463a. Subsequently, as shown in FIG. 72(g), the shrinkage suppression green sheet piece 470a and burnable sheet piece 471a are fitted in the order mentioned and buried in the through hole 463a of the ceramic green sheet 463. Preferably, the total thickness of the shrinkage suppression green sheet piece 470a and burnable sheet piece 471a conforms substantially to the thickness of the ceramic green sheet 463.

The shrinkage suppression green sheet 470 (shrinkage suppression green sheet piece 470a) is formed of a material not shrunk at the firing temperature of the ceramic green sheets 461 to 469, such as tridymite etc. The burnable sheet 471 (burnable sheet piece 471a) is formed of a material burnt down at the firing temperature of the ceramic green sheets 461 to 469, such as a resin material.

As described above, the ceramic green sheets 461 to 469 are laminated and, the shrinkage suppression green sheets 473 and 474 overlap the surfaces of the outermost green sheets 461 and 469, respectively. The shrinkage suppression green sheet 473 and 474 are formed of the same material as the aforementioned shrinkage suppression green sheet 470. The shrinkage suppression green sheet 474 disposed on the side of the ceramic green sheet 469 formed with a through hole (by the cut 469a) corresponding to the cavity is also formed with a through hole 474a corresponding to the opening of the cavity, in which an embedded ceramic green sheet piece 475 separately punched out is fitted.

The multilayer body having these sheets laminated is in a state shown in FIG. 71(a), in which the shrinkage suppression green sheets 473 and 474 are laminated, respectively, on the opposite surfaces of the multilayer body having the plural ceramic green sheets 461 to 469 laminated, thereby suppressing shrinkage of the entire multilayer body in the in-plane direction. A conductive pattern 412 is disposed on the surface of the ceramic green sheet 462 as straddling the periphery of the cavity bottom. In addition, the shrinkage suppression green sheet piece 470a disposed in the through hole 463a of the ceramic green sheet 463 is in contact with the region of the ceramic green sheet 462 constituting the cavity bottom, thereby suppressing shrinkage of this portion in the in-plane direction.

Though the space corresponding to the cavity is ordinarily formed as a space (concave) at this stage, in the production method in this embodiment, the portions 464b to 469b separated by the cuts 464a to 469a and the embedded ceramic green sheet piece 475 are disposed as the embedded green sheet. When seeing the entire shape of the multilayer body, the multilayer body is formed as that flat without any concave.

The multilayer body having the ceramic green sheets 461 to 469 and shrinkage suppression green sheets 473 and 474 laminated is to be pressed in the pressing step preparatory to the firing step. At this time, when the multilayer body is formed with a concave corresponding to the cavity, the concave will possibly collapse to deform the opening of the cavity. In the present embodiment, however, since the multilayer body fabricated is uniform in thickness in the lamination direction and flattened over the entire thereof inclusive of the cavity portion owing to the presence of embedded green sheets, an ordinary flat mold die can be used to press the multilayer body. Thus, the pressing step can be performed with a simple means. While pressure is applied with the multilayer body sandwiched between the flat mold dies, as described above, the multilayer body coated with waterproof resin, etc. may be subjected to isostatic pressing.

After the firing step subsequent to the pressing step, as shown in FIG. 71(b), the ceramic green sheets 461 to 469 are converted to ceramic layers 402 to 410. At the time of firing, since the ceramic green sheets 461 to 469 bound by the shrinkage suppression green sheets 473 and 474 laminated thereon, they are shrunk only in the width direction and are seldom shrunk in the in-plane direction. The ceramic green sheet 462 exposed to the cavity bottom is also suppressed from being shrunk in the in-plane direction.

In addition, the burnable sheet piece 471 intervening between the embedded green sheets (portions 464b to 469b separated by the cuts 464a to 469a from the ceramic green sheets 464 to 469 and embedded ceramic green sheet piece 475) filled in the cavity space and the shrinkage suppression green sheet piece 470a is burnt down before the ceramic green sheets 461 to 469 are sintered. As a result, the binding force of the shrinkage suppressing green sheet piece 470a disposed on the cavity bottom is not exerted on the embedded green sheets to shrink the embedded green sheets in the in-plane direction. A fired body 476 protrudes from the fired multilayer body as shown in FIG. 71(b) because the shrinkage in the thickness direction is small. Since the binding force is not exerted, as described above, the embedded green sheets are shrunk and consequently no stress is applied to the shrinkage suppression green sheet piece 470a and also to the ceramic green sheet 462 immediately under it. The flatness of the ceramic layer 403 formed as a consequence of firing of the ceramic green sheet 462 is not deteriorated.

Upon completion of the firing, the fired body 476 of the embedded green sheets is removed from the cavity space as shown in FIG. 71(c). The fired body is separated from the shrinkage suppression green sheet piece 470a because the burnable sheet piece 471a is burnt down and, therefore, can easily be removed by, for example, turning the fired multilayer body upside down.

Finally, residuals 477 of the fired shrinkage suppression green sheets 473 and 474 and the fired shrinkage suppression green sheet piece 470a are removed to complete a multilayer substrate 401 having a cavity 411 as shown in FIG. 71(d). The residuals 477 can be removed with ease by some sort of cleaning step. The removal can be attained by stimulus of a degree by ultrasonic cleaning, for example. Thus, as the cleaning step, the step of ultrasonic cleaning in a solvent will suffice. When alumina-based green sheets are used as the shrinkage suppressing green sheets, however, the residuals 477 do not exfoliate spontaneously. Therefore, the residuals 477 are to be removed through polishing and cleaning by a wet blasting step.

The multilayer ceramic substrate 401 fabricated as described above is excellent in dimensional accuracy and flatness of the cavity bottom, has no deformation including collapse of the cavity opening and bulges around the cavity opening. Furthermore, the formation of the softening layer 413 in the multilayer ceramic substrate 401 suppresses disconnection of the conductive pattern 412.

The eighteenth embodiment of the present invention is directed to use of a burnable sheet on each of the bottoms of the cavity portions in producing a multilayer ceramic substrate having a multistage cavity (of a two-step structure) as shown in FIG. 73. In this case, as shown in FIG. 73(a), shrinkage suppression green sheets 482 and 483 are laminated on the opposite surfaces of a multilayer body 481 of ceramic green sheets and, at the same time, shrinkage suppression green sheet pieces 484 and 485 and burnable sheet pieces 486 and 487 are disposed on both the cavity bottom and stem bottom. The pressing step and firing step are performed, with embedded green sheets 488 filled in the cavity space of the two-step structure. Also in the present embodiment, the flatness of the multilayer body is secured, and the pressing step is easy to perform.

Though a fired body 489 of the embedded green sheets after the firing step protrudes form the multilayer body as shown in FIG. 73(b), it can easily be removed by turning the multilayer body upside down in the same manner as described above. A multilayer ceramic substrate 490 obtained is as shown in FGI. 73(c) and is excellent in entire dimensional accuracy as well as in dimensional accuracy of the bottom 491a and stepped surface 491b of the cavity 491 and in their flatness. In addition, the softening layers 413 and 458 are disposed on the bottoms, respectively, to enable disconnection of the conductive patterns 412 and 452 accompanied by shrinkage of the region around the cavity in the in-plane direction to be suppressed. Incidentally, in the case of the cavity 491 of the two-step structure, an electronic device is mounted on the bottom 491a and the stepped surface 91b is provided thereon with a conductive pattern connected to the electronic device with bonding wires.

Concrete examples of the present invention will be described hereinafter based on the experimental results.

EXAMPLE 1

In this example, an alumina-glass-based dielectric material was prepared as a material for a ceramic green sheet. A binder and organic solvent were mixed with the material to obtain a mixture, and the mixture was subjected to the doctor blade method to produce a ceramic green sheet having a thickness of 125 µm. On the other hand, a tridymite-silica-based material was prepared as a material for shrinkage suppression. Similarly to the ceramic green sheet material, a binder and organic solvent were mixed with the material to obtain a mixture, and the mixture was subjected to the doctor blade method to produce a shrinkage suppression green sheet having a thickness of 125 µm.

The ceramic green sheet was formed with a first square through hole having a side of 4 mm using a die. On the other hand, the shrinkage suppression green sheet was similarly punched out using a die to form a first fitting sheet of a square having a side of 4 mm. The first fitting sheet was fitted in the first through hole to produce a first composite green sheet. The first composite green sheet had a thickness of 125 µm. Subsequently, a ceramic green sheet is punched out using a die to form a cavity, and the punched-out portion was set in position in the cavity to produce a cut formation sheet. Six cut formation sheets were prepared. Furthermore, a shrinkage suppression green sheet was formed with a sixth through hole of a square having a side of 4 mm using a die. A ceramic green sheet was punched out to form a second fitting sheet of a square having a side of 4 mm. The second fitting sheet was fitted in the sixth through hole to produce an uppermost composite green sheet. The thickness of each cut formation sheet was set to be 125 µm.

One shrinkage green sheet constituting a lowermost layer, five ceramic green sheets, one first green sheet, four cut formation sheets and one uppermost composite green sheet were laminated in the order mentioned to form a multilayer body. The multilayer body placed in an ordinary die having upper and lower flat punches was pressed under a pressure of 70 MPa for 7 minutes and then fired at 900° C.

After the firing step, the sheets inside the cavity protruded from the surface of the fired multilayer body. When the inside sheets were allowed to exfoliate spontaneously, though residuals were attached to the corners of the cavity and could be caused to fall off through the ultrasonic cleaning in an organic solvent. The shrinkage suppression green sheet and uppermost composite sheet could also be caused to fall off.

The multilayer ceramic substrate thus obtained was 0.59 mm in thickness, and the cavity had a one side of 4 mm at the opening and a depth of 0.30 mm. A photograph showing the cross section of the multilayer is shown in FIG. 74 from which it is found that the cavity has a shape of a drum having a larger opening area at the inside than at the opening.

EXAMPLE 2

In this example, a multilayer ceramic substrate having a multistage cavity was fabricated. The production method set forth in the second embodiment was used herein. The ceramic green sheet and shrinkage green sheet were formed pursuant to Example 1.

In the multilayer ceramic substrate, the first cavity portion had a side of 5 mm at the opening and a depth of 0.24 mm, and the second cavity portion had a side of 2 mm at the opening and a depth of 0.18 mm. A photograph showing the cross section of the multilayer is shown in FIG. 74 from which it is found that each of the cavity portions has a shape of a drum having a larger opening area at the inside than at the opening.

EXAMPLE 3

In this example, an alumina-glass-based dielectric material was prepared as a ceramic material for a substrate and mixed with an organic binder and organic solvent to obtain a mixture. The mixture was subjected to the doctor blade method to produce a ceramic green sheet having a thickness of 125 µm On the other hand, a tridymite-silica-based material was prepared as a material for shrinkage suppression and mixed with an organic binder and organic solvent similarly to the ceramic material to obtain a mixture. The mixture was subjected to the doctor blade method to produce shrinkage suppression green sheets having a thickness of 110 µm and a thickness of 125 µm, respectively. As a burnable material, the aforementioned ceramic material for the substrate and the resin used when the shrinkage suppression material was formed into a sheet were prepared. The burnable material was dissolved in an organic solvent and the resultant was subjected to the doctor blade method to produce a burnable sheet having a thickness of 15 µm.

A ceramic green sheet was punched out using a die to form a square cavity portion having a side of 2 mm. On the other hand, the shrinkage suppression green sheet having a thickness of 110 µm and burnable sheet were punched out to obtain a square shrinkage suppression green sheet piece and square burnable sheet piece each having a side of 2 mm. These pieces were fitted in the cavity portion to produce a composite green sheet for a cavity bottom.

Another ceramic green sheet was punched out to form a square cavity portion having a side of 2 mm, and the punched-out portion was fitted in the cavity portion to form a ceramic green sheet for cavity formation. Six cavity formation ceramic green sheets were prepared.

Furthermore, the shrinkage suppression green sheet having a thickness of 125 µm was punched out using a die to form a square cavity portion in which a ceramic green sheet piece was fitted to form an uppermost composite green sheet.

o non-processed ceramic green sheets, one of which constituted a cavity bottom were laminated, on which six cavity formation ceramic green sheets were laminated, followed by lamination of an uppermost composite green sheet. A non-processed shrinkage suppression green sheet 125 µm in thickness was used as the lowermost sheet. The cross section of the cavity portion of the multilayer body thus formed is as shown in FIG. 18(*a*).

The multilayer body thus obtained was placed in an ordinary die having upper and lower flat punches, pressed under a pressure of 700 kg/cm² for seven minutes and then fired 900° C. The fired ceramic substrate was not shrunk in the in-plane direction, but greatly shrunk only in the width direction. Since the multilayer was shrunk in the in-plane direction at the cavity portion, the shrinkage in the thickness direction was small and, therefore, the upper part of the cavity portion protruded from the substrate surface.

Though the tridymite-silica-based shrinkage suppression material exfoliated spontaneously from the fired ceramic substrate, since residuals were attached to the corners of the cavity inside, the fired ceramic substrate was subjected to ultrasonic cleaning in an organic solvent. Thus, a multilayer ceramic substrate having a square cavity that had one side of 2 mm at the opening and a depth of 0.42 mm and having an entire thickness of 0.55 mm was obtained. In the multilayer substrate, the cavity bottom was flat sufficient for mounting an electronic device thereon.

What is claimed is:

1. A production method of a multilayer ceramic substrate having a cavity, comprising the steps of:
   laminating a plurality of substrate green sheets including cavity formation green sheets having through holes corresponding to the cavity to form a multilayer body;
   laminating a shrinkage suppression green sheet piece on one of the plurality of substrate green sheets constituting a bottom of the cavity;
   disposing embedded green sheets separated from the cavity formation green sheets on the shrinkage suppression green sheets piece in the cavity;
   forming another though hole in an upper shrinkage suppression green sheet corresponding to a shape of an opening of the cavity, and fitting an embedded green sheet in the another through hole;
   laminating the upper shrinkage suppression green sheet with the embedded green sheet therein on an upper surface of the substrate green sheets so that the embedded green sheet in the upper shrinkage suppression green sheet is located on the embedded green sheets in the cavity, and a lower shrinkage suppression greet sheet under a lower surface of the substrate green sheets, respectively, which surfaces constitute outermost layers of the multilayer body;
   pressing the multilayer body;
   firing the pressed multilayer body so that the embedded green sheets in the cavity shrink and separate from the cavity formation green sheet; and,
   removing the fired embedded green sheets.

2. A production method of a multilayer ceramic substrate according to claim 1, wherein the cavity formation green sheet laminated immediately on the substrate green sheet constituting the bottom of the cavity is formed with a through hole in which the shrinkage suppression green sheet piece is fitted.

3. A production method of a multilayer ceramic substrate according to claim 2, wherein the shrinkage suppression green sheet piece has a thickness substantially identical with that of the substrate green sheet.

4. A production method of a multilayer ceramic substrate according to claim 1, wherein the cavity has an opening and a multistage shape having an opening dimension decreasing stepwise in a direction of depth of the cavity to form cavity portions having bottoms, and further comprising the step of disposing on each of the bottoms of the cavity portions a shrinkage suppression green sheet piece.

5. A production method of a multilayer ceramic substrate according to claim 1, further comprising the step of interposing a burnable sheet between the shrinkage suppression green piece and the embedded green sheet.

6. A production method of a multilayer ceramic substrate according to claim 5, wherein the cavity formation green sheet laminated immediately on the substrate green sheet constituting the bottom of the cavity is formed with a through hole in which the shrinkage suppression green sheet piece and a burnable sheet are fitted.

7. A production method of a multilayer ceramic substrate according to claim 6, wherein the shrinkage suppression green sheet piece and the burnable sheet have a total thickness substantially identical to that of the substrate green sheet.

8. A production method of a multilayer ceramic substrate according to claim 5, wherein the cavity has an opening and a multistage shape having an opening dimension decreasing stepwise in a direction of depth of the cavity to form cavity portions having bottoms, and further comprising the step of disposing on each of the bottoms of the cavity portions a shrinkage suppression green sheet piece and a burnable sheet.

9. A production method of a multilayer ceramic substrate according to claim 5, wherein the burnable sheet is formed of a resin material.

10. A production method of a multilayer ceramic substrate according to claim 9, wherein the resin material is identical with that contained in the cavity formation green sheets.

11. A production method of a multilayer ceramic substrate according to claim 1, further comprising the step of inserting cuts corresponding to a shape of the cavity in the cavity formation green sheets to separate cut portions therefrom and using the separated portions as the embedded green sheet.

12. A production method of a multilayer ceramic substrate according to claim 1, wherein the cavity formation green sheet is formed with a through hole corresponding to a shape of the cavity, and the embedded green sheet formed by punching out separately is fitted in the through hole.

13. A production method of a multilayer ceramic substrate according to claim 1, wherein the shrinkage suppressing green sheet pieces on a portion of the cavity are amended in thickness.

14. A production method of a multilayer ceramic substrate according to claim 13, wherein a cavity formation green sheet laminated immediately on the substrate green sheet constituting the bottom of the cavity has a thickness different from those of other cavity formation green sheets, and the thickness of the shrinkage suppressing green sheet pieces is set different from the thickness of the cavity formation green sheet.

15. A production method of a multilayer ceramic substrate according to claim 13, wherein a shrinkage suppression green sheet disposed on a surface of an outermost substrate green sheet on a side opposed to a side of an opening of the cavity is set to have a part facing the cavity and other part of different thickness.

16. A production method of a multilayer ceramic substrate according to claim 15, wherein the shrinkage suppression green sheet comprises a laminate of a first shrinkage suppression green sheet having a prescribed thickness and a second shrinkage suppression green sheet formed at the part facing the cavity with a through hole.

17. A production method of a multilayer ceramic substrate according to claim 1, further comprising the steps of forming a conductive pattern on the substrate green sheet constituting the bottom of the cavity as straddling a periphery of the cavity bottom, forming a first cavity formation green sheet having a through hole in which a shrinkage suppression green sheet piece is embedded and a second cavity formation green sheet laminated immediately on the first cavity formation green sheet and having an embedded green sheet that is separate from the cavity formation green sheet embedded in the cavity, laminating the first and second cavity formation green sheets, respectively, immediately on the substrate formation green sheet constituting the bottom of the cavity and immediately on the first cavity formation green sheet so that the cavity bottom, the shrinkage suppression green sheet piece and the embedded green sheet overlap to form the multilayer, in which the shrinkage suppression green sheet piece in at least a portion of the periphery of the cavity bottom overlapping the conductive pattern has an end face disposed outside an end face of the embedded green sheet the second cavity formation green sheet has.

18. A production method of a multilayer ceramic substrate according to claim 17, wherein the shrinkage suppression green sheet has a size larger than that of the embedded green sheet.

19. A production method of a multilayer ceramic substrate according to claim 18, wherein the end face of the shrinkage suppression green sheet piece is disposed outside the end face of the embedded green sheet over the entire periphery of the cavity bottom.

20. A production method of a multilayer ceramic substrate according to claim 17, wherein the shrinkage suppression green sheet piece and the embedded green sheet have a same shape and are laminated so that the two are out of alignment to partially overlap each other.

21. A production method of a multilayer ceramic substrate according to claim 17, wherein the end face of the shrinkage suppression green sheet piece in at least the portion of the periphery of the cavity bottom overlapping the conductive pattern and the end face of the embedded green sheet in at least a portion the shrinkage suppression green sheet piece and the end face of the embedded green sheet have a distance of 0.1 mm to 0.5 mm therebetween.

22. A production method of a multilayer ceramic substrate according to claim 17, wherein the shrinkage suppression green sheet piece is fitted in the through hole of the first cavity formation green sheet.

23. A production method of a multilayer ceramic substrate according to claim 22, wherein the shrinkage suppression green sheet piece has a thickness substantially identical with that of the first cavity forming green sheet.

24. A production method of a multilayer ceramic substrate according to claim 17, wherein the cavity has an opening and a multistage shape having an opening dimension decreasing stepwise in a direction of depth of the cavity to form cavity portions having bottoms, and further comprising the step of disposing on each of the bottoms of the cavity portions a shrinkage suppression green sheet piece.

25. A production method of a multilayer ceramic substrate according to claim 24, wherein when disposing on each of the bottoms of the cavity portions a shrinkage suppression green sheet piece, in at least the portion of the periphery of the cavity bottom overlapping the conductive pattern, the end face of the shrinkage suppression green sheet piece is disposed outside the end face of the embedded green sheet laminated immediately on the shrinkage suppression green sheet piece.

26. A production method of a multilayer ceramic substrate according to claim 17, further comprising the step of causing a burnable sheet intervening between the shrinkage suppression green sheet piece and the embedded green sheet.

27. A production method of a multilayer ceramic substrate according to claim 26, wherein the second cavity formation green sheet is formed with a through hole corresponding to a shape of the embedded green sheet in which the shrinkage suppression green sheet piece and a burnable sheet are fitted.

28. A production method of a multilayer ceramic substrate according to claim 27, wherein the substrate green sheet and the burnable green sheet have a total thickness set substantially identical with that of the second cavity formation green sheet.

29. A production method of a multilayer ceramic substrate according to claim 1, further comprising the steps of forming a conductive pattern on the substrate green sheet constituting the bottom of the cavity as straddling a periphery of the cavity bottom and a softening layer that gets soft at a firing temperature of the firing and is provided at least on a surface of the conductive pattern of a portion corresponding to the periphery of the bottom on the cavity bottom formation ceramic layer, before the pressing step, laminating the cavity formation green sheet having the shrinkage suppression green sheet embedded in the through hole immediately on the substrate formation green sheet constituting the cavity bottom so that the cavity bottom and the shrinkage suppression green sheet piece overlap and laminating a cavity formation green sheet so that the embedded green sheet separate from each cavity formation green sheet as being filled in the cavity is disposed on the shrinkage suppressing green sheet piece and, after the firing step, removing the embedded green sheet fired.

30. A production method of a multilayer ceramic substrate according to claim 29, wherein the softening layer is provided entirely of the periphery of the bottom.

31. A production method of a multilayer ceramic substrate according to claim 29, wherein the periphery of the bottom and an outer periphery of the softening layer have a distance of 0.1 mm to 0.5 mm therebetween.

32. A production method of a multilayer ceramic substrate according to claim 29, wherein the periphery of the bottom and an inner periphery of the softening layer have a distance of 0.5 mm or less therebetween.

33. A production method of a multilayer ceramic substrate according to claim 29, wherein the softening layer is formed of glass.

34. A production method of a multilayer ceramic substrate according to claim 33, wherein the glass is the same as that contained in the substrate green sheet.

35. A production method of a multilayer ceramic substrate according to claim 29, wherein the shrinkage suppression green sheet piece is fitted in a through hole of the cavity formation green sheet laminated immediately on the bottom formation green sheet.

36. A production method of a multilayer ceramic substrate according to claim 35, wherein the shrinkage suppression green sheet piece has a thickness substantially identical with that of the substrate green sheet.

37. A production method of a multilayer ceramic substrate according to claim 29, wherein the cavity has an opening and a multistage shape having an opening dimension decreasing stepwise in a direction of depth of the cavity to form cavity portions having bottoms, and further comprising the step of disposing on each of the bottoms of the cavity portions a shrinkage suppression green sheet piece.

38. A production method of a multilayer ceramic substrate according to claim 37, wherein when disposing on each of the bottoms of the cavity portions a shrinkage suppression green sheet piece, in bottoms of the bottoms on which the conductive pattern is disposed as straddling a periphery of a bottom, the softening layer is formed on a surface of at least the conductive pattern of portions corresponding to the periphery on the bottom formation green sheet constituting the bottom.

39. A production method of a multilayer ceramic substrate according to claim 29, further comprising the step of interposing a burnable sheet between the shrinkage suppression green piece and the embedded green sheet.

40. A production method of a multilayer ceramic substrate according to claim 39, wherein the cavity formation green sheet laminated immediately on the bottom formation green sheet is formed with a through hole corresponding to a shape of the cavity, and the shrinkage suppression green sheet piece and a burnable sheet are fitted in the through hole.

41. A production method of a multilayer ceramic substrate according to claim 40, wherein the shrinkage suppression green sheet piece and the burnable sheet have a total thickness substantially identical to that of the cavity formation green sheet.

42. A production method of a multilayer ceramic substrate according to claim 1, wherein the shrinkage suppression green sheet and the shrinkage suppression green sheet piece contain as a shrinkage suppression material at least one species selected from the group consisting of quartz, cristobalite and tridymite.

43. A production method of a multilayer ceramic substrate according to claim 42, wherein the shrinkage suppression green sheet and the shrinkage suppression green sheet piece are formed of a composition containing tridymite and an oxide difficult to sinter.

44. A production method of a multilayer ceramic substrate according to claim 1, wherein the step of firing is performed at a temperature of 800° C. to 1000° C.

45. A production method of a multilayer ceramic substrate according to claim 1, further comprising the step of cleaning residuals after the step of firing.

46. A production method of a multilayer ceramic substrate according to claim 45, wherein the step of cleaning comprises ultrasonic cleaning in a solvent.

47. A production method of a multilayer ceramic substrate according to claim 45, wherein the step of cleaning comprises wet blasting.

48. A production method of a multilayer ceramic substrate according to claim 1, wherein upon firing the pressed body, the embedded green sheets filled in the cavity formation green sheets and the embedded green sheet in the upper shrinkage suppression green sheet shrink and are separated from the cavity formation green sheets and the upper shrinkage suppression green sheet, respectively, and also, extend upwardly.

* * * * *